(12) United States Patent
Goto et al.

(10) Patent No.: US 10,777,685 B2
(45) Date of Patent: Sep. 15, 2020

(54) TRANSISTOR

(71) Applicant: Semiconductor Energy Laboratory Co., Ltd., Atsugi-shi, Kanagawa-ken (JP)

(72) Inventors: Naoto Goto, Tochigi (JP); Yasuharu Hosaka, Tochigi (JP); Mizuho Yaguchi, Utsunomiya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/610,784

(22) Filed: Jun. 1, 2017

(65) Prior Publication Data

US 2017/0358682 A1    Dec. 14, 2017

(30) Foreign Application Priority Data

Jun. 9, 2016 (JP) .................................. 2016-115215
Jun. 9, 2016 (JP) .................................. 2016-115216

(51) Int. Cl.
| H01L 29/786 | (2006.01) |
| H01L 29/423 | (2006.01) |
| H01L 27/12  | (2006.01) |
| H01L 29/66  | (2006.01) |

(52) U.S. Cl.
CPC ...... *H01L 29/7869* (2013.01); *H01L 27/1225* (2013.01); *H01L 29/42384* (2013.01); *H01L 29/66969* (2013.01); *H01L 29/78603* (2013.01); *H01L 29/78648* (2013.01); *H01L 29/78696* (2013.01)

(58) Field of Classification Search
None
See application file for complete search history.

(56) References Cited

U.S. PATENT DOCUMENTS

| 5,821,573 A | 10/1998 | Schunke et al. |
| 7,791,072 B2 | 9/2010 | Kumomi et al. |
| 8,237,166 B2 | 8/2012 | Kumomi et al. |
| 8,536,571 B2 | 9/2013 | Yamazaki |

(Continued)

FOREIGN PATENT DOCUMENTS

| JP | 10-125873 A | 5/1998 |
| JP | 2006-165528 A | 6/2006 |

(Continued)

*Primary Examiner* — Jay C Chang
(74) *Attorney, Agent, or Firm* — Robinson Intellectual Property Law Office; Eric J. Robinson

(57) ABSTRACT

A transistor with a small footprint is provided. A transistor having high reliability is provided. A transistor is provided over an insulating layer that has a projection. Over the projection, at least a channel formation region of a semiconductor layer is provided. This can reduce the footprint of the transistor. The transistor has a curved structure, which inhibits light that enters from the outside from reaching a channel formation region of the semiconductor layer. Accordingly, deterioration of the transistor due to external light can be reduced, whereby the transistor can have increased reliability. The projection can be obtained by utilizing the internal stress of the layer formed over the insulating layer. Alternatively, the projection can be obtained by placing, under the insulating layer, a structure body for providing the insulating layer with the projection.

20 Claims, 48 Drawing Sheets

(56) References Cited

U.S. PATENT DOCUMENTS

| | | |
|---|---|---|
| 8,547,771 B2 | 10/2013 | Koyama |
| 8,592,879 B2 | 11/2013 | Suzawa et al. |
| 8,796,681 B2 | 8/2014 | Yamade et al. |
| 8,921,948 B2 | 12/2014 | Yamazaki |
| 8,932,913 B2 | 1/2015 | Sasagawa et al. |
| 8,995,174 B2 | 3/2015 | Koyama |
| 9,006,803 B2 | 4/2015 | Isobe et al. |
| 9,012,993 B2 | 4/2015 | Yamazaki |
| 9,166,060 B2 | 10/2015 | Yamazaki et al. |
| 9,281,409 B2 | 3/2016 | Yamazaki et al. |
| 9,324,876 B2 | 4/2016 | Kobayashi et al. |
| 9,397,153 B2 | 7/2016 | Tanaka et al. |
| 2006/0091398 A1* | 5/2006 | Yamaguchi ......... H01L 27/1214 257/72 |
| 2013/0140569 A1* | 6/2013 | Yoneda ................... H01L 29/78 257/57 |
| 2014/0151756 A1* | 6/2014 | Chang ............... H01L 29/42392 257/288 |
| 2015/0028308 A1* | 1/2015 | Lee ....................... H01L 51/508 257/40 |
| 2015/0179776 A1 | 6/2015 | Isobe et al. |
| 2015/0179803 A1 | 6/2015 | Yamazaki et al. |
| 2015/0280691 A1 | 10/2015 | Koyama |
| 2015/0303217 A1* | 10/2015 | Tanaka .............. H01L 29/78606 257/43 |

FOREIGN PATENT DOCUMENTS

| | | |
|---|---|---|
| JP | 2010-183065 A | 8/2010 |
| JP | 2012-235098 A | 11/2012 |
| JP | 2012-257187 A | 12/2012 |

\* cited by examiner

TRANSISTOR

BACKGROUND OF THE INVENTION

1. Field of the Invention

One embodiment of the present invention relates to an object, a method, or a manufacturing method. One embodiment of the present invention relates to a process, a machine, manufacture, or a composition of matter. One embodiment of the present invention relates to a semiconductor device, a display device, a light-emitting device, a lighting device, a power storage device, a memory device, a processor, or a driving method or manufacturing method thereof.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

Silicon is known as a material used for a semiconductor layer of a transistor; either amorphous silicon or polycrystalline silicon is used depending on the purpose. For example, when silicon is used for a semiconductor layer of a transistor included in a large-sized display device, it is preferable to use amorphous silicon, which can be formed using the established technique for forming a film on a large-sized substrate. On the other hand, when silicon is used for a semiconductor layer of a transistor included in a high-performance display device in which a driver circuit and a display portion are formed over one substrate, it is preferable to use polycrystalline silicon, which can achieve a transistor with high field-effect mobility.

Meanwhile, an oxide semiconductor has attracted attention recently as a material used for a semiconductor layer of a transistor. For example, a transistor using an amorphous oxide semiconductor containing indium, gallium, and zinc is known (see Patent Document 1).

An oxide semiconductor can be formed by a sputtering method or the like, and thus can be used for a semiconductor layer of a transistor in a large display device. In addition, there is an advantage that capital investment can be reduced because part of production equipment for a transistor including amorphous silicon can be retrofitted and utilized. A transistor including an oxide semiconductor has high field-effect mobility; therefore, a high-performance display device where a driver circuit and a display portion are formed over one substrate can be obtained.

It is also known that a transistor using an oxide semiconductor for a semiconductor layer has an extremely low leakage current in a non-conducting state (an off state). For example, a low-power CPU utilizing the feature of low leakage current of the transistor including an oxide semiconductor is disclosed (see Patent Document 2).

There are demands for improved integration density in a semiconductor device achieved by reducing the footprint of transistors, improved electrical characteristics of transistors, and the like. For example, a transistor proposed in Patent Document 3 has increased transistor integration density by including an arch-shaped gate. A CMOS transistor with an SOI structure proposed in Patent Document 4 achieves improved electrical characteristics with the use of distortion that is generated in a channel formation region owing to a difference between the thickness of an embedded oxide layer under an n-channel transistor and the thickness of an embedded oxide layer under a p-channel transistor.

REFERENCE

Patent Document

[Patent Document 1] Japanese Published Patent Application No. 2006-165528
[Patent Document 2] Japanese Published Patent Application No. 2012-257187
[Patent Document 3] Japanese Published Patent Application No. H10-125873
[Patent Document 4] Japanese Published Patent Application No. 2010-183065

SUMMARY OF THE INVENTION

On the other hand, the structures disclosed in Patent Document 3 and Patent Document 4 require high-temperature treatment performed at higher than 1000° C., which puts considerable restrictions on manufacture, such as limitation on the substrates that can be used. Specifically, the maximum process temperature of display devices is required to be 600° C. or lower, preferably 400° C. or lower.

An object of one embodiment of the present invention is to provide a transistor which has high electrical characteristics. Another object of one embodiment of the present invention is to provide a transistor with low power consumption. Another object of one embodiment of the present invention is to provide a transistor having high reliability. Another object of one embodiment of the present invention is to provide a transistor with a small footprint. Another object of one embodiment of the present invention is to provide a novel transistor. Another object of one embodiment of the present invention is to provide a semiconductor device including at least one of these transistors.

Note that the descriptions of these objects do not preclude the existence of other objects. In one embodiment of the present invention, there is no need to achieve all the objects. Other objects will be apparent from and can be derived from the description of the specification, the drawings, the claims, and the like.

A transistor is provided over an insulating layer that has a projection. Over the projection, at least a channel formation region of a semiconductor layer is provided. This structure can reduce the footprint of the transistor. The transistor has a curved cross-sectional structure, which inhibits light that enters from the outside from reaching a channel formation region of the semiconductor layer. Accordingly, deterioration of the transistor due to external light can be reduced, whereby the transistor can have increased reliability. The projection can be obtained by utilizing the internal stress of the layer formed over the insulating layer. Alternatively, the projection can be obtained by placing, under the insulating layer, a structure body for providing the insulating layer with the projection.

One embodiment of the present invention is a transistor that includes first to third insulating layers, a first gate electrode, a second gate electrode, a first gate insulating layer, a second gate insulating layer, and a semiconductor layer. The first insulating layer has a projection. The second insulating layer is positioned over the first insulating layer. The first gate electrode is positioned over the second insulating layer. The first gate insulating layer is positioned over the first gate electrode. The semiconductor layer is positioned over the first gate insulating layer. The second gate insulating layer is positioned over the semiconductor layer. The second gate electrode is positioned over the second gate insulating layer. The third insulating layer has a region overlapping the second gate electrode and a region in contact with the semiconductor layer. The projection, the first gate electrode, the first gate insulating layer, the semiconductor layer, the second gate insulating layer, and the second gate electrode have regions overlapping each other. The first insulating layer includes an organic resin.

One embodiment of the present invention is a transistor that includes a first insulating layer, a second insulating layer, a first gate electrode, a second gate electrode, a first gate insulating layer, a second gate insulating layer, a source electrode, a drain electrode, and a semiconductor layer. The first insulating layer has a projection. The second insulating layer is positioned over the first insulating layer. The first gate electrode is positioned over the second insulating layer. The first gate insulating layer is positioned over the first gate electrode. The semiconductor layer is positioned over the first gate insulating layer. The source electrode has a region in contact with the semiconductor layer. The drain electrode has a region in contact with the semiconductor layer. The second gate insulating layer is positioned over the semiconductor layer, the source electrode, and the drain electrode. The second gate electrode is positioned over the second gate insulating layer. The projection, the first gate electrode, the first gate insulating layer, the semiconductor layer, the second gate insulating layer, and the second gate electrode have regions overlapping each other. The first insulating layer includes an organic resin.

The organic resin is preferably at least one of a polyimide, an acrylic resin, a benzocyclobutene resin, a polyamide, and an epoxy resin. The second insulating layer preferably includes an inorganic material. The third insulating layer preferably includes silicon and nitrogen. The semiconductor layer is preferably an oxide semiconductor layer.

According to one embodiment of the present invention, a transistor which has high electrical characteristics can be provided. A transistor with low power consumption can be provided. A transistor having high reliability can be provided. A transistor with a small footprint can be provided. A novel transistor can be provided. A semiconductor device including at least one of these transistors can be provided.

Note that the description of these effects does not preclude the existence of other effects. One embodiment of the present invention does not have to achieve all the effects listed above. Other effects will be apparent from and can be derived from the description of the specification, the drawings, the claims, and the like.

DETAILED DESCRIPTION OF THE INVENTION

Figure 1A:
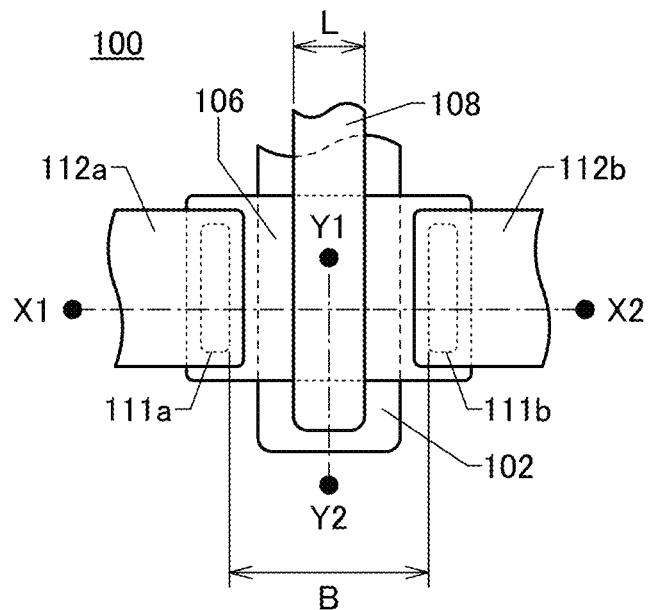
FIGS. 1A and 1B illustrate a transistor.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the present invention is not necessarily limited to the position, size, range, or the like disclosed in the drawings and the like. For example, in the actual manufacturing process, a layer, a resist mask, or the like may be unintentionally reduced in size by treatment such as etching, which is not illustrated in some cases for easy understanding.

Especially in a top view (also referred to as "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order, such as the order of steps or the stacking order. A term without an ordinal number in this specification and the like may be provided with an ordinal number in a claim in order to avoid confusion among components. A term with an ordinal number in this specification and the like may be provided with a different ordinal number in a claim. Moreover, a term with an ordinal number in this specification and the like might not be provided with any ordinal number in a claim and the like.

In this specification and the like, the term such as an "electrode" or a "wiring" does not limit a function of the component. For example, an "electrode" is used as part of a "wiring" in some cases, and vice versa. Furthermore, the term "electrode" or "wiring" can also mean that a plurality of "electrodes" or "wirings" are provided in an integrated manner.

Note that the term "over" or "under" in this specification and the like does not necessarily mean that a component is placed "directly over" or "directly under" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Functions of a source and a drain might be switched depending on operation conditions, for example, when a transistor having opposite polarity is employed or the direction of current flow is changed in circuit operation. Thus, it is difficult to define which is a source or a drain. Accordingly, the terms "source" and "drain" can be used to denote the drain and the source, respectively, in this specification.

Furthermore, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or texts, another connection relation is included in the drawings or the texts.

In this specification and the like, the term "electrically connected" includes the case where components are connected through an object having any electric function. There is no particular limitation on the object having any electric function as long as electric signals can be transmitted and received between components that are connected through the object. Accordingly, even when the expression "electrically connected" is used in this specification, there is a case in which no physical connection is made and a wiring is just extended in an actual circuit.

Note that the channel length refers to, for example, the distance from a source (a source region or a source electrode) to a drain (a drain region or a drain electrode) in a region where a semiconductor (or a portion where a current flows in a semiconductor when a transistor is on) and a gate electrode overlap each other or a region where a channel is formed, in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap each other or a region where a channel is formed, in a top view of the transistor. In many cases, the extending direction of the channel length is orthogonal to the extending direction of the channel width. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as "effective channel width") is sometimes different from a channel width shown in a top view of a transistor (hereinafter referred to as "apparent channel width"). For example, in a transistor having a gate electrode covering a side surface of a semiconductor layer, an effective channel width is greater than an apparent channel width, and its influence cannot be ignored in some cases. For example, in a miniaturized transistor having a gate electrode covering a side surface of a semiconductor, the proportion of a channel formation region formed on a side surface of a semiconductor is sometimes increased. In that case, an effective channel width is greater than an apparent channel width.

In such a case, an effective channel width is difficult to measure in some cases. For example, estimation of the effective channel width from a design value requires an assumption that the shape of a semiconductor is known. Accordingly, when the shape of a semiconductor is not known accurately, it is difficult to measure the effective channel width accurately.

Therefore, in this specification, an apparent channel width is referred to as a surrounded channel width (SCW) in some cases. Furthermore, when the term "channel width" is simply used in this specification, it may represent a surrounded channel width or an apparent channel width. Alternatively, when the term "channel width" is simply used in this specification, it may represent an effective channel width in some cases. Note that a channel length, a channel width, an effective channel width, an apparent channel width, a surrounded channel width, and the like can be determined by analyzing a cross-sectional TEM image and the like.

Note that when field-effect mobility, a current per channel width, and the like of a transistor are obtained by calculation, a surrounded channel width may be used for the calculation. In that case, the obtained value is sometimes different from the value obtained by using an effective channel width for the calculation.

Note that the term "impurity" in a semiconductor refers to, for example, an element other than the main components of the semiconductor. For example, an element with a concentration lower than 0.1 atomic % can be regarded as an impurity. Inclusion of impurities may cause an increase in density of states (DOS) in a semiconductor and/or a decrease in the carrier mobility or the crystallinity. In the case where the semiconductor is an oxide semiconductor, examples of an impurity which changes characteristics of the semiconductor include elements other than the main components of the oxide semiconductor, such as Group 1 elements, Group 2 elements, Group 13 elements, Group 14 elements, Group 15 elements, and transition metals; there are hydrogen, lithium, sodium, silicon, boron, phosphorus, carbon, and nitrogen, for example.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The terms "perpendicular" and "orthogonal" indicate that the angle formed between two straight lines ranges from 80° to 100°, and accordingly also include the case where the angle ranges from 85° to 95°. The term "substantially perpendicular" indicates that the angle formed between two straight lines ranges from 60° to 120°.

In the specification and the like, the terms used in describing calculation values and actual measurement values, such as "identical", "same", "equal", and "uniform", (including synonyms thereof) allow for a margin of error of ±20% unless otherwise specified.

In this specification and the like, when an etching step (a removing step) is performed after a resist mask is formed by a photolithography method, the resist mask is removed after the etching step unless otherwise specified.

In this specification and the like, a high power supply potential VDD (also referred to as "VDD" or "H potential") is a power supply potential higher than a low power supply potential VSS (also referred to as "VSS" or "L potential"). The low power supply potential VSS is a power supply potential lower than the high power supply potential VDD. A ground potential (also referred to as "GND" or a "GND potential") can be used as VDD or VSS. For example, when the ground potential is used as VDD, VSS is lower than the ground potential, and when the ground potential is used as VSS, VDD is higher than the ground potential.

Note that the terms "film" and "layer" can be interchanged with each other depending on the case or circumstances. For example, in some cases, the term "conductive film" can be used instead of the term "conductive layer", or the term "insulating film" can be used instead of the term "insulating layer".

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

A transistor shown in this specification and the like refers to an enhancement-mode (normally-off) field-effect transistor, unless otherwise specified. Moreover, a transistor shown in this specification and the like is an n-channel transistor, unless otherwise specified. Therefore, the threshold voltage (also referred to as Vth) of a transistor is higher than 0 V, unless otherwise specified.

Note that Vth of a transistor having a backgate in this specification and the like refers to Vth obtained when the potential of the backgate is set equal to that of a source or a gate, unless otherwise specified.

Unless otherwise specified, the off-state current in this specification and the like refers to a drain current of a transistor in an off state (also referred to as non-conducting state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, the expression "the off-state current of a transistor is lower than or equal to I" may mean that there is Vgs with which the off-state current of the transistor becomes lower than or equal to I. Moreover, the off-state current of a transistor sometimes means the off-state current at given Vgs, at Vgs in a given range, or at Vgs with which sufficiently low off-state current is obtained, for example.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; thus, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

The off-state current of a transistor depends on temperature in some cases. Unless otherwise specified, the off-state current in this specification may be an off-state current at room temperature (RT), 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., a temperature higher than or equal to 5° C. and lower than or equal to 35° C.). The description "the off-state current of a transistor is lower than or equal to I" may mean that there is Vgs at which the off-state current of the transistor at RT, 60° C., 85° C., 95° C., 125° C., a temperature at which the reliability of a semiconductor device or the like including the transistor is ensured, or a temperature at which the semiconductor device or the like is used (e.g., a temperature higher than or equal to 5° C. and lower than or equal to 35° C.) is lower than or equal to I.

The off-state current of a transistor sometimes depends on a voltage Vds between its drain and source. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the required reliability of a semiconductor device or the like including the transistor is ensured or Vds at which a semiconductor device or the like including the transistor is used. The description "the off-state current of a transistor is lower than or equal to I" may mean that there is Vgs at which the off-state current of the transistor is lower than or equal to the current I at Vds of 0.1 V, 0.8 V, 1 V, 1.2 V, 1.8 V, 2.5 V, 3 V, 3.3 V, 10 V, 12 V, 16 V, or 20 V, Vds at which the reliability of a semiconductor device or the like including the transistor is ensured, or Vds at which a semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to current that flows between a source and a drain of a transistor in the off state, for example.

Embodiment 1

A transistor 100 of one embodiment of the present invention will be described with reference to drawings.

<Structure Example of Transistor 100>

Figure 1B:
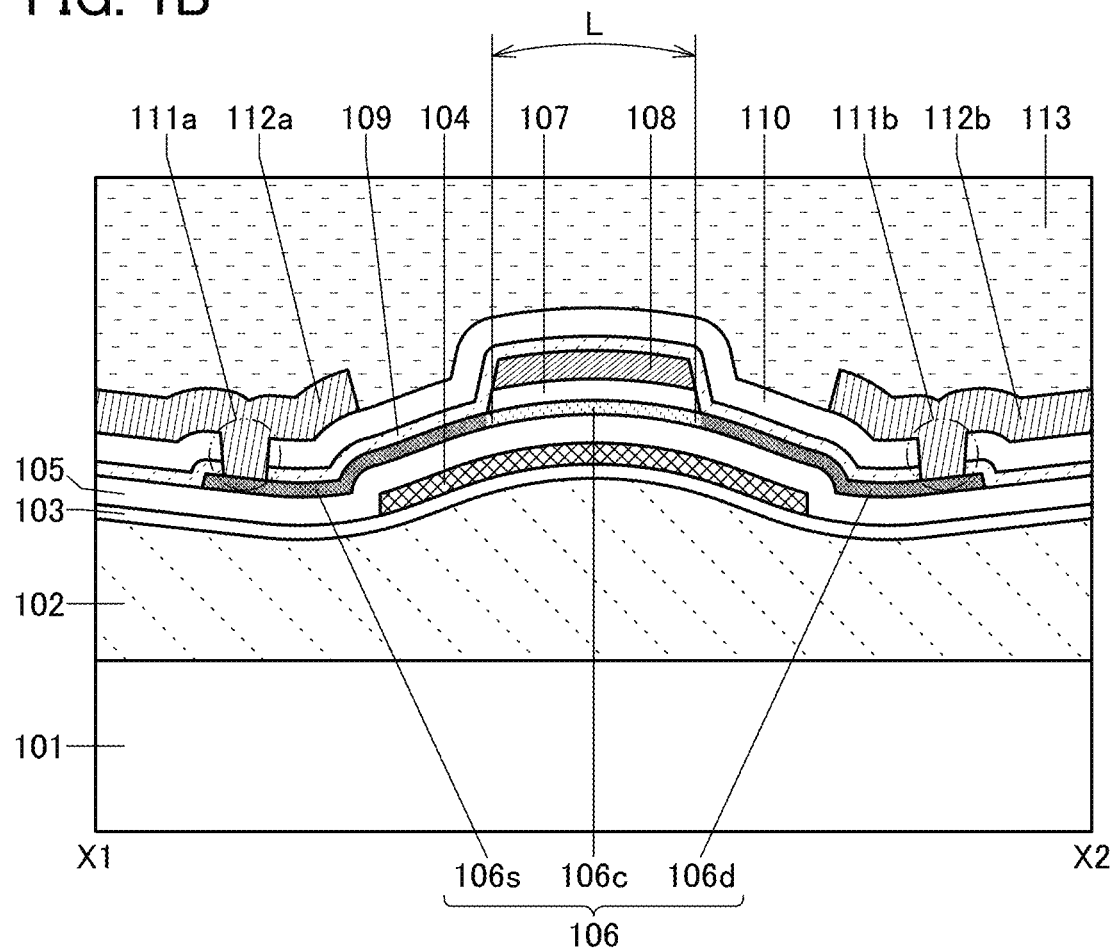
Figure 2:
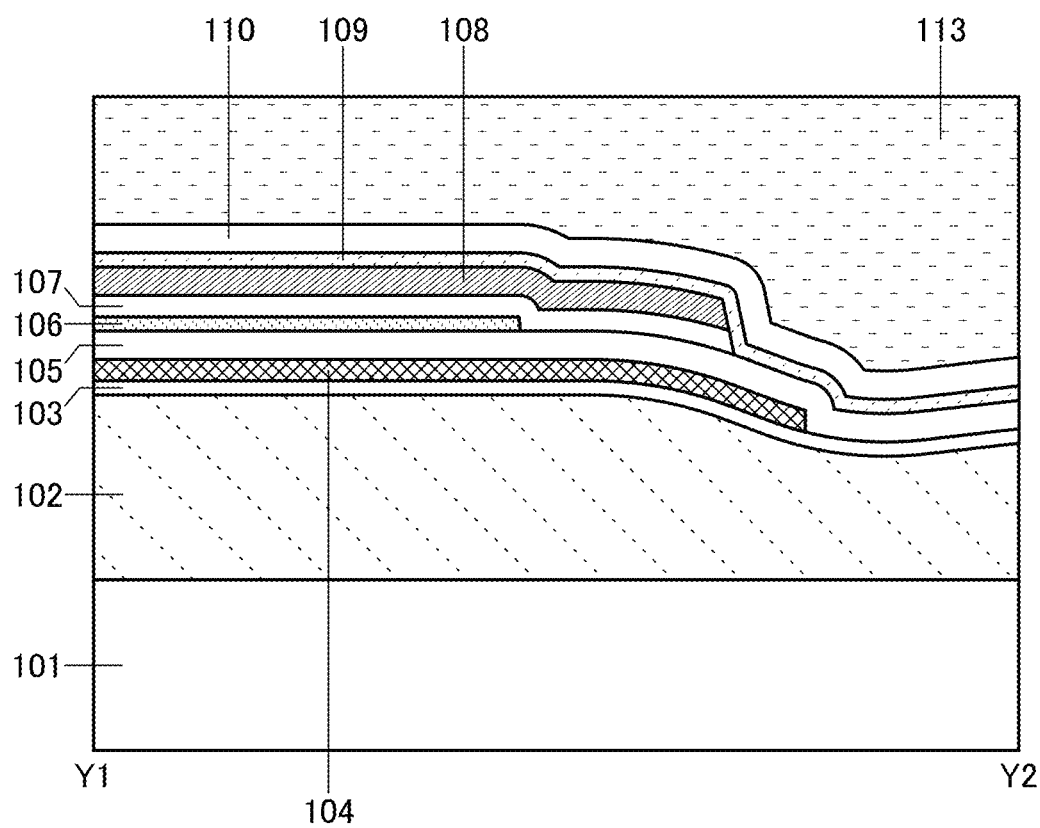
FIG. 2 illustrates a transistor.
Figure 3A:
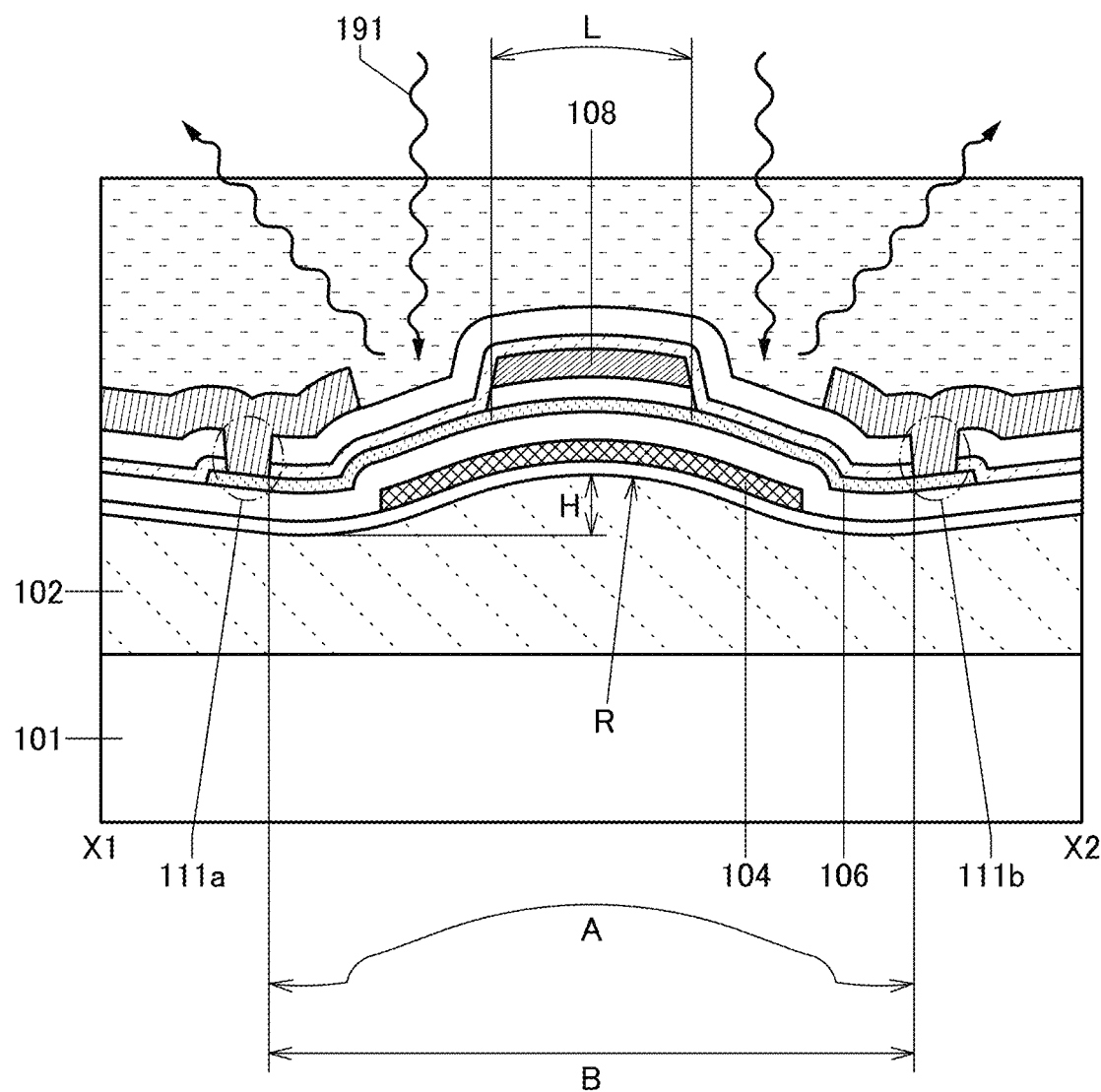
FIGS. 3A and 3B illustrate a transistor.
Figure 3B:
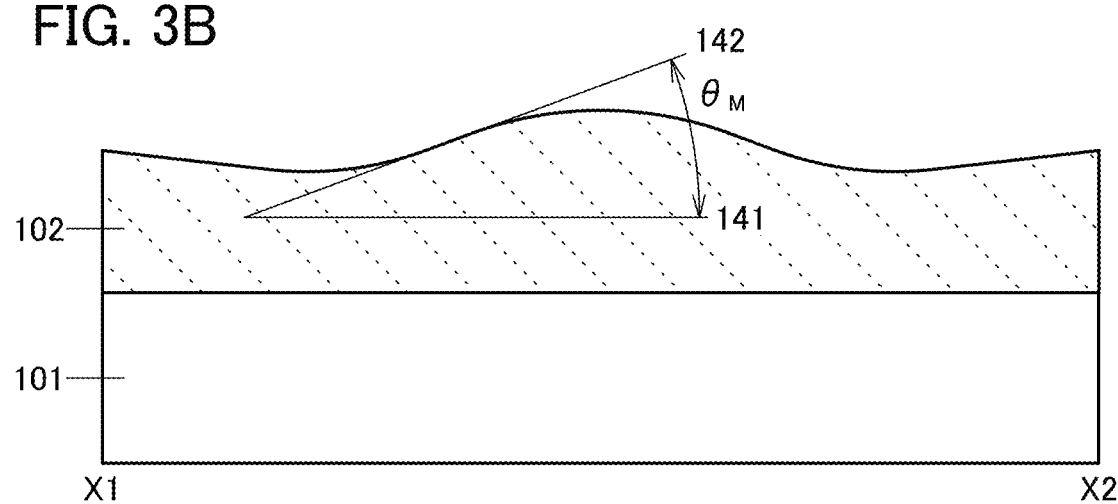

FIG. 1A is a plan view of the transistor 100. FIG. 1B, FIG. 3A, and FIG. 3B are each a cross-sectional view (in the channel length direction) of the portion indicated by dashed-dotted line X1-X2 in FIG. 1A. Note that FIG. 3B illustrates only a substrate 101 and an insulating layer 102. FIG. 2 is a cross-sectional view (in the channel width direction) of the portion indicated by dashed-dotted line Y1-Y2 in FIG. 1A.

The transistor 100 described in this embodiment is a kind of top-gate transistor. The transistor 100 is provided over the substrate 101 with the insulating layer 102 and an insulating layer 103 provided therebetween. The transistor 100 includes an electrode 104, an insulating layer 105, a semiconductor layer 106, an insulating layer 107, an electrode 108, an insulating layer 109, and an insulating layer 110.

Specifically, the insulating layer 102 has a projection and is provided over the substrate 101. The insulating layer 103 is provided over the insulating layer 102. The electrode 104 is provided over the insulating layer 103. The insulating layer 105 is provided to cover the electrode 104. The semiconductor layer 106 is provided over the insulating layer 105. The insulating layer 107 is provided over the semiconductor layer 106. The electrode 108 is provided over the insulating layer 107. The insulating layer 109 is provided to cover the electrode 108, the insulating layer 107, and the semiconductor layer 106. The insulating layer 109 has a region that is in contact with part of the semiconductor layer 106. The insulating layer 110 is provided over the insulating layer 109.

An electrode 112a and an electrode 112b are provided over the insulating layer 110. The electrode 112a is electrically connected to part of the semiconductor layer 106 through an opening 111a that is formed by removing part of the insulating layer 110 and part of the insulating layer 109. The electrode 112b is electrically connected to another part of the semiconductor layer 106 through an opening 111b that is formed by removing part of the insulating layer 110 and part of the insulating layer 109.

The electrode 112a can serve as one of a source electrode and a drain electrode. The electrode 112b can function as the other of the source electrode and the drain electrode. An insulating layer 113 having a flat surface may be provided over the electrode 112a, the electrode 112b, and the insulating layer 110.

In the transistor 100, a region of the semiconductor layer 106 that is overlapped by the electrode 108 serves as a channel formation region. A region of the semiconductor layer 106 that is not overlapped by the electrode 108 serves as a source region or a drain region. Specifically, a region 106c illustrated in FIG. 1B serves as the channel formation region. A region 106s illustrated in FIG. 1B serves as one of the source region and the drain region. A region 106d illustrated in FIG. 1B serves as the other of the source region and the drain region. The channel length L of the transistor 100 is the length of the region of the semiconductor layer 106 that is overlapped by the electrode 108, in a direction parallel to the direction in which carriers flow.

In some of FIG. 2 and subsequent drawings, the region 106c, the region 106s, and the region 106d are not illustrated.

The semiconductor layer 106, the electrode 104, and the electrode 108 each include a region that overlaps the projection of the insulating layer 102. Since the semiconductor layer 106, the electrode 104, and the electrode 108 overlap the projection of the insulating layer 102, for example, the length B of the semiconductor layer 106 from the opening 111a to the opening 111b when seen in a plan view can be shorter than the actual length A of the semiconductor layer 106 from the opening 111a to the opening 111b (see FIG. 1A and FIG. 3A). In this manner, the cross-sectional shape of the transistor 100 is curved. The transistor 100 having such a curved shape occupies a smaller area.

Light that enters the transistor 100 from the outside is sometimes diffused, for example, to reach the channel formation region of the semiconductor layer 106. The light reaching the channel formation region of the semiconductor layer 106 might cause a change in electrical characteristics of the transistor and a reduction in reliability of the transistor. The curved cross-sectional shape of the transistor 100 allows light 191 that enters the transistor 100 from the outside to be reflected in a direction such that the light goes away from the channel formation region of the semiconductor layer 106 (see FIG. 3A). Consequently, changes in the electrical characteristics of the transistor can be reduced to improve the reliability of the transistor.

In the transistor 100, the channel formation region overlaps the projection of the insulating layer 102. The top of the projection of the insulating layer 102 or the vicinity of the top has a radius of curvature R, which is preferably greater than or equal to one and less than or equal to 20 times the channel length L, further preferably greater than or equal to two and less than or equal to 10 times the channel length L, still further preferably greater than or equal to three and less than or equal to five times the channel length L (see FIG. 3A).

The projection of the insulating layer 102 has a height H, which is preferably greater than or equal to two and less than or equal to 20 times the thickness of the semiconductor layer 106, further preferably greater than or equal to five and less than or equal to 10 times the thickness of the semiconductor layer 106 (see FIG. 3A).

Too steep an incline from the projection of the insulating layer 102 to a depression thereof might reduce the coverage with the layer that is formed over the insulating layer 102 in a later step. Accordingly, the maximum angle Om formed by a line 141 parallel to a surface of the substrate 101 and a tangent 142 of a side surface of the projection is preferably greater than or equal to 5° and less than or equal to 60°, further preferably greater than or equal to 5° and less than or equal to 45°, still further preferably greater than or equal to 5° and less than or equal to 20° (see FIG. 3B).

The projection of the insulating layer 102 can be formed by utilizing a difference between the mechanical strengths of the layers. For example, the insulating layer 102 is formed using a material whose Young's modulus is one tenth or less, preferably one fiftieth or less, further preferably one hundredth or less that of the electrode 104. In addition, the insulating layer 102 is formed using a material whose Young's modulus is one tenth or less, preferably one fiftieth or less, further preferably one hundredth or less that of the insulating layer 103.

Here, in the case where a given layer A consists of stacked layers, the Young's modulus of the layer A means that of the layer having a larger Young's modulus than any other layers included in the layer A. Alternatively, the Young's modulus of the layer A means the Young's modulus obtained by evaluating the layer A consisting of stacked layers as a single layer.

The insulating layer 105 is formed using a material having a compressive stress of greater than or equal to 200 MPa, preferably greater than or equal to 1000 MPa, further preferably greater than or equal to 1500 MPa. The electrode 104 is preferably formed using a material having compressive stress. When the electrode 104 is formed using a material having tensile stress, the absolute value of the stress of the electrode 104 is preferably smaller lower than or equal to the absolute value of the stress of the insulating layer 105.

Here, in the case where a given layer A consists of stacked layers, the stress of the layer A means the sum of the stresses of all the layers included in the layer A. For example, in the case where the insulating layer 105 consists of two layers of an insulating layer 105a and an insulating layer 105b, the stress of the insulating layer 105 means the sum of the stress of the insulating layer 105a and that of the insulating layer 105b.

The thickness of the insulating layer 103 is preferably half or less, further preferably one fifth or less, still further preferably one tenth or less that of the insulating layer 105.

Figure 4A:
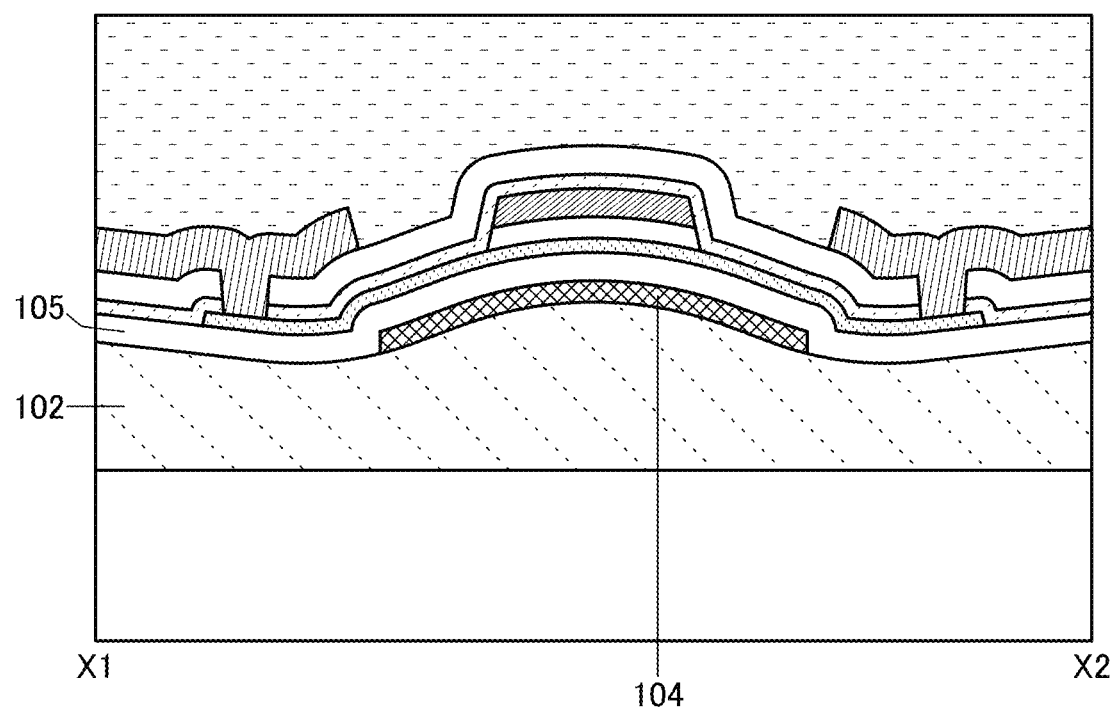
FIGS. 4A and 4B illustrate a transistor.
Figure 4B:
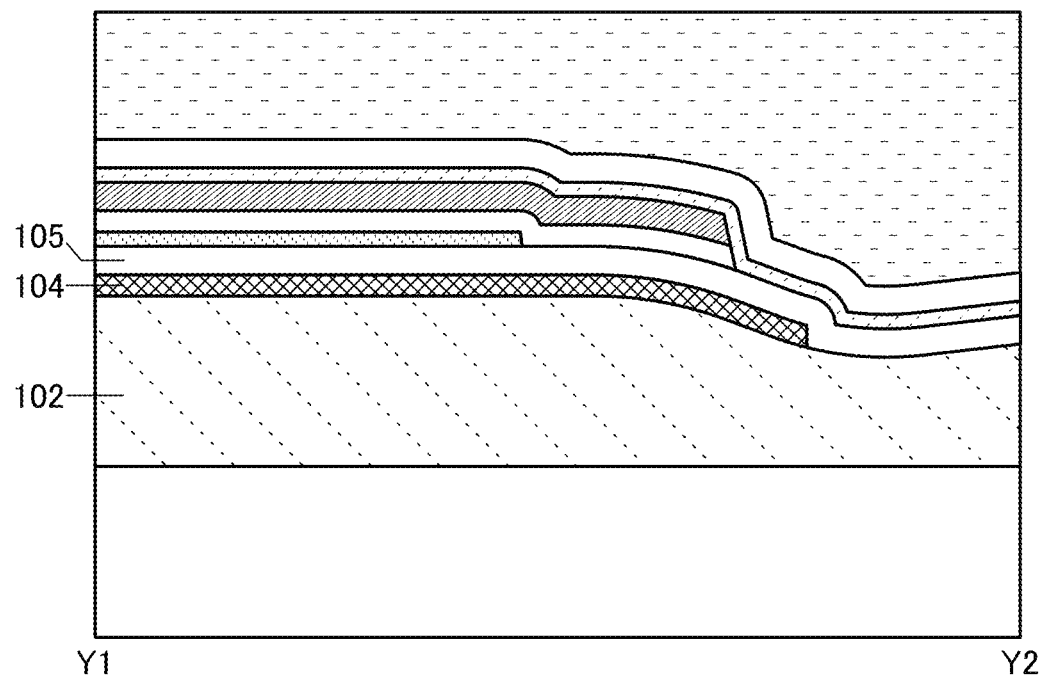

The insulating layer 105 may be formed using an insulating material that is unlikely to transmit impurities, in which case the insulating layer 103 is not necessarily provided (see FIGS. 4A and 4B). FIG. 4A is a cross-sectional view corresponding to FIG. 1B. FIG. 4B is a cross-sectional view corresponding to FIG. 2.

Figure 5A:
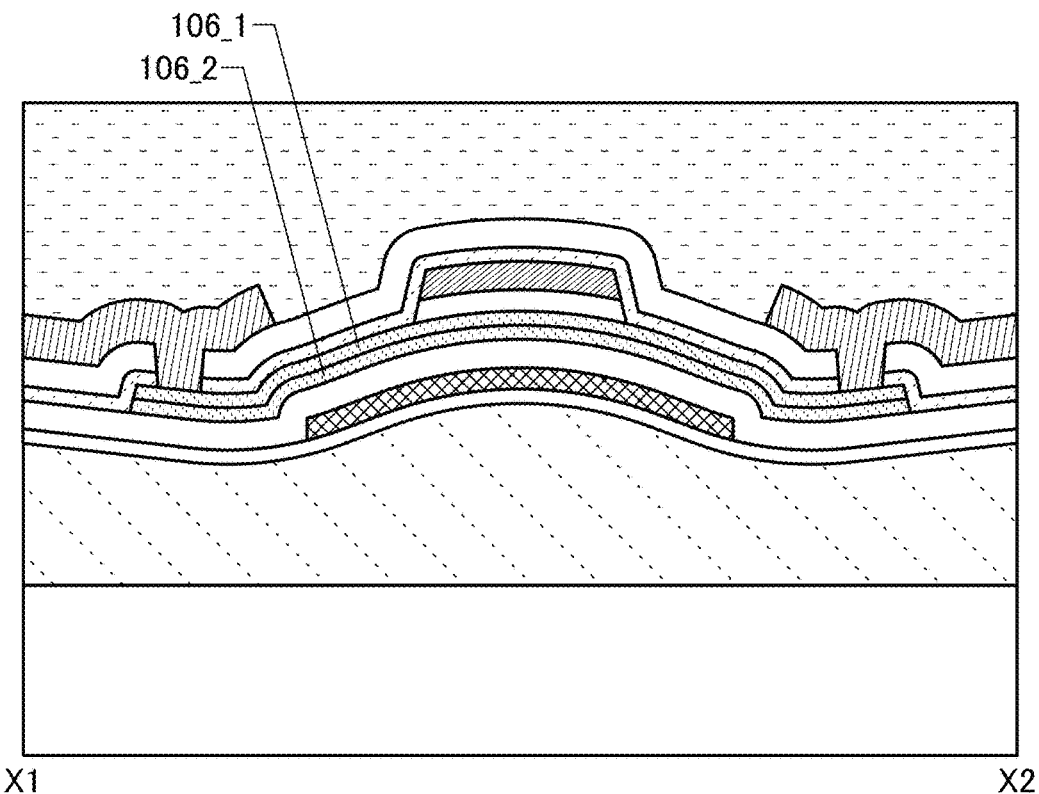
FIGS. 5A and 5B each illustrate a transistor.
Figure 5B:
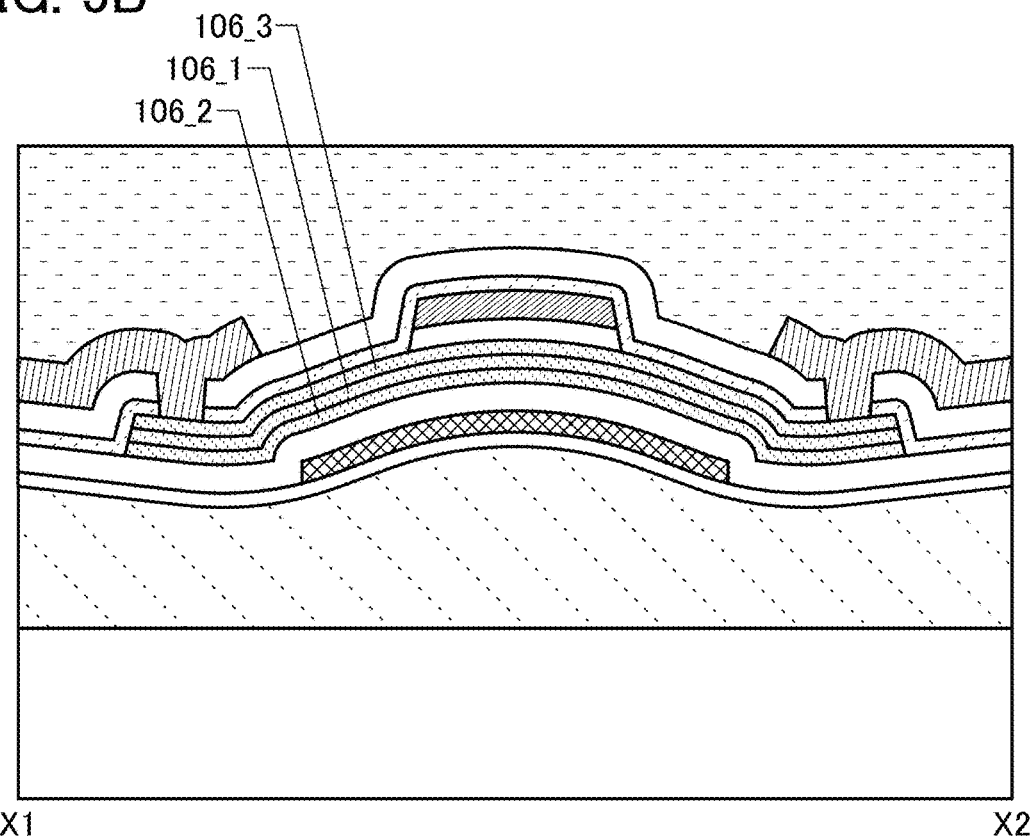

The semiconductor layer 106 is not limited to a single layer and may be a stack of a plurality of layers. For example, the semiconductor layer 106 may have a two-layer structure of a semiconductor layer 106_1 and a semiconductor layer 106_2 as illustrated in FIG. 5A. Alternatively, the semiconductor layer 106 may have a three-layer structure of the semiconductor layer 106_1, the semiconductor layer 106_2, and a semiconductor layer 106_3 as illustrated in FIG. 5B, for example. Needless to say, the semiconductor layer 106 may be a stack of four or more layers. Note that FIGS. 5A and 5B are cross-sectional views corresponding to FIG. 1B.

[Gate Electrode and Backgate Electrode]

The electrode 104 and the electrode 108 can each function as a gate electrode. In the case where one of the electrode 104 and the electrode 108 is referred to as a "gate electrode" or a "gate", the other can be referred to as a "backgate electrode" or a "backgate". For example, in the transistor 100, in the case where the electrode 108 is referred to as a "gate electrode", the electrode 104 is referred to as a "backgate electrode". For example, in the transistor 100, in the case where the electrode 104 is referred to as a "gate electrode", the electrode 108 is referred to as a "backgate electrode".

When the electrode 104 is used as the gate electrode, the transistor 100 can be considered as a bottom-gate transistor. In some cases, one of the electrodes 104 and 108 is referred to as "first gate electrode" and the other is referred to as "second gate electrode".

The gate electrode and the backgate electrode are generally formed using conductive layers. The gate electrode and the backgate electrode are placed so that a channel formation region of a semiconductor layer is sandwiched therebetween. In other words, the gate electrode and the backgate electrode surround the semiconductor layer. This structure enables the semiconductor layer 106 in the transistor 100 to be electrically surrounded by electric fields of the electrode 108 serving as the gate electrode and the electrode 104 serving as the backgate electrode. Such a structure of a transistor in which electric fields of the gate electrode and the backgate electrode electrically surround the semiconductor layer where a channel is formed can be referred to as a surrounded-channel (S-channel) structure.

The backgate electrode can function in a manner similar to that of the gate electrode. The potential of the backgate electrode may be the same as that of the gate electrode or may be a ground potential or a predetermined potential. By changing the potential of the backgate electrode independently of the potential of the gate electrode, the threshold voltage of the transistor can be changed.

As described above, the electrode 108 can function as a gate electrode. Thus, the insulating layer 107 can function as a gate insulating layer. In addition, the electrode 104 can also function as a gate electrode. Accordingly, the insulating layer 105 can also function as a gate insulating layer.

By providing the electrode 104 and the electrode 108 so that the semiconductor layer 106 is located therebetween, and by setting the potentials of the electrode 104 and the electrode 108 to be the same, a region of the semiconductor layer 106 through which carriers flow is enlarged in the film thickness direction; thus, the amount of transferred carriers is increased. As a result, the on-state current and the field-effect mobility of the transistor are increased.

Accordingly, the transistor can have a large on-state current for its area. That is, the footprint of the transistor can be small for a required on-state current. Thus, a semiconductor device having a high degree of integration can be achieved.

Furthermore, the gate electrode and the backgate electrode are formed using conductive layers and thus each have a function of preventing an electric field generated outside the transistor from influencing the semiconductor layer in which the channel is formed (in particular, an electric field blocking function against static electricity and the like). When the backgate electrode is formed larger than the semiconductor layer to cover the semiconductor layer in the plan view, the electric field blocking function can be enhanced.

Since each of the electrodes 104 and 108 has a function of blocking an electric field from the outside, charges of charged particles and the like generated above the electrode 108 and below the electrode 104 do not influence the channel formation region of the semiconductor layer 106. As a result, degradation of electrical characteristics by a stress test (e.g., a negative gate bias temperature (−GBT) stress test in which negative voltage is applied to a gate) is reduced. In addition, the electrodes 104 and 108 can block an electric field generated from the drain electrode so as not to affect the semiconductor layer. Thus, changes in the rising voltage of on-state current due to changes in drain voltage can be suppressed. Note that this effect is significant when a potential is supplied to the electrodes 104 and 108.

A GBT stress test is a kind of acceleration test and can evaluate, in a short time, a change in transistor characteristics due to long-term use (i.e., a change over time). In particular, the amount of change in threshold voltage of a transistor between before and after the GBT stress test is an important indicator when examining the reliability of the transistor. If the amount of change in the threshold voltage between before and after the GBT stress test is small, the transistor has high reliability.

By providing the electrode 104 and the electrode 108 and setting the potentials of the electrode 104 and the electrode 108 to be the same, the change in threshold voltage is reduced. Accordingly, variations in electrical characteristics among a plurality of transistors are also reduced.

The transistor including a backgate electrode has a smaller change in threshold voltage between before and after a positive GBT stress test in which positive voltage is applied to a gate than a transistor including no backgate electrode.

In the case where light is incident on the backgate electrode side, when the backgate electrode is formed using a light-blocking conductive layer, light can be prevented from entering the semiconductor layer from the backgate electrode side. Thus, photodegradation of the semiconductor layer can be prevented and deterioration in electrical characteristics of the transistor, such as a change in the threshold voltage, can be prevented.

[Substrate]

As the substrate 101, a glass substrate, a ceramic substrate, a flexible substrate that has heat resistance high enough to withstand a process temperature of this manufacturing process, or the like can be used. When the substrate does not need a light-transmitting property, a metal substrate, such as a stainless alloy substrate, with a surface provided with an insulating layer may be used. As the glass substrate, an alkali-free glass substrate of barium borosilicate glass, aluminoborosilicate glass, aluminosilicate glass, or the like can be used, for example. In addition, a quartz substrate, a sapphire substrate, or the like can be used.

As the substrate 101, a glass substrate having any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

When a flexible substrate is used as the substrate 101, a transistor, a capacitor, and the like may be directly formed over the flexible substrate, or they may be formed over a manufacturing substrate, and then transferred onto the flexible substrate. To transfer the transistor, the capacitor, and the like from the manufacturing substrate to the flexible substrate, a separation layer is preferably provided between the manufacturing substrate and the transistor, the capacitor, and the like.

For the flexible substrate, metal, an alloy, resin, glass, or fiber thereof can be used, for example. The flexible substrate used as the substrate 101 preferably has a lower coefficient of linear expansion because deformation due to an environment is suppressed. The flexible substrate used as the substrate 101 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon and aramid), polyimide, polycarbonate, and acrylic resin. In particular, aramid is preferably used for the flexible substrate because of its low coefficient of linear expansion.

As the substrate 101, a single crystal semiconductor substrate or a polycrystalline semiconductor substrate made of silicon, silicon carbide, or the like or a compound semiconductor substrate made of silicon germanium or the like can also be used. Alternatively, an SOI substrate, a semiconductor substrate on which a semiconductor element such as a strained transistor or a FIN-type transistor is provided, or the like can be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. That is, the substrate 101 is not limited to a simple supporting substrate and may be a substrate where a device such as a transistor is formed. In that case, at least one of the gate, the source, and the drain of the transistor 100 may be electrically connected to the device.

[Insulating Layer]

The insulating layer 102 can be formed using an organic resin (an organic material) having heat resistance, such as a polyimide, an acrylic resin, a benzocyclobutene resin, a polyamide, or an epoxy resin. Depending on the purpose or intended use, the insulating layer 102 may be formed using a material and a method similar to those used for any of the insulating layer 103, the insulating layer 105, the insulating layer 107, the insulating layer 109, the insulating layer 110, the insulating layer 113, and the like, which will be described later. In addition, the insulating layer 102 may be a stack including the above material.

There is no particular limitation on the method for forming the insulating layer 102, and any of the following methods which depend on a material thereof can be used: a sputtering method; an SOG method; spin coating; dipping; spray coating; a droplet discharging method (e.g., an ink-jet method); a printing method (e.g., screen printing or offset printing); or the like. When a liquid organic resin is used for an insulating layer, a step of baking the organic resin is commonly needed. When the baking step also serves as heat treatment for another layer, a transistor can be manufactured efficiently.

The insulating layers 103, 105, 107, 109, 110, and 113 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

In particular, the insulating layer 103 is preferably formed using an insulating material through which impurities do not easily pass. Furthermore, the insulating layer 109 and/or the insulating layer 110 are/is preferably formed using an insulating material through which impurities do not easily pass. Examples of an insulating material through which impurities do not easily pass include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material through which impurities do not easily pass is used for the insulating layer 103, impurity diffusion from the substrate 101 side can be prevented, and the reliability of the transistor can be improved. When the insulating material through which impurities do not easily pass is used for the insulating layer 109 and/or the insulating layer 110, impurity diffusion from the insulating layer 113 side can be prevented, and the reliability of the transistor can be improved.

When an oxide semiconductor layer is used as the semiconductor layer 106, the insulating layer 103 is preferably formed using an insulating material into which oxygen is less likely to diffuse and/or be absorbed. Moreover, the insulating layer 109 and/or the insulating layer 110 are/is preferably formed using an insulating material into which oxygen is less likely to diffuse and/or be absorbed. In that case, diffusion of oxygen to the outside can be suppressed.

Note that the insulating layer 103, 109, and/or 110 may be a stack of insulating layers formed with the above materials.

When an oxide semiconductor layer is used as the semiconductor layer 106, the hydrogen concentration of the insulating layers is preferably low in order to prevent an increase in the hydrogen concentration of the semiconductor layer 106. In particular, the hydrogen concentration of the insulating layer in contact with the semiconductor layer 106 is preferably low. In this embodiment, the hydrogen concentration of the insulating layers 105 and 107 is preferably low. Specifically, the hydrogen concentration of the insulating layers, which is measured by secondary ion mass spectrometry (SIMS), is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. Furthermore, the nitrogen concentration of the insulating layer is preferably low in order to prevent an increase in the nitrogen concentration of the oxide semiconductor layer. Specifically, the nitrogen concentration of the insulating layer, which is measured by SIMS, is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

At least one of the insulating layer 105 and the insulating layer 107 is preferably an insulating layer from which oxygen is released by heating. Specifically, it is preferable to use an insulating layer in which the amount of released oxygen converted into oxygen atoms is greater than or equal to $1.0 \times 10^{18}$ atoms/cm$^3$, further preferably greater than or equal to $1.0 \times 10^{19}$ atoms/cm$^3$, or still further preferably greater than or equal to $1.0 \times 10^{20}$ atoms/cm$^3$ in thermal desorption spectroscopy (TDS) where heat treatment is performed such that the surface temperature of the insulating layer ranges from 100° C. to 700° C., preferably from 100° C. to 500° C. Note that in this specification and the like, oxygen released by heating is also referred to as excess oxygen.

It is particularly preferred that the amount of defects in the insulating layer in contact with the oxide semiconductor layer be small. Typically, the spin density of a signal that appears at g=2.001 due to a dangling bond of silicon is preferably lower than or equal to $3 \times 10^{17}$ spins/cm$^3$ by electron spin resonance (ESR) measurement. If the amount of defects in the insulating layer is large, oxygen might be bonded to the defects, reducing excess oxygen.

It is particularly preferred that the insulating layer in contact with the oxide semiconductor layer be an oxide insulating layer in which the density of states due to nitrogen oxide (NO$_X$, where X is greater than 0 and less than or equal to 2; typically NO or NO$_2$) is low. As the oxide insulating layer, a silicon oxynitride layer that releases less nitrogen oxide, an aluminum oxynitride layer that releases less nitrogen oxide, or the like can be used. An oxide insulating layer that releases less nitrogen oxide is a layer in which the amount of released ammonia is larger than the amount of released nitrogen oxide in TDS. The amount of released ammonia molecules is typically greater than or equal to $1 \times 10^{18}$ molecules/cm$^3$ and less than or equal to $5 \times 10^{19}$ molecules/cm$^3$. Note that the amount of released ammonia molecules is the amount of ammonia molecules released by heat treatment which makes the surface temperature of the oxide insulating layer higher than or equal to 50° C. and lower than or equal to 650° C., preferably higher than or equal to 50° C. and lower than or equal to 550° C.

Nitrogen oxide forms a level in the oxide semiconductor layer or the insulating layer. The level is positioned in the energy gap of the oxide semiconductor. When nitrogen oxide reaches the interface between the insulating layer and the oxide semiconductor layer, an electron can potentially be trapped by the level on the insulating layer side. As a result, the trapped electrons remain in the vicinity of the interface between the insulating layer and the oxide semiconductor layer; thus, the threshold voltage of the transistor is shifted in the positive direction.

Note that the density of states due to nitrogen oxide can sometimes be formed between the energy of the valence band maximum ($E_{v\_os}$) and the energy of the conduction band minimum ($E_{c\_os}$) of the oxide semiconductor layer.

Nitrogen oxide reacts with ammonia and oxygen in heat treatment. Since nitrogen oxide contained in the insulating layer reacts with ammonia contained in the insulating layer in heat treatment, the nitrogen oxide contained in the insulating layer is reduced. Consequently, electrons are hardly trapped at the interface between the insulating layer and the oxide semiconductor layer.

By using the above oxide insulating layer as the insulating layer in contact with the oxide semiconductor layer, a shift in the threshold voltage of the transistor can be reduced, which leads to reduced fluctuations in the electrical characteristics of the transistor.

The insulating layer containing excess oxygen can be formed by performing treatment for adding oxygen to an insulating layer. The treatment for adding oxygen can be performed by, an ion implantation method, an ion doping method, a plasma immersion ion implantation method, or the like. The treatment for adding oxygen can be heat treatment under an oxidizing atmosphere, plasma treatment, inverse sputtering treatment, or the like. The plasma treatment under an oxidizing atmosphere is preferably performed using an apparatus including a power source for generating high-density plasma using microwaves, for example. Alternatively, a power source for applying a radio frequency (RF) to a substrate side may be provided. The use of high-density plasma generates oxygen radicals at a high density. Application of RF to the substrate side allows the oxygen radicals generated by the high-density plasma to be efficiently guided into a target layer. Alternatively, plasma treatment may be performed under an inert atmosphere and then plasma treatment may be performed under an oxidizing atmosphere to compensate released oxygen. By oxygen addition through inverse sputtering treatment, the effect of cleaning a sample surface can be expected. Meanwhile, damage might occur on the sample surface depending on treatment conditions. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

Such oxygen doping treatment sometimes increases the crystallinity of the semiconductor layer. Furthermore, the oxygen doping treatment sometimes removes impurities contained in the target layer, such as hydrogen and water. That is, "oxygen doping treatment" can also be referred to as "impurity-removing treatment". Specifically, plasma treatment performed using oxygen under a reduced pressure and an oxidizing atmosphere as the oxygen doping treatment cuts a bond involving hydrogen or water in a target insulating layer or a target semiconductor layer. This makes it easy for hydrogen and water in the target layer to be released. Thus, the plasma treatment as the oxygen doping treatment is preferably performed while heating is performed. Alternatively, heat treatment is preferably performed after the plasma treatment. When plasma treatment is performed after heat treatment and heat treatment is further performed, the impurity concentration in the target layer can be lowered.

The insulating layer 113 is preferably an insulating layer (hereinafter also referred to as a planarization layer) that has a function of covering unevenness and the like caused by the transistor or the like. The insulating layer 113 can be formed using, for example, an organic resin similar to that used for the insulating layer 102. It is also possible to use a low-dielectric constant material (a low-k material), a siloxane-based resin, phosphosilicate glass (PSG), borophosphosilicate glass (BPSG), or the like for the insulating layer 113.

Note that a siloxane resin corresponds to a resin containing a Si—O—Si bond formed using a siloxane-based material as a starting material. The siloxane resin may include an organic group (e.g., an alkyl group or an aryl group) or a fluoro group as a substituent. In addition, the organic group may include a fluoro group.

Note that the insulating layer 113 is formed using an insulating material. Accordingly, the insulating layer 113 can be formed using any of the above-described inorganic materials and the above-described organic materials. The insulating layer 113 may be formed by stacking a plurality of insulating layers formed of an inorganic material and/or an organic material.

[Electrode]

As a conductive material for forming the electrodes 104, 112a, 112b, and 108, a material containing one or more metal elements selected from aluminum (Al), chromium (Cr), iron (Fe), copper (Cu), silver (Ag), gold (Au), platinum (Pt), tantalum (Ta), nickel (Ni), titanium (Ti), cobalt (Co), molybdenum (Mo), tungsten (W), hafnium (Hf), vanadium (V), niobium (Nb), manganese (Mn), magnesium (Mg), zirconium (Zr), beryllium (Be), and the like can be used. Moreover, a semiconductor with a high electric conductivity, typified by polycrystalline silicon containing an impurity element such as phosphorus, or silicide such as nickel silicide may be used.

A Cu—X alloy film (X is Mn, Ni, Cr, Fe, Co, Mo, Ta, or Ti) may be used as the conductive material. A layer made of a Cu—X alloy can be processed with a wet etching process, resulting in lower manufacturing cost.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium zinc oxide, indium gallium zinc oxide, indium oxide containing tungsten oxide, indium zinc oxide containing tungsten oxide, indium oxide containing titanium oxide, indium tin oxide containing titanium oxide, indium tin oxide to which silicon is added, or indium gallium zinc oxide containing nitrogen may be used.

A stack of a plurality of conductive layers formed with the above materials may be used. For example, a stacked-layer structure formed using a material containing the above metal element and a conductive material containing oxygen may be used. Alternatively, a stacked-layer structure formed using a material containing the above metal element and a conductive material containing nitrogen may be used. Further alternatively, a stacked-layer structure formed using a material containing the above metal element, a conductive material containing oxygen, and a conductive material containing nitrogen may be used.

When copper is used for the electrodes 112a and 112b to lower the resistance of the electrodes 112a and 112b, a conductive material into which copper does not easily diffuse is preferably provided between the electrode 112a and the semiconductor layer 106 and between the electrode 112b and the semiconductor layer 106. Since copper is likely to diffuse into a semiconductor layer, the operation of a semiconductor device might be unstable and the yield might be significantly reduced. When a conductive material into which copper does not easily diffuse is provided between the semiconductor layer and a wiring or an electrode that contains copper, the reliability of the transistor 100 can be increased.

Examples of a conductive material into which copper does not easily diffuse include a metal material having a higher melting point than copper (e.g., tungsten, titanium, and tantalum) and a nitride material thereof. Moreover, a wiring or an electrode containing copper may be covered with such a conductive material. When a wiring or an electrode containing copper is covered with or wrapped by a conductive material into which copper does not easily diffuse, the reliability of the transistor 100 can be further increased.

In the case where an oxide semiconductor layer is used as the semiconductor layer 106, a conductive material that has a function of absorbing hydrogen when being subjected to heat treatment is preferably used for regions of the electrodes 112a and 112b in contact with the semiconductor layer 106, in which case the hydrogen concentration of the semiconductor layer 106 can be reduced by heat treatment performed later. Examples of a conductive material with a function of absorbing hydrogen include titanium, indium zinc oxide, and indium tin oxide to which silicon is added.

[Semiconductor Layer]

The semiconductor layer 106 can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In particular, an oxide semiconductor is preferably used for the semiconductor layer 106. The band gap of an oxide semiconductor is greater than or equal to 2 eV; thus, when the oxide semiconductor is used for the semiconductor layer 106, a transistor with an extremely low off-state current can be achieved. A transistor using an oxide semiconductor in the semiconductor layer where a channel is formed (also referred to as OS transistor) has high withstand voltage between its source and drain. Thus, a transistor with high reliability can be provided. A transistor with high output voltage and high withstand voltage can be provided. Furthermore, a semiconductor device or the like with high reliability can be provided. A semiconductor device with high output voltage and high withstand voltage can be provided.

In this embodiment, the case where an oxide semiconductor is used for the semiconductor layer 106 is described.

Note that in this specification and the like, an oxide semiconductor (OS) is a material that has separate portions: a conductive portion for providing a switching (on/off) function and a dielectric portion. The whole (the whole electric field) of the material serves as a semiconductor. A metal oxide, which is a material whose conductive components and dielectric components are separated at a nanoparticle level, also has a switching (on/off) function as a whole and thus is classified as an OS in this specification and the like.

An oxide semiconductor will be described below. An oxide semiconductor preferably contains at least indium or zinc. In particular, indium and zinc are preferably contained. In addition, an element M (M is one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like) may be contained.

[Structure of Oxide Semiconductor]

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, formation of a crystal grain boundary is inhibited by distortion of a lattice arrangement. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between the structure of the nc-OS and the structure of the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor that can be used in one embodiment of the present invention.

[CAC-OS]

Described here is the composition of a cloud aligned composite OS (CAC-OS) which can be used for a transistor according to one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, the state in which one or more metal elements are unevenly distributed in regions each having a size of greater than or equal to 0.5 nm and less than or equal to 10 nm, preferably greater than or equal to 1 nm and less than or equal to 2 nm, or a similar size and the regions including the metal element(s) are mixed is referred to as a mosaic pattern or a patch-like pattern in some cases.

As an example of the CAC-OS, an In—Ga—Zn oxide with the CAC composition (such an In—Ga—Zn oxide may be particularly referred to as CAC-IGZO) will be described. The CAC-IGZO has a composition with a mosaic pattern in which materials are separated into indium oxide ($InO_{X1}$, where X1 is a real number greater than 0) or indium zinc oxide ($In_{X2}Zn_{Y2}O_{Z2}$, where X2, Y2, and Z2 are each a real number greater than 0) and gallium oxide ($GaO_{X3}$, where X3 is a real number greater than 0) or gallium zinc oxide ($Ga_{Y4}Zn_{Y4}O_{Z4}$, where X4, Y4, and Z4 are each a real number greater than 0), for example. Furthermore, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to the element M in a first region is larger than the atomic ratio of In to the element M in a second region, the first region has a higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compound has a single-crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In part of the material composition of a CAC-OS containing In, Ga, Zn, and O, nanoparticle regions including Ga as a main component and nanoparticle regions including In as a main component are observed. These nanoparticle regions are randomly dispersed in a mosaic pattern. Therefore, the crystal structure is a secondary element for the CAC-OS.

Note that the CAC-OS does not include a stacked structure of two or more films with different compositions. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In part of the composition of a CAC-OS which contains, instead of gallium, one or more metal elements selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like, nanoparticle regions including the metal element(s) as a main component(s) and nanoparticle regions including In as a main component are observed. These nanoparticle regions are randomly dispersed in a mosaic pattern.

The CAC-OS can be formed by a sputtering method under the conditions where a substrate is not heated intentionally, for example. In the case of forming the CAC-OS by a sputtering method, one or more gases selected from an inert gas (typically, argon), an oxygen gas, and a nitrogen gas may be used as a deposition gas. The percentage of the oxygen gas flow rate in the total flow rate of the deposition gas at the time of deposition is preferably as low as possible; for example, the percentage of the oxygen gas flow rate is preferably higher than or equal to 0% and lower than 30%, further preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in the plan-view direction and the cross-sectional direction.

For example, an energy dispersive X-ray spectroscopy (EDX) mapping image confirms that an In—Ga—Zn oxide with the CAC composition has a structure in which regions including $GaO_{X3}$ as a main component and regions including $In_{X2}Zn_{Y2}O_{Z2}$ or $InO_{X1}$ as a main component are unevenly distributed and mixed.

The CAC-OS has a structure and characteristics different from those of an IGZO compound in which metal elements are evenly distributed. That is, in the CAC-OS, regions including $GaO_{X3}$ or the like as a main component and regions including $In_{X2}Zn_{Y2}O_{Z2}$ or $InO_{X1}$ as a main component are phase-separated from each other in a mosaic pattern.

The conductivity of the region including $In_{X2}Zn_{Y2}O_{Z2}$ or $InO_{X1}$ as a main component is higher than that of the region including $GaO_{X3}$ or the like as a main component. In other words, when carriers flow through the region including $In_{X2}Zn_{Y2}O_{Z2}$ or $InO_{X1}$ as a main component, the oxide semiconductor exhibits conductivity. Accordingly, when the regions including $In_{X2}Zn_{Y2}O_{Z2}$ or $InO_{X1}$ as a main component are distributed in the oxide semiconductor like a cloud, a high field-effect mobility (μ) can be achieved.

In contrast, the insulating property of the region including $GaO_{X3}$ or the like as a main component is higher than that of the region including $In_{X2}Zn_{Y2}O_{Z2}$ or $InO_{X1}$ as a main component. In other words, when the regions including $GaO_{X3}$ or the like as a main component are distributed in the oxide semiconductor, leakage current can be suppressed and favorable switching operation can be achieved.

Accordingly, when a CAC-OS is used for a transistor, the insulating property derived from $GaO_{X3}$ or the like and the conductivity derived from $In_{X2}Zn_{Y2}O_{Z2}$ or $InO_{X1}$ complement each other, whereby a high on-state current (Ion) and a high field-effect mobility (μ) can be achieved.

A semiconductor element including a CAC-OS has high reliability. The CAC-OS can be used for a variety of semiconductor devices typified by a display.

[Atomic Ratio of Oxide Semiconductor]

Next, preferred ranges of the atomic ratio of indium, the element M, and zinc contained in an oxide semiconductor that can be used in one embodiment of the present invention are described with reference to FIGS. 33A to 33C. Note that the proportion of oxygen atoms is not shown in FIGS. 33A to 33C. The terms of the atomic ratio of indium, the element M, and zinc contained in the oxide semiconductor are denoted by [In], [M], and [Zn], respectively.

Figure 33A:
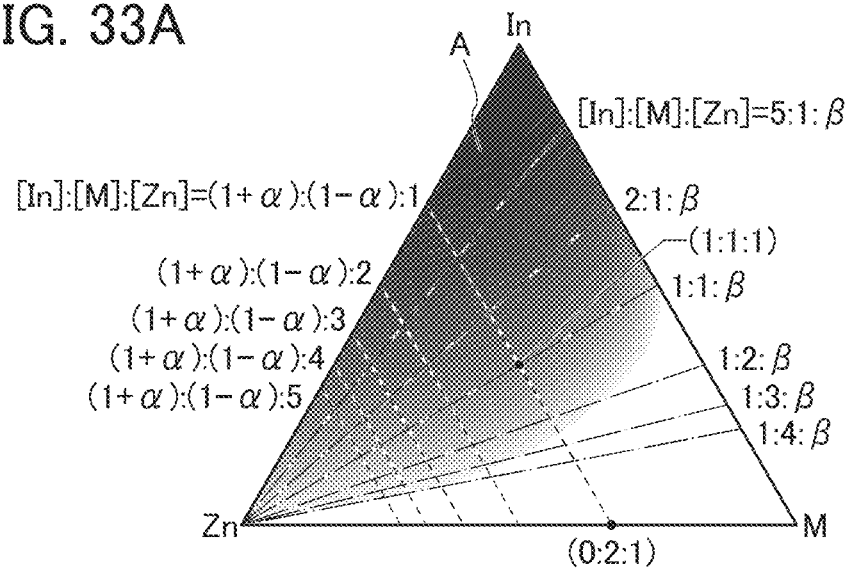
FIGS. 33A to 33C each illustrate an atomic ratio range of an oxide of one embodiment of the present invention.
Figure 33B:
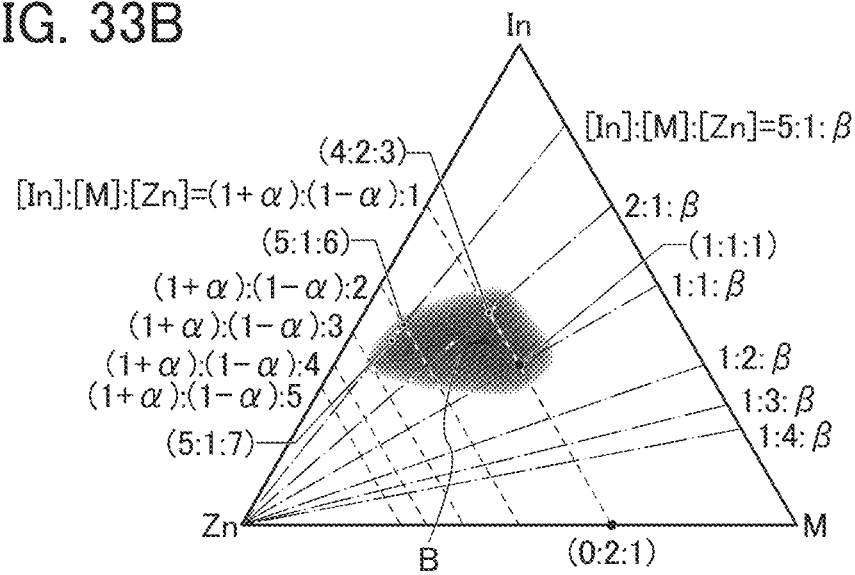
Figure 33C:
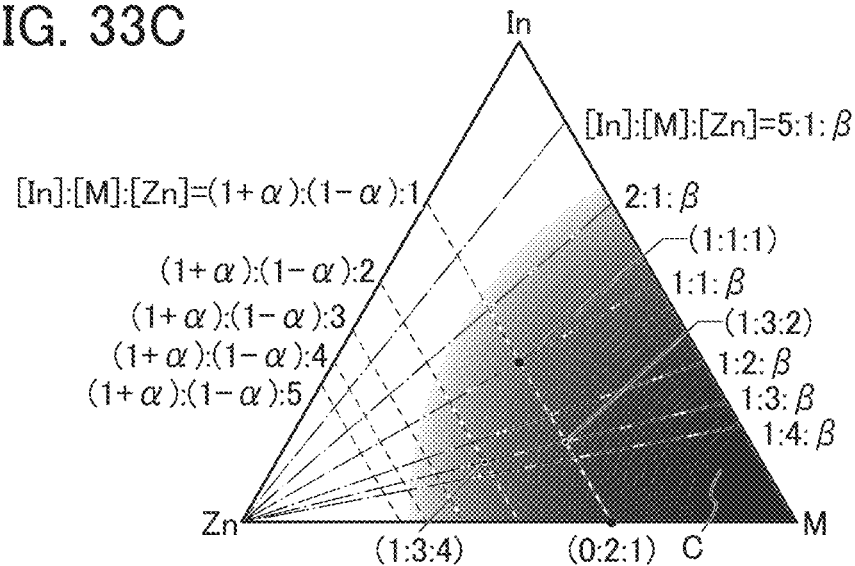

In FIGS. 33A to 33C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ (where $\beta \geq 0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, an oxide semiconductor with the atomic ratio of [In]:[M]:[Zn]=0:2:1 or a neighborhood thereof in FIGS. 33A to 33C tends to have a spinel crystal structure.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

A region A in FIG. 33A represents examples of the preferred ranges of the atomic ratio of indium, the element M, and zinc contained in an oxide semiconductor.

The oxide semiconductor containing indium in a higher proportion can have higher carrier mobility (electron mobility). Therefore, an oxide semiconductor having a high content of indium has higher carrier mobility than that of an oxide semiconductor having a low content of indium.

In contrast, when the indium content and the zinc content in an oxide semiconductor become lower, carrier mobility becomes lower. Thus, with an atomic ratio [In]:[M]:[Zn] of 0:1:0 and the vicinity thereof (e.g., a region C in FIG. 33C), insulation performance becomes better.

Accordingly, an oxide semiconductor that can be used in one embodiment of the present invention preferably has an atomic ratio represented by the region A in FIG. 33A. With the atomic ratio, a layered structure with high carrier mobility and a few grain boundaries is easily obtained.

An oxide semiconductor with an atomic ratio in the region A, particularly in a region B in FIG. 33B, is excellent because the oxide semiconductor easily becomes a CAAC-OS and has high carrier mobility.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

Note that the region B includes an atomic ratio [In]:[M]:[Zn] of 4:2:3 to 4:2:4.1 and the vicinity thereof. The vicinity includes an atomic ratio [In]:[M]:[Zn] of 5:3:4. Note that the region B includes an atomic ratio [In]:[M]:[Zn] of 5:1:6 and the vicinity thereof and an atomic ratio [In]:[M]:[Zn] of 5:1:7 and the vicinity thereof.

Note that the property of an oxide semiconductor is not uniquely determined by an atomic ratio. Even with the same atomic ratio, the property of an oxide semiconductor might be different depending on a formation condition. For example, in the case where the oxide semiconductor is deposited with a sputtering apparatus, a film having an atomic ratio deviated from the atomic ratio of a target is formed. In addition, [Zn] in the film might be smaller than [Zn] in the target depending on the substrate temperature in deposition. Thus, the illustrated regions each represent an atomic ratio with which an oxide semiconductor tends to have specific characteristics, and boundaries of the regions A to C are not clear.

[Transistor Including Oxide Semiconductor]

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ is used.

A highly purified intrinsic or substantially highly purified intrinsic oxide semiconductor film has a low density of defect states and accordingly has a low density of trap states in some cases.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, an alkali metal, an alkaline earth metal, iron, nickel, and silicon.

[Impurity in Oxide Semiconductor]

Here, the influence of impurities in the oxide semiconductor will be described.

When the oxide semiconductor contains an alkali metal or an alkaline earth metal, defect states are formed and carriers are generated, in some cases. Thus, a transistor including an oxide semiconductor that contains an alkali metal or an alkaline earth metal is likely to be normally-on. Therefore, it is preferable to reduce the concentration of an alkali metal or an alkaline earth metal in the oxide semiconductor. Specifically, the concentration of an alkali metal or an alkaline earth metal in the oxide semiconductor measured by secondary ion mass spectrometry (SIMS) is set lower than or equal to $1 \times 10^{18}$ atoms/$cm^3$, preferably lower than or equal to $2 \times 10^{16}$ atoms/$cm^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1 \times 10^{20}$ atoms/$cm^3$, preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$.

When an oxide semiconductor with sufficiently reduced impurity concentration is used for a channel formation region in a transistor, the transistor can have stable electrical characteristics.

For example, in the case where an InGaZnO$_X$ film (X>0) is formed as the semiconductor layer 106 by a thermal CVD method, trimethylindium (In(CH$_3$)$_3$), trimethylgallium (Ga ($CH_3$)$_3$), and dimethylzinc ($Zn(CH_3)_2$) are used. Without limitation to the above combination, triethylgallium (Ga($C_2H_5$)$_3$) can be used instead of trimethylgallium, and diethylzinc ($Zn(C_2H_5)_2$) can be used instead of dimethylzinc.

For example, in the case where an InGaZnO$_X$ film (X>0) is formed as the semiconductor layer 106 by an ALD method, an In(CH$_3$)$_3$ gas and an O$_3$ gas are sequentially introduced a plurality of times to form an InO$_2$ layer, a Ga(CH$_3$)$_3$ gas and an O$_3$ gas are sequentially introduced a plurality of times to form a GaO layer, and then a Zn(CH$_3$)$_2$ gas and an O$_3$ gas are sequentially introduced a plurality of times to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed using these gases. Note that although an H$_2$O gas obtained by bubbling water with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas or tris(acetylacetonato)indium may be used. Note that tris(acetylacetonato)indium is also referred to as In(acac)$_3$. Instead of a Ga(CH$_3$)$_3$ gas, a Ga(C$_2$H$_5$)$_3$ gas or tris(acetylacetonato)gallium may be used. Note that tris(acetylacetonato)gallium is also referred to as Ga(acac)$_3$. Furthermore, a Zn(CH$_3$)$_2$ gas or zinc acetate may be used. However, the deposition gas is not limited to the above.

In the case where the semiconductor layer 106 is formed by a sputtering method, a target containing indium is preferably used in order to reduce the number of particles. In addition, if an oxide target having a high atomic ratio of the element M is used, the conductivity of the target may be decreased. When a target containing indium is used, the conductivity of the target can be increased and DC discharge or AC discharge is facilitated; thus, deposition over a large substrate can be easily performed. Thus, semiconductor devices can be manufactured with improved productivity.

In the case where the semiconductor layer 106 is formed by a sputtering method, the atomic ratio of In to M and Zn (In:M:Zn) contained in the target is 3:1:1, 3:1:2, 3:1:4, 1:1:0.5, 1:1:1, 1:1:2, 1:1:1.2, 1:4:4, 4:2:4.1, 1:3:2, 1:3:4, 5:1:6, 5:1:8, or the like.

In the case where the semiconductor layer 106 is formed by a sputtering method, a film having an atomic ratio deviated from the atomic ratio of the target is formed in some cases. In particular, the atomic ratio of zinc in a deposited film is smaller than that in the target in some cases. Specifically, the film sometimes has an atomic ratio of zinc of 40 atomic % to 90 atomic % of the atomic ratio of zinc in the target.

When the semiconductor layer 106 is a stack including a plurality of layers as illustrated in FIGS. 5A and 5B, an oxide semiconductor with a wide energy gap is preferably used for the semiconductor layer 106_1, for example. The energy gap of the semiconductor layer 106_1 ranges, for example, from 2.5 eV to 4.2 eV, preferably from 2.8 eV to 3.8 eV, further preferably from 3 eV to 3.5 eV.

The semiconductor layers 106_2 and 106_3 are preferably formed using a material containing one or more kinds of metal elements, other than oxygen, contained in the semiconductor layer 106_1. With the use of such a material, interface states at interfaces between the semiconductor layer 106_3 and the semiconductor layer 106_1 and between the semiconductor layer 106_2 and the semiconductor layer 106_1 are less likely to be generated. Accordingly, carriers are not likely to be scattered or captured at the interfaces, which results in an improvement in field-effect mobility of the transistor. Furthermore, variations in threshold voltage of transistors can be reduced. Thus, a semiconductor device having favorable electrical characteristics can be obtained.

When the semiconductor layer 106_1 is an In-M-Zn oxide (oxide containing In, the element M, and Zn) with an atomic ratio In:M:Zn of $x_2:y_2:z_2$ and each of the semiconductor layers 106_2 and 106_3 is an In-M-Zn oxide with an atomic ratio In:M:Zn of $x_1:y_1:z_1$, $y_1/x_1$ is preferably larger than $y_2/x_2$, further preferably greater than or equal to 1.5 times $y_2/x_2$, still further preferably greater than or equal to two times $y_2/x_2$, yet still further preferably greater than or equal to three times $y_2/x_2$. At this time, $y_2$ is preferably greater than or equal to $x_2$ in the semiconductor layer 106_1, in which case the transistor can have stable electrical characteristics. However, if $y_2$ is greater than or equal to five times $x_2$, the field-effect mobility of the transistor is reduced; accordingly, $y_2$ is preferably less than five times $x_2$. With the above structure, each of the semiconductor layers 106_2 and 106_3 can be a layer in which oxygen vacancy is less likely to be formed than in the semiconductor layer 106_1.

In the case where the semiconductor layer 106_3 is an In-M-Zn oxide and the total content of In and M is assumed to be 100 atomic %, the proportions of In and M are preferably less than 50 atomic % and greater than 50 atomic %, respectively, further preferably less than 25 atomic % and greater than 75 atomic %, respectively. In the case where the semiconductor layer 106_1 is an In-M-Zn oxide and the total content of In and M is assumed to be 100 atomic %, the proportions of In and M are preferably greater than 25 atomic % and less than 75 atomic %, respectively, further preferably greater than 34 atomic % and less than 66 atomic %, respectively. In the case where the semiconductor layer 106_2 is an In-M-Zn oxide and the total content of In and M is assumed to be 100 atomic %, the proportions of In and M are preferably less than 50 atomic % and greater than 50 atomic %, respectively, further preferably less than 25 atomic % and greater than 75 atomic %, respectively. Note that the semiconductor layers 106_2 and 106_3 may be formed using the same type of oxide.

For example, an In—Ga—Zn oxide formed using a target with an atomic ratio In:Ga:Zn of 1:3:2, 1:3:4, 1:3:6, 1:4:5, 1:6:4, or 1:9:6 or an In—Ga oxide formed using a target with an atomic ratio In:Ga of 1:9 or 7:93 can be used for each of the semiconductor layers 106_2 and 106_3 containing In or Ga. Moreover, an In—Ga—Zn oxide formed using a target with an atomic ratio In:Ga:Zn of 1:1:1 or 3:1:2 can be used for the semiconductor layer 106_1, for example. Note that the atomic ratio of each of the semiconductor layers 106_1 to 106_3 may vary within a margin of ±40% of the corresponding atomic ratio.

For the semiconductor layer 106_1, an oxide having a higher electron affinity than the semiconductor layers 106_2 and 106_3 is preferably used. For example, the semiconductor layer 106_1 may be an oxide having an electron affinity higher than that of each of the semiconductor layers 106_2 and 106_3 by 0.07 eV or higher and 1.3 eV or lower, preferably 0.1 eV or higher and 0.7 eV or lower, further preferably 0.15 eV or higher and 0.4 eV or lower. Note that the electron affinity refers to an energy difference between the vacuum level and the conduction band minimum.

Indium gallium oxide has a small electron affinity and an excellent oxygen-blocking property. Therefore, the semiconductor layer 106_2 preferably contains indium gallium oxide. The gallium atomic ratio [Ga/(In+Ga)] is, for example, higher than or equal to 70%, preferably higher than or equal to 80%, further preferably higher than or equal to 90%.

Note that the semiconductor layer 106_2 and/or the semiconductor layer 106_3 may be gallium oxide. For example, when gallium oxide is used for the semiconductor layer 106_3, a leakage current generated between the electrode 108 and the semiconductor layer 106 can be reduced. In other words, the off-state current of the transistor 100 can be reduced.

At this time, when a gate voltage is applied, a channel is formed in the semiconductor layer 106_1 having the highest electron affinity among the semiconductor layers 106_1 to 106_3.

In order to give stable electrical characteristics to the OS transistor, it is preferred that impurities and oxygen vacancies in the oxide semiconductor layer be reduced to highly purify the oxide semiconductor layer so that at least the semiconductor layer 106_1 can be regarded as an intrinsic or substantially intrinsic oxide semiconductor layer. Furthermore, preferably at least the channel formation region of the semiconductor layer 106_1 is regarded as an intrinsic or substantially intrinsic semiconductor layer.

[Film Formation Method]

The insulating layers, the conductive layers for forming electrodes or wirings, the semiconductor layers, or the like can be formed by a sputtering method, a spin coating method, a chemical vapor deposition (CVD) method (such as a thermal CVD method, a metal organic chemical vapor deposition (MOCVD) method, a plasma-enhanced CVD (PECVD) method, a high-density plasma CVD method, a low-pressure CVD (LPCVD) method, or an atmospheric-pressure CVD (APCVD) method), an atomic layer deposition (ALD) method, a molecular beam epitaxy (MBE) method, a pulsed laser deposition (PLD) method, a dipping method, a spray coating method, a droplet discharging method (such as an inkjet method), or a printing method (such as screen printing or offset printing).

By using a PECVD method, a high-quality film can be formed at a relatively low temperature. By using a deposition method that does not use plasma for deposition, such as an MOCVD method, an ALD method, or a thermal CVD method, damage is not easily caused on a surface on which the film is deposited. For example, a wiring, an electrode, an element (e.g., transistor or capacitor), or the like included in a semiconductor device may sometimes be charged up by receiving charges from plasma. In that case, accumulated charges might break the wiring, electrode, element, or the like included in the semiconductor device. Such plasma damage is not caused in the case of using a deposition method without using plasma, and thus the yield of a semiconductor device can be increased. In addition, since plasma damage does not occur in the deposition, a film with few defects can be obtained.

Unlike in a deposition method in which particles ejected from a target or the like are deposited, a film is formed by reaction at a surface of an object in a CVD method and an ALD method. Thus, a CVD method and an ALD method enable favorable step coverage almost regardless of the shape of the object. In particular, an ALD method enables excellent step coverage and excellent thickness uniformity and can be favorably used to cover a surface of an opening with a high aspect ratio, for example. On the other hand, an ALD method has a relatively low deposition rate; thus, it is sometimes preferable to combine an ALD method with another deposition method with a high deposition rate, such as a CVD method.

When a CVD method or an ALD method is used, the composition of a film to be formed can be controlled with a flow rate ratio of source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, the time taken for the film formation can be reduced because the time taken for transfer and pressure adjustment is omitted. Thus, semiconductor devices can be manufactured with improved productivity in some cases.

In the case where a film is formed by an ALD method, a gas that does not contain chlorine is preferably used as a material gas.

When an oxide semiconductor is formed by a sputtering method, each chamber of a sputtering apparatus is preferably evacuated to a high vacuum (to the degree of approximately $5 \times 10^{-7}$ Pa to $1 \times 10^{-4}$ Pa) by an adsorption vacuum pump such as a cryopump so that water and the like acting as impurities for the oxide semiconductor can be removed as much as possible. In particular, the partial pressure of gas molecules corresponding to $H_2O$ (gas molecules corresponding to m/z=18) in the chamber in the standby mode of the sputtering apparatus is preferably lower than or equal to $1 \times 10^{-4}$ Pa, further preferably lower than or equal to $5 \times 10^{-5}$ Pa. The deposition temperature is preferably higher than or equal to RT and lower than or equal to 500° C., further preferably higher than or equal to RT and lower than or equal to 300° C., still further preferably higher than or equal to RT and lower than or equal to 200° C.

In addition, increasing the purity of a sputtering gas is necessary. For example, as an oxygen gas or an argon gas used for a sputtering gas, a gas that is highly purified to have a dew point of −40° C. or lower, preferably −80° C. or lower, further preferably −100° C. or lower, still further preferably −120° C. or lower is used, whereby entry of moisture or the like into the oxide semiconductor film can be minimized.

In the case where the insulating layers, the conductive layers, the semiconductor layers, or the like are formed by a sputtering method using a sputtering gas containing oxygen, oxygen can be supplied to a layer over which these layers are formed. As the amount of oxygen contained in the sputtering gas increases, the amount of oxygen supplied to a layer over which these layers are formed tends to increase.

<Example of Method for Manufacturing Transistor 100>

An example of a method for manufacturing the transistor 100 will be described with reference to FIGS. 6A to 6C, FIGS. 7A to 7C, FIGS. 8A to 8C, FIGS. 9A and 9B, FIGS. 10A and 10B, and FIGS. 11A and 11B. The cross-sectional views of FIGS. 6A to 6C, FIGS. 7A to 7C, FIGS. 8A to 8C, FIGS. 9A and 9B, FIGS. 10A and 10B, and FIGS. 11A and 11B correspond to the cross section of the portion indicated by the dashed-dotted line X1-X2 in FIG. 1A.

[Step 1]

Figure 6A:
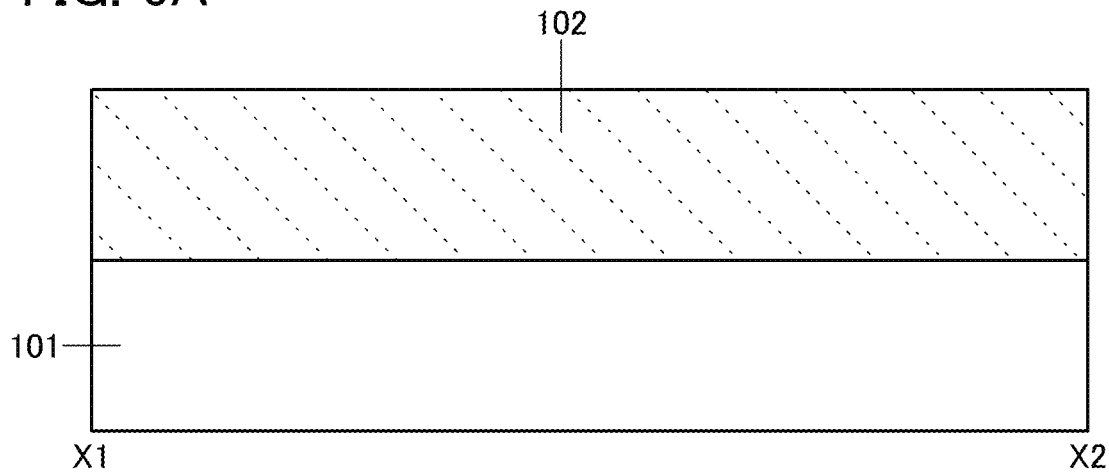
FIGS. 6A to 6C illustrate manufacturing steps of a transistor.

First, the insulating layer 102 is formed over the substrate 101 (see FIG. 6A). In this embodiment, aluminoborosilicate glass is used for the substrate 101. In this embodiment, a 2-μm-thick polyimide layer is formed as the insulating layer 102. Specifically, a liquid polyimide is applied onto the substrate 101 by a droplet discharge method and baking is performed at 400° C. in a nitrogen atmosphere for one hour. Note that the insulating layer 102 used in this embodiment has a Young's modulus of approximately larger than or equal to 3 GPa and smaller than or equal to 5 GPa after the baking.

[Step 2]

Figure 6B:
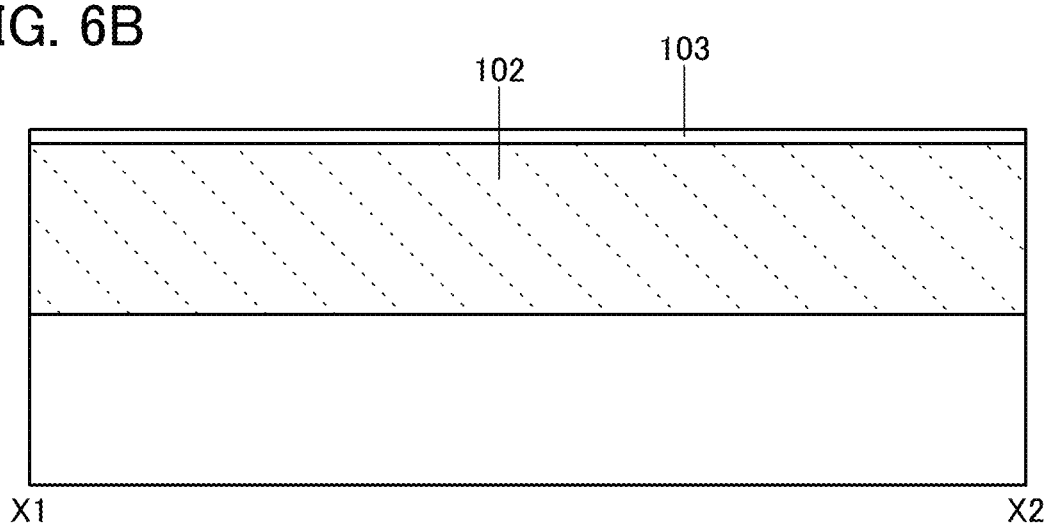

Next, the insulating layer 103 is formed (see FIG. 6B). In this embodiment, a 200-nm-thick silicon oxynitride layer is formed by a PECVD method as the insulating layer 103. For example, the formation can be performed under the conditions where a silane gas at a flow rate of 75 sccm and a dinitrogen monoxide gas at a flow rate of 1200 sccm are supplied as source gases to a reaction chamber of a PECVD apparatus, the pressure in the reaction chamber is controlled to 70 Pa, the substrate temperature is controlled to 330° C., and a power of 120 W is supplied using a 27.12 MHz high-frequency power source. Note that the insulating layer 103 used in this embodiment has a Young's modulus of approximately larger than or equal to 60 GPa and smaller than or equal to 80 GPa.

As described above, the insulating layer 103 may be formed using an insulating material through which impurities do not easily pass. Furthermore, the insulating layer 103 may be formed using an insulating material into which oxygen is less likely to diffuse. In the case where an aluminum oxide layer is used as the insulating layer 103, for example, the aluminum oxide layer may be formed by a DC sputtering method using an aluminum target or by an AC sputtering method using an aluminum oxide target.

[Step 3]

Figure 6C:
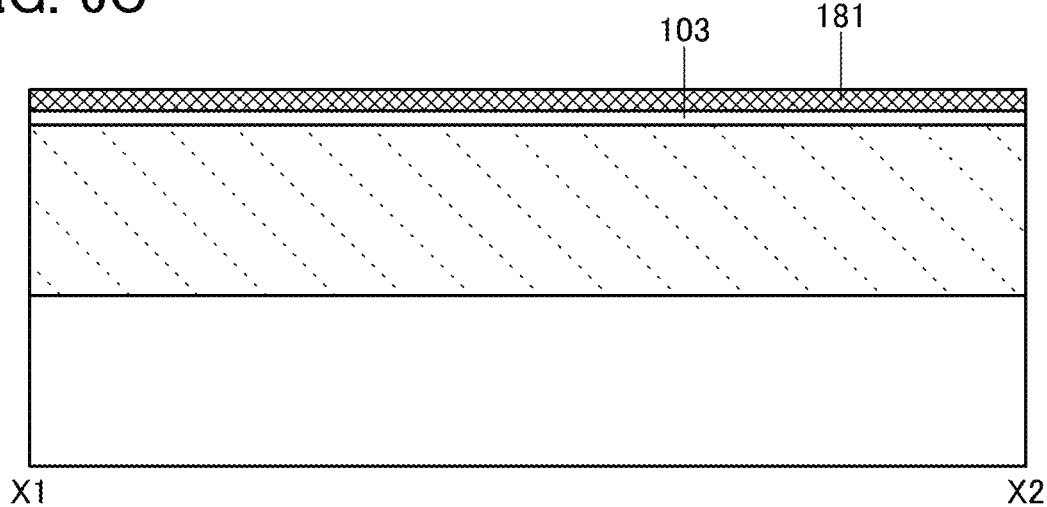

Next, a conductive layer 181 for forming the electrode 104 is formed (see FIG. 6C). In this embodiment, titanium is used for the conductive layer 181. Specifically, a 100-nm-thick titanium layer is formed by a sputtering method. Note that the conductive layer 181 used in this embodiment has a Young's modulus of approximately larger than or equal to 100 GPa and smaller than or equal to 120 GPa.

[Step 4]

Next, a resist mask is formed (not illustrated). The resist mask can be formed by a photolithography method, a printing method, an inkjet method, or the like as appropriate. Formation of the resist mask by a printing method, an inkjet method, or the like needs no photomask; thus, the manufacturing cost can be reduced.

The formation of the resist mask by a photolithography method can be performed in such a manner that a photosensitive resist is irradiated with light through a photomask and a portion of the resist that has been exposed to light (or has not been exposed to light) is removed using a developing solution. Examples of light with which the photosensitive resist is irradiated include KrF excimer laser light, ArF excimer laser light, and extreme ultraviolet (EUV) light. Alternatively, a liquid immersion technique may be employed in which light exposure is performed with a portion between a substrate and a projection lens filled with liquid (e.g., water). An electron beam or an ion beam may be used instead of the above-mentioned light. Note that a photomask is not necessary in the case of using an electron beam or an ion beam.

Figure 7A:
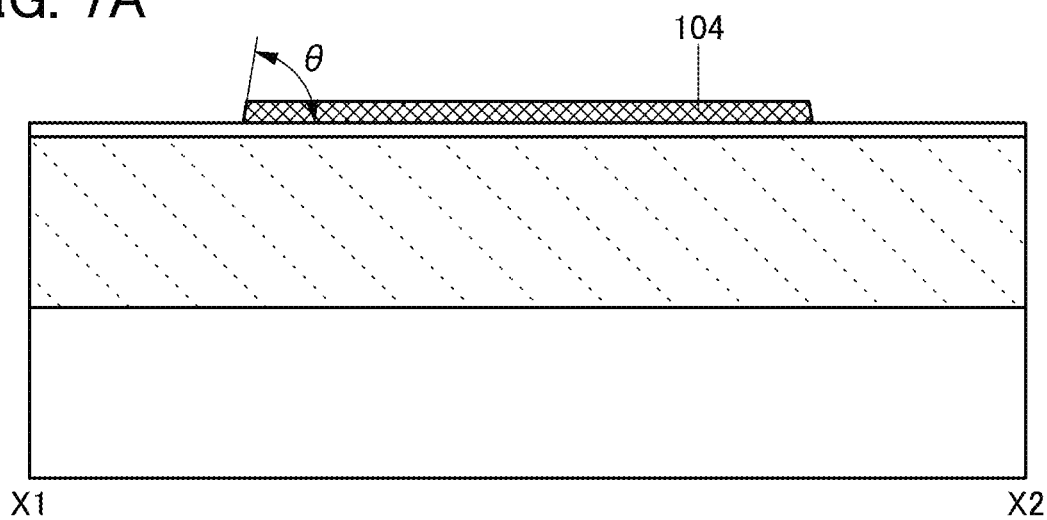
FIGS. 7A to 7C illustrate manufacturing steps of a transistor.

With the use of the resist mask as a mask, part of the conductive layer 181 is selectively removed to form the electrode 104 (see FIG. 7A). The insulating layer 181 can be removed by a dry etching method, a wet etching method, or the like. Both the dry etching method and the wet etching method may be used.

The resist mask is removed after the portion of the conductive layer 181 is removed. The resist mask can be removed by a dry etching method such as ashing or a wet etching method using a dedicated stripper or the like. Both the dry etching method and the wet etching method may be used.

A side surface of the electrode 104 is preferably tapered in cross section. A taper angle θ of the side surface of the electrode 104 is preferably 20° or more and less than 90°, further preferably 30° or more and less than 80°, still further preferably 40° or more and less than 70°. Note that the taper angle θ refers to an angle formed by a side surface and a bottom surface of a layer having a tapered shape when the layer is seen from the cross-sectional direction (i.e., the direction of the plane perpendicular to the substrate surface).

The tapered shape of the side surface of the electrode 104 can prevent disconnection of a layer formed over the electrode 104 and improve the coverage. Moreover, the tapered shape of the side surface of the electrode 104 can relieve electric field concentration at an upper edge portion of the electrode 104. Meanwhile, if the taper angle θ is too small, miniaturization of the transistor is sometimes difficult or variations in opening size, wiring width, or the like sometimes increase.

The side surface of the electrode 104 may have a step-like shape, in which case disconnection of a layer formed over the electrode 104 can be prevented and the coverage can be improved. As well as the side surface of the electrode 104, an edge portion of any layer can have a tapered shape or a step-like shape, in which case disconnection of a layer covering the layer (disconnection caused by a step) can be prevented, resulting in favorable coverage.

[Step 5]

Figure 7B:
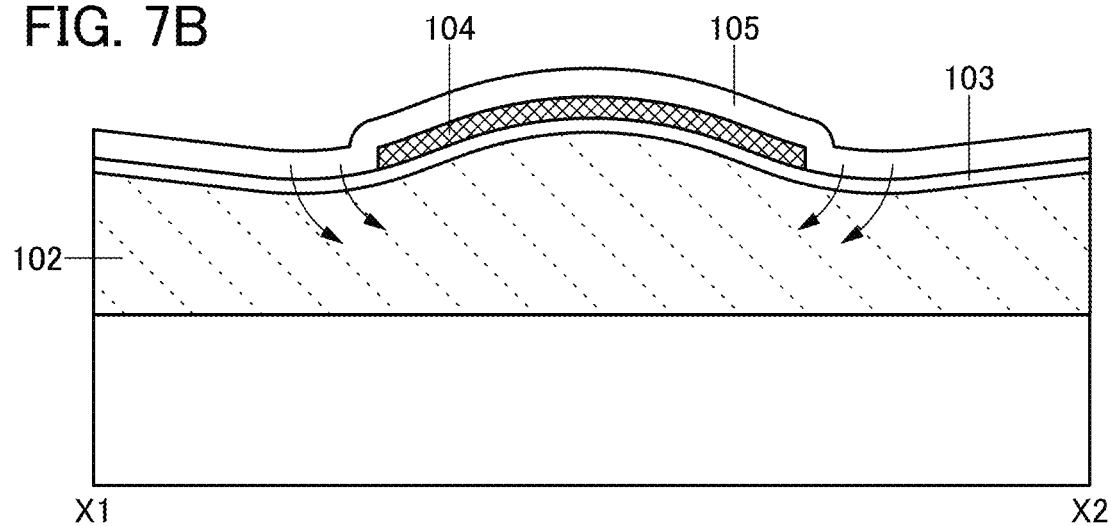

Then, the insulating layer 105 is formed by a PECVD method (see FIG. 7B). In this embodiment, the insulating layer 105 has a four-layer structure in which a first silicon nitride layer, a second silicon nitride layer, a third silicon nitride layer, and a silicon oxynitride layer are stacked in this order.

For example, the first silicon nitride layer can be formed to have a thickness of 50 nm under the conditions where a silane gas at a flow rate of 200 sccm, a nitrogen gas at a flow rate of 2000 sccm, and an ammonia gas at a flow rate of 100 sccm are supplied as source gases to a reaction chamber of a PECVD apparatus, the pressure in the reaction chamber is controlled to 100 Pa, the substrate temperature is controlled to 350° C., and a power of 2000 W is supplied using a 27.12 MHz high-frequency power source.

For example, the second silicon nitride layer can be formed to have a thickness of 300 nm under the conditions where a silane gas at a flow rate of 200 sccm, a nitrogen gas at a flow rate of 2000 sccm, and an ammonia gas at a flow rate of 2000 sccm are supplied as source gases to a reaction chamber of a PECVD apparatus, the pressure in the reaction chamber is controlled to 100 Pa, the substrate temperature is controlled to 350° C., and a power of 2000 W is supplied using a 27.12 MHz high-frequency power source.

For example, the third silicon nitride layer can be formed to have a thickness of 50 nm under the conditions where a silane gas at a flow rate of 200 sccm, a nitrogen gas at a flow rate of 2000 sccm, and an ammonia gas at a flow rate of 100 sccm are supplied as source gases to a reaction chamber of a PECVD apparatus, the pressure in the reaction chamber is controlled to 100 Pa, the substrate temperature is controlled to 350° C., and a power of 2000 W is supplied using a 27.12 MHz high-frequency power source.

For example, the silicon oxynitride layer can be formed to have a thickness of 50 nm under the conditions where a silane gas at a flow rate of 20 sccm and a dinitrogen monoxide gas at a flow rate of 3000 sccm are supplied as source gases to a reaction chamber of a PECVD apparatus, the pressure in the reaction chamber is controlled to 40 Pa, the substrate temperature is controlled to 350° C., and a power of 100 W is supplied using a 27.12 MHz high-frequency power source.

Note that the insulating layer 105 used in this embodiment has a compressive stress of approximately greater than or equal to 1000 MPa and less than or equal to 1200 MPa.

The insulating layer 102 has a smaller Young's modulus than the electrode 104 and the insulating layer 103 and thus more easily changes in shape than the electrode 104 and the insulating layer 103. A region of the insulating layer 102 near the periphery of the electrode 104 is pressed owing to the compressive stress of the insulating layer 105, so that a region of the insulating layer 102 overlapped by the electrode 104 changes into a convex shape. As a result, the insulating layer 102 has a projection. The projection is formed in a self-aligned manner in a position overlapped by the electrode 104.

As the insulating layer 105, an insulating layer containing excess oxygen may be used. The insulating layer 105 may be subjected to oxygen doping treatment. Moreover, heat treatment is preferably performed after formation of the insulating layer 105 to reduce hydrogen and moisture contained in the insulating layer 105. Oxygen doping treatment may be performed after the heat treatment. For example, the oxygen doping treatment is performed while the substrate is heated to 350° C. and a gas containing argon and oxygen is excited at a frequency of 2.45 GHz. The heat treatment and the oxygen doping treatment may be repeated a plurality of times.

For example, the heat treatment is performed in an inert gas atmosphere containing nitrogen, a rare gas, or the like, an oxidizing atmosphere, or an ultra-dry air atmosphere (in which the moisture amount measured with a dew point meter in a cavity ring down laser spectroscopy (CRDS) system is 20 ppm (corresponding to a dew point of −55° C.) or lower, preferably 1 ppm or lower, further preferably 10 ppb or lower). Note that the oxidizing atmosphere refers to an atmosphere containing an oxidizing gas such as oxygen, ozone, or nitrogen oxide at 10 ppm or higher. The inert atmosphere refers to an atmosphere that contains the oxidizing gas at lower than 10 ppm and is filled with nitrogen or a rare gas. Although there is no particular limitation on the pressure during the heat treatment, the heat treatment is preferably performed under a reduced pressure.

The heat treatment is performed at temperatures of 150° C. or higher and lower than the strain point of the substrate, preferably from 200° C. to 500° C., further preferably from 250° C. to 400° C. The treatment time is shorter than or equal to 24 hours. Heat treatment for over 24 hours is not preferable because the productivity is reduced.

The heat treatment can be performed using an electric furnace, an RTA apparatus, or the like. With the use of an RTA apparatus, the heat treatment can be performed at a temperature higher than or equal to the strain point of the substrate if the heating time is short. Thus, the heating time can be shortened. The heat treatment may be performed under an atmosphere of nitrogen, oxygen, ultra-dry air (air in which water content is 20 ppm or less, preferably 1 ppm or less, more preferably 10 ppb or less), or a rare gas (e.g., argon or helium). Note that the atmosphere of nitrogen, oxygen, ultra-dry air, or a rare gas preferably does not contain hydrogen, water, and the like.

[Step 6]

Figure 7C:
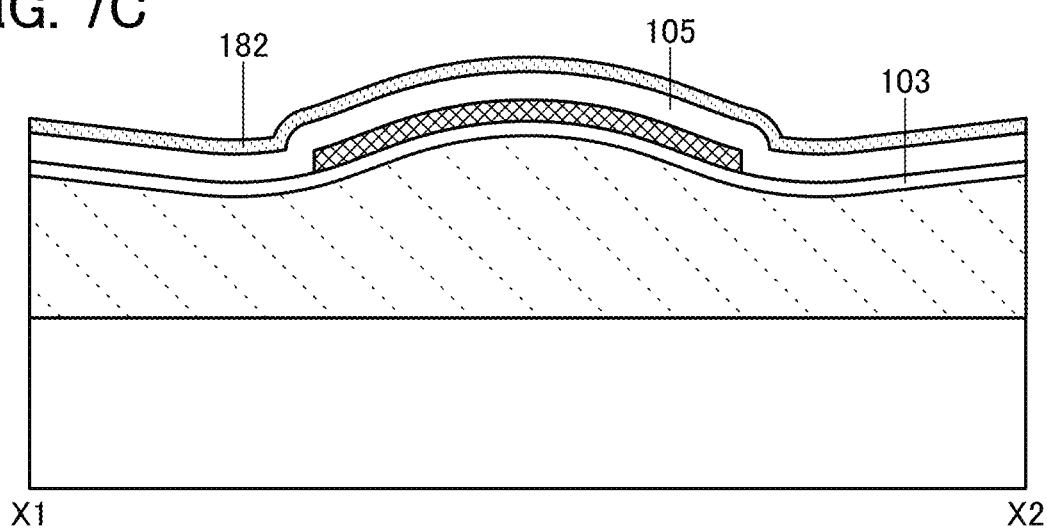

Next, a semiconductor layer 182 is formed (see FIG. 7C). Note that before the semiconductor layer 182 is formed, an oxygen gas may be supplied to generate plasma, in which case oxygen can be added to the insulating layer 105, which is a surface where the semiconductor layer 182 is formed.

For the semiconductor layer 182, it is preferable to use indium zinc oxide, indium gallium zinc oxide formed using a target with an atomic ratio In:Ga:Zn=5:1:7 or 4:2:4.1, or the like.

In this embodiment, for the semiconductor layer 182, indium gallium zinc oxide is deposited by a sputtering method using a target with an atomic ratio In:Ga:Zn=4:2:4.1. Oxygen or a mixed gas of oxygen and a rare gas is used as a sputtering gas. In this embodiment, a mixed gas of oxygen and argon in which the flow rate ratio of oxygen is 10% is used as the sputtering gas.

When the flow rate ratio of oxygen in the sputtering gas is higher than or equal to 0% and lower than or equal to 30%, preferably higher than or equal to 5% and lower than or equal to 20%, an oxygen-deficient oxide semiconductor layer is formed. A transistor including an oxygen-deficient oxide semiconductor layer can have relatively high field-effect mobility.

At the time of the formation of the semiconductor layer 182, part of oxygen contained in the sputtering gas is supplied to the insulating layer 105 in some cases. As the amount of oxygen contained in the sputtering gas increases, the amount of oxygen supplied to the insulating layer 105 increases. Part of oxygen supplied to the insulating layer 105 reacts with hydrogen left in the insulating layer 105 to produce water, and the water is released from the insulating layer 105 by heat treatment performed later. Thus, the hydrogen concentration in the insulating layer 105 can be reduced. Moreover, when the amount of excess oxygen in the insulating layer 105 is increased, oxygen can be supplied to the semiconductor layer 182 (that is to be the semiconductor layer 106) by heat treatment performed later.

When the semiconductor layer 106 is a stack of two layers or three layers as illustrated in FIGS. 4A and 4B, an oxide semiconductor layer for forming the semiconductor layer 106_1 is formed using the above-described material and method.

For an oxide semiconductor layer(s) for forming the semiconductor layer 106_2 and/or the semiconductor layer 106_3, it is preferable to use an oxide semiconductor layer with high crystallinity, for example, a CAAC-OS layer. For example, in a subsequent etching step for forming the insulating layer 107 and the electrode 108, an exposed portion of the oxide semiconductor layer is etched and the oxide semiconductor layer is damaged in some cases. An oxide semiconductor layer with high crystallinity is not likely to be etched in this etching step. Using an oxide semiconductor layer with high crystallinity as the semiconductor layer 106_2 and/or the semiconductor layer 106_3 reduces damage caused to the oxide semiconductor layer in the etching step; thus, the reliability of the transistor can be improved.

For the oxide semiconductor layer(s) for forming the semiconductor layer 106_2 and/or the semiconductor layer 106_3, indium gallium zinc oxide is deposited by a sputtering method using a target with an atomic ratio In:Ga:Zn=1:1:1.2, for example. Oxygen or a mixed gas of oxygen and a rare gas is used as a sputtering gas. For example, a sputtering gas with an oxygen proportion of 100% is used. The flow rate ratio of oxygen in the sputtering gas for forming the semiconductor layer 106_2 and/or the semiconductor layer 106_3 is preferably 70% or more, further preferably 80% or more, still further preferably 100%. By increasing the proportion (flow rate ratio) of oxygen in the sputtering gas, the crystallinity of the oxide semiconductor layer can be increased.

By introducing an impurity element after formation of the semiconductor layer 182, the threshold voltage of the transistor 100 can be changed. An impurity element can be introduced by an ion implantation method, an ion doping method, a plasma immersion ion implantation method, plasma treatment using a gas containing an impurity element, or the like.

After the semiconductor layer 182 is formed, heat treatment and/or oxygen doping treatment may be performed. Heat treatment and oxygen doping treatment may be repeated a plurality of times.

Furthermore, after heat treatment is performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor layer and oxygen can be supplied to the oxide semiconductor layer at the same time. Consequently, oxygen vacancies in the oxide semiconductor layer can be reduced.

[Step 7]

Then, a resist mask is formed by a photolithography method (not illustrated). With the use of the resist mask as a mask, part of the semiconductor layer 182 is selectively removed, so that the island-shaped semiconductor layer 106 is formed (see FIG. 8A).

The semiconductor layer 182 can be removed by a dry etching method, a wet etching method, or the like. Both the dry etching method and the wet etching method may be used. By introducing an impurity element after formation of the semiconductor layer 106, the threshold voltage of the transistor 100 can be changed.

After the semiconductor layer 106 is formed, heat treatment and/or oxygen doping treatment may be performed. Heat treatment and oxygen doping treatment may be repeated.

In the case where the semiconductor layer 106 is a stack of two layers or three layers as illustrated in FIGS. 5A and 5B, heat treatment and/or oxygen doping treatment may be performed after the semiconductor layer 106_1 is formed, after the semiconductor layer 106_1 and the semiconductor layer 106_2 are formed, or after the semiconductor layers 106_1 to 106_3 are formed. Heat treatment and oxygen doping treatment may be repeated.

[Step 8]

Figure 8A:
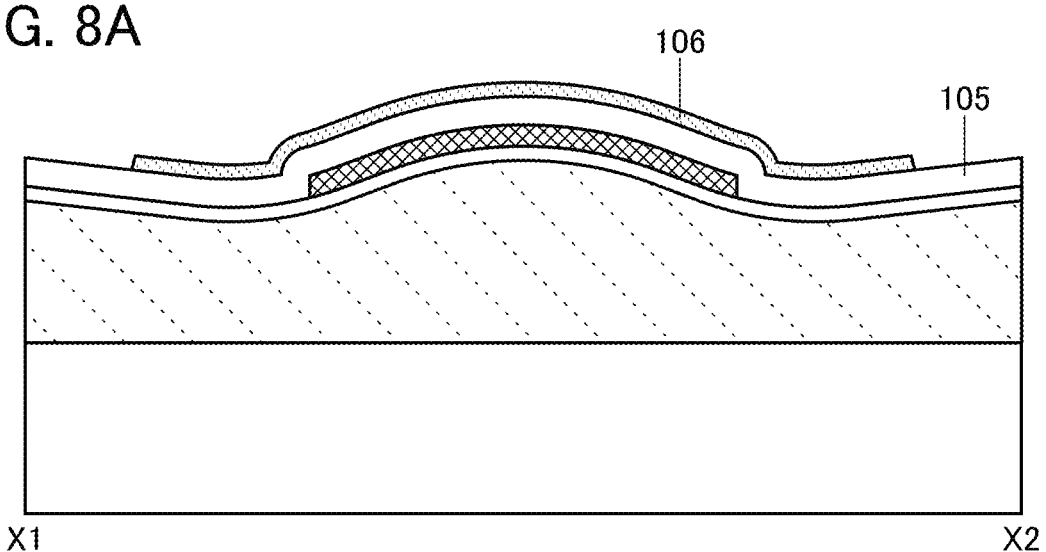
FIGS. 8A to 8C illustrate manufacturing steps of a transistor.
Figure 8B:
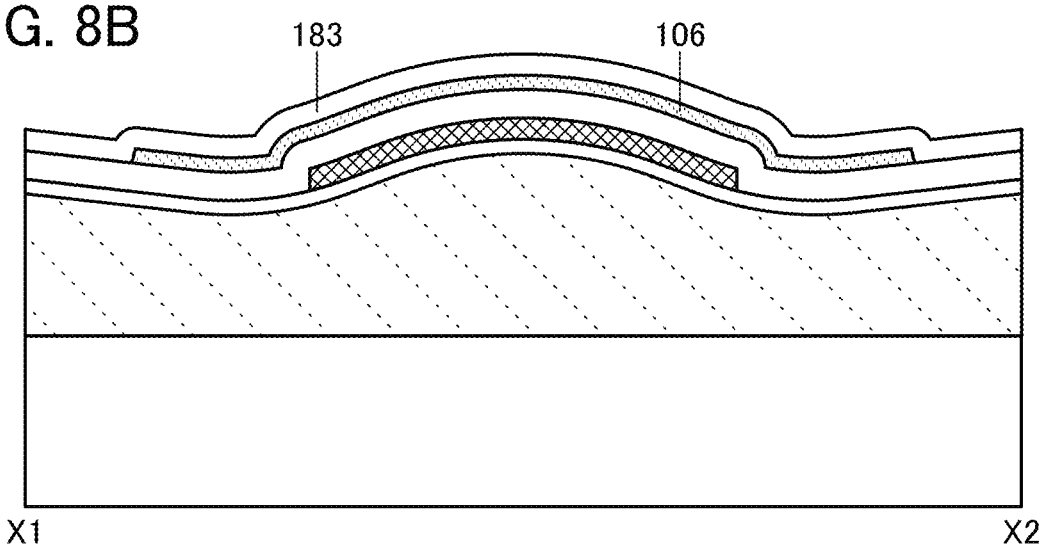

Then, an insulating layer 183 to be the insulating layer 107 is formed (see FIG. 8B). The insulating layer 183 can be a silicon oxynitride layer formed by a PECVD method, for example. In this case, a deposition gas containing silicon and an oxidizing gas are preferably used as source gases. Typical examples of a deposition gas containing silicon include a silane gas, a disilane gas, a trisilane gas, and a silane fluoride gas. Examples of an oxidizing gas include a dinitrogen monoxide gas and a nitrogen dioxide gas. The flow rate of the oxidizing gas is greater than or equal to 20 and less than or equal to 5000 times that of the deposition gas, preferably greater than or equal to 40 and less than or equal to 100 times that of the deposition gas.

In this embodiment, the insulating layer 183 has a three-layer structure in which a first silicon oxynitride layer, a second silicon oxynitride layer, and a third silicon oxynitride layer are stacked in this order.

For example, the first silicon oxynitride layer can be formed to have a thickness of 30 nm under the conditions where a silane gas at a flow rate of 20 sccm and a dinitrogen monoxide gas at a flow rate of 3000 sccm are supplied as source gases to a reaction chamber of a PECVD apparatus, the pressure in the reaction chamber is controlled to 200 Pa, the substrate temperature is controlled to 350° C., and a power of 100 W is supplied using a 27.12 MHz high-frequency power source.

For example, the second silicon oxynitride layer can be formed to have a thickness of 100 nm under the conditions where a silane gas at a flow rate of 160 sccm and a dinitrogen monoxide gas at a flow rate of 4000 sccm are supplied as source gases to a reaction chamber of a PECVD apparatus, the pressure in the reaction chamber is controlled to 200 Pa, the substrate temperature is controlled to 220° C., and a power of 1500 W is supplied using a 27.12 MHz high-frequency power source.

The second silicon oxynitride layer is preferably an insulating layer containing excess oxygen. Further, it is preferable that the amount of defects in the second silicon oxynitride layer be small. Typically, the spin density of a signal which appears at g=2.001 originating from a dangling bond of silicon is preferably lower than $1.5 \times 10^{18}$ spins/cm$^3$, further preferably lower than or equal to $1 \times 10^{18}$ spins/cm$^3$ by ESR measurement. Note that the second silicon oxynitride layer is more distant from the semiconductor layer 106 than the first silicon oxynitride layer and thus may have a higher defect density than the first silicon oxynitride layer.

As the second silicon oxynitride layer, a silicon oxynitride layer may be formed under the conditions where the substrate is held at a temperature ranging from 180° C. to 400° C., the pressure in the reaction chamber into which source gases are introduced ranges from 100 Pa to 250 Pa, preferably from 100 Pa to 200 Pa, and a high-frequency power of 0.17 W/cm$^2$ to 0.5 W/cm$^2$, preferably 0.25 W/cm$^2$ to 0.35 W/cm$^2$ is supplied to an electrode provided in the reaction chamber.

In formation of the second silicon oxynitride layer, when the high-frequency power with the above power density is supplied in the reaction chamber at the above pressure, decomposition efficiency of the source gases is increased in plasma. That is, oxygen radicals increase in the reaction chamber, and oxidation of the source gases proceeds. Thus, the oxygen content of the second silicon oxynitride layer can be higher than that in the stoichiometric composition.

In the insulating layer formed at a substrate temperature within the above range, the bond between silicon and oxygen is weak, and accordingly, part of oxygen in the insulating layer is released by heat treatment in a later step. Thus, part of the released oxygen is supplied to the semiconductor layer 106.

Note that in the formation conditions for the second silicon oxynitride layer, the flow rate of the deposition gas containing silicon relative to the oxidizing gas can be increased, whereby the amount of defects in the second silicon oxynitride layer can be reduced. Typically, it is possible to form an oxide insulating layer in which the amount of defects is small, i.e., the spin density of a signal that appears at g=2.001 originating from a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor can be improved.

Note that in the step of forming the second silicon oxynitride layer, the first silicon oxynitride layer functions as a protective layer for the semiconductor layer 106. Therefore, the second silicon oxynitride layer can be formed using the high-frequency power having a high power density while damage to the semiconductor layer 106 is reduced.

For example, the third silicon oxynitride layer can be formed to have a thickness of 20 nm under the conditions where a silane gas at a flow rate of 20 sccm and a dinitrogen monoxide gas at a flow rate of 3000 sccm are supplied as source gases to a reaction chamber of a PECVD apparatus, the pressure in the reaction chamber is controlled to 200 Pa, the substrate temperature is controlled to 350° C., and a power of 100 W is supplied using a 27.12 MHz high-frequency power source.

In the next step in which a conductive layer 184 is formed, the third silicon oxynitride layer functions as a protective layer for the second silicon oxynitride layer.

Heat treatment may be performed after Step 8. For example, heat treatment may be performed at 350° C. in a nitrogen atmosphere for one hour. Oxygen doping treatment may be performed after Step 8. The heat treatment and the oxygen doping treatment may be repeated alternately a plurality of times.

[Step 9]

Figure 8C:
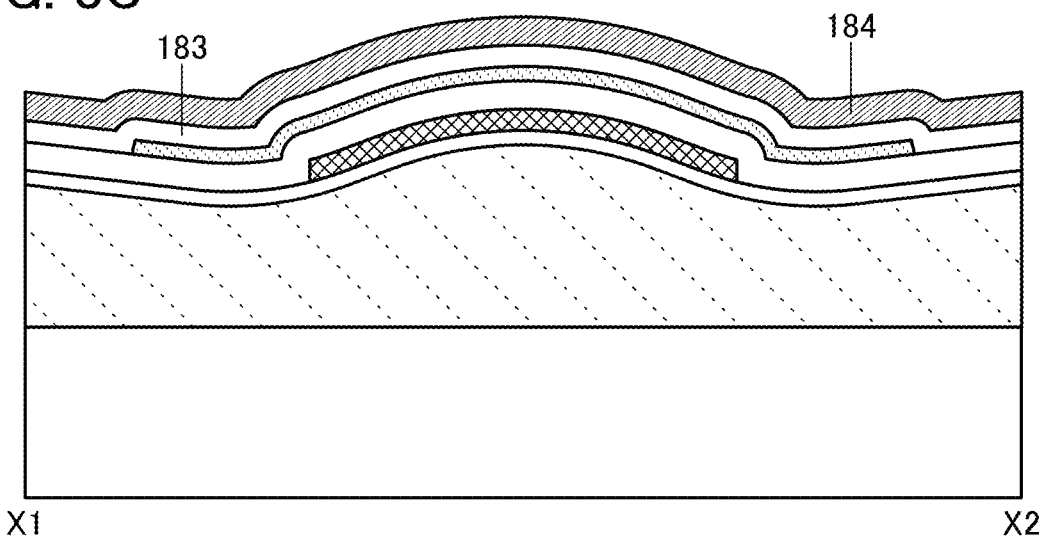

Next, the conductive layer 184 for forming the electrode 108 is formed (see FIG. 8C). In this embodiment, indium gallium zinc oxide layers are used as the conductive layer 184. Specifically, a two-layer stack formed using indium gallium zinc oxide is used as the conductive layer 184.

First, a 10-nm-thick indium gallium zinc oxide layer is formed using a target with an atomic ratio In:Ga:Zn=4:2:4.1 and a sputtering gas with an oxygen proportion of 100%. Next, a 90-nm-thick indium gallium zinc oxide layer is formed using a target with an atomic ratio In:Ga:Zn=4:2:4.1 and a sputtering gas with an oxygen proportion of 10% and an argon proportion of 90%.

[Step 10]

Next, a resist mask is formed by a photolithography method (not illustrated). With the use of the resist mask as a mask, part of the conductive layer 184 is selectively removed, so that the electrode 108 is formed. At this time, with the use of the electrode 108 as a mask, part of the insulating layer 183 is also selectively removed to form the insulating layer 107 (see FIG. 9A). By Step 10, part of the semiconductor layer 106 is exposed. A channel is formed in a region of the semiconductor layer 106 which is overlapped by the electrode 108.

The conductive layer 184 and the insulating layer 183 can be removed by a dry etching method, a wet etching method, or the like. Both the dry etching method and the wet etching method may be used.

[Step 11]

Then, impurities are introduced into the regions of the semiconductor layer 106 which are exposed in Step 8. The impurities may be introduced by an ion implantation method, an ion doping method, a plasma immersion ion implantation method, or the like. Introducing impurities such as nitrogen into the regions can lower the resistance of the regions.

Moreover, the regions may be exposed to a plasma atmosphere of nitrogen or an inert gas. Exposing the regions to a plasma atmosphere causes a defect in the regions and thus can lower the resistance of the regions.

In the semiconductor layer 106, the regions into which the impurities are introduced or the regions exposed to a plasma atmosphere can function as a source region and a drain region of the transistor. Moreover, in the semiconductor layer 106, a region overlapped by the electrode 108 can function as a channel formation region. In other words, the source region and the drain region of the transistor can be formed in a self-aligned manner.

In this embodiment, the plasma treatment is performed in an atmosphere containing argon and nitrogen.

[Step 12]

Figure 9A:
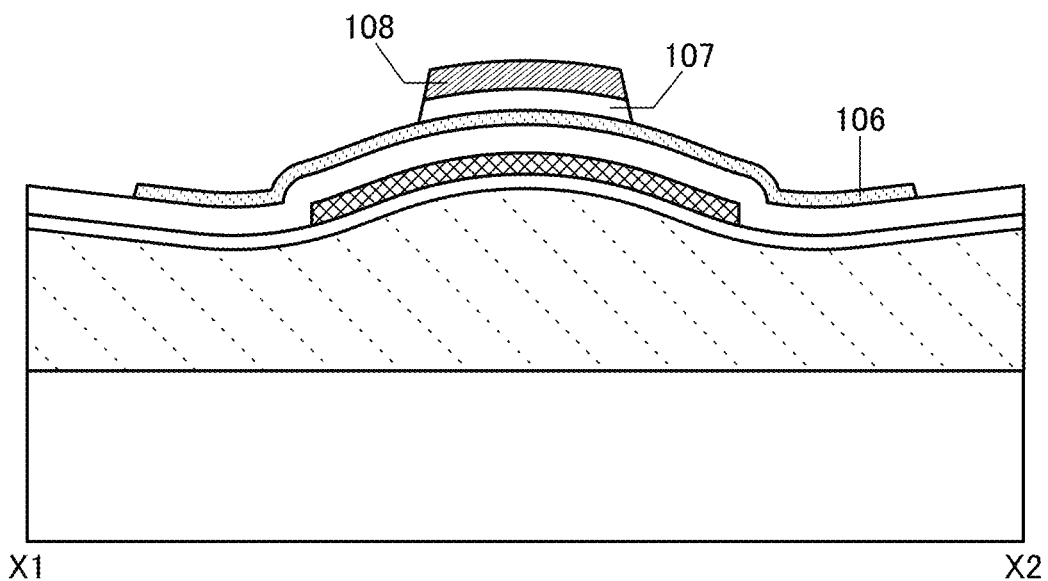
FIGS. 9A and 9B illustrate manufacturing steps of a transistor.
Figure 9B:
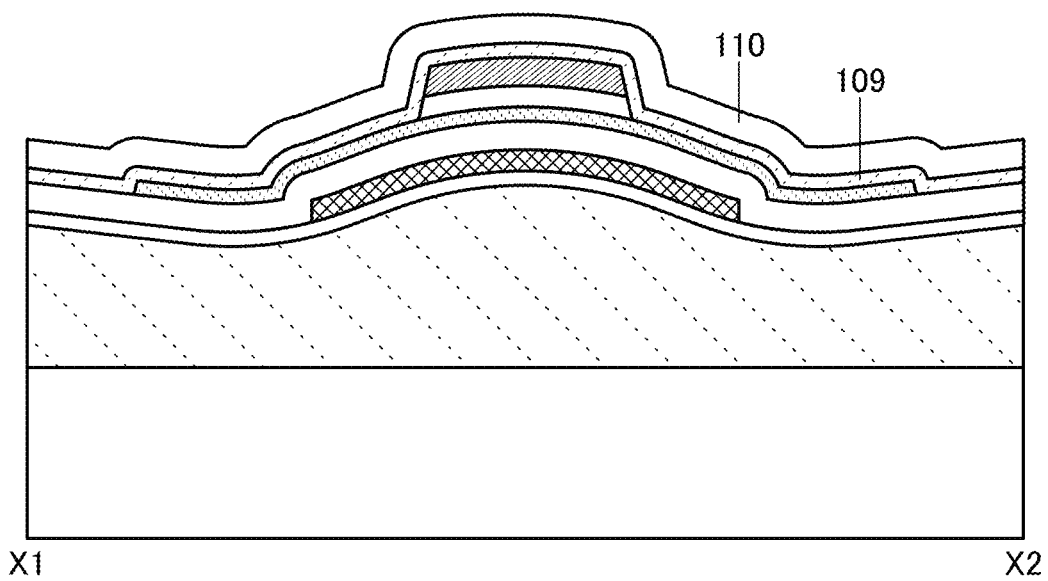

Then, the insulating layer 109 is formed (see FIG. 9B). In this embodiment, a 100-nm-thick silicon nitride layer is used as the insulating layer 109.

The silicon nitride layer used as the insulating layer 109 is formed by a PECVD method or the like. For example, the silicon nitride layer can be formed under the conditions where a silane gas at a flow rate of 50 sccm, a nitrogen gas at a flow rate of 5000 sccm, and an ammonia gas at a flow rate of 100 sccm are supplied as source gases to a reaction chamber of a PECVD apparatus, the pressure in the reaction chamber is controlled to 100 Pa, the substrate temperature is controlled to 220° C., and a power of 1000 W is supplied using a 27.12 MHz high-frequency power source.

The silicon nitride layer is an insulating material through which impurities do not easily pass and thus can prevent diffusion of impurities from above to the semiconductor layer 106. The regions of the semiconductor layer 106 that are in contact with the silicon nitride layer are supplied with an impurity such as hydrogen or nitrogen at the time of the formation of the silicon nitride layer to have reduced resistance. Thus, the regions that can serve as source and drain regions and that are described in Step 11 can have further reduced resistance.

[Step 13]

Next, the insulating layer 110 is formed (see FIG. 9B). In this embodiment, as the insulating layer 110, a silicon oxynitride layer having a thickness of 300 nm is formed by a PECVD method.

For example, the silicon oxynitride layer used as the insulating layer 110 can be formed under the conditions where a silane gas at a flow rate of 160 sccm and a dinitrogen monoxide gas at a flow rate of 4000 sccm are supplied as source gases to a reaction chamber of a PECVD apparatus, the pressure in the reaction chamber is controlled to 200 Pa, the substrate temperature is controlled to 220° C., and a power of 1500 W is supplied using a 27.12 MHz high-frequency power source.

[Step 14]

Next, a resist mask is formed by a photolithography method (not illustrated). With the use of the resist mask as a mask, portions of the insulating layers 110 and 109 are selectively removed to form the openings 111a and 111b (see FIG. 10A). At this time, part of the semiconductor layer 106 is exposed.

The insulating layer 110 and the insulating layer 109 can be removed by a dry etching method, a wet etching method, or the like. Both the dry etching method and the wet etching method may be used.

[Step 15]

Figure 10A:
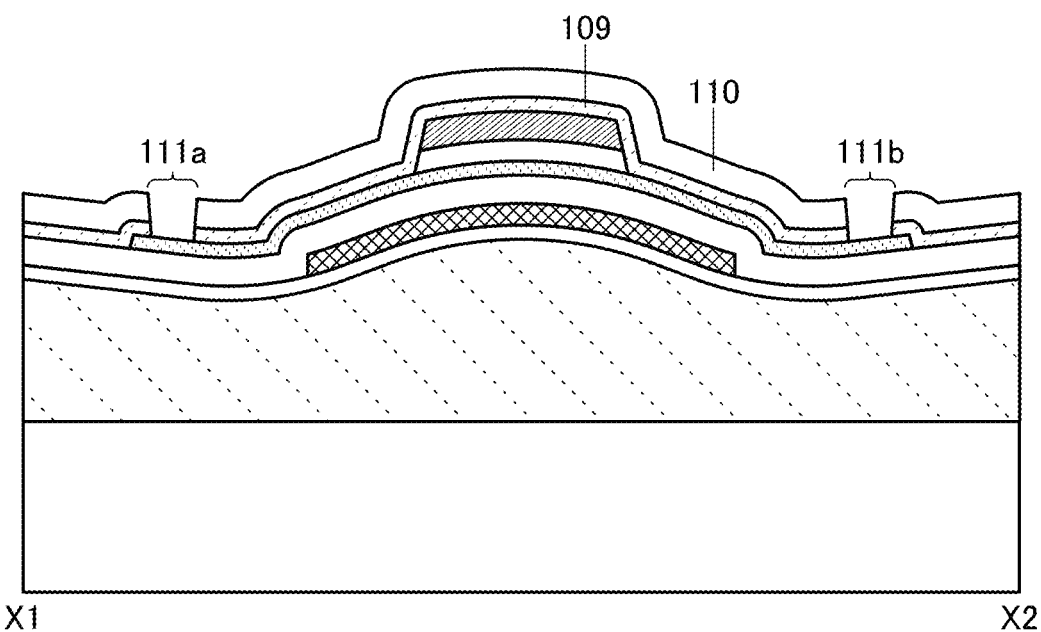
FIGS. 10A and 10B illustrate manufacturing steps of a transistor.
Figure 10B:
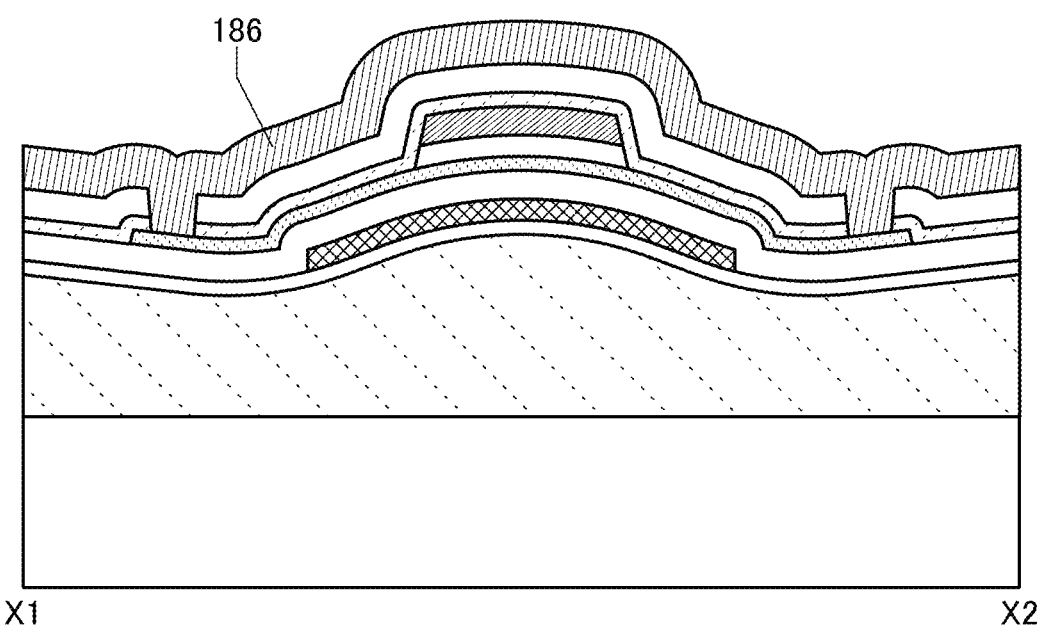

Next, a conductive layer 186 for forming the electrodes 112a and 112b is formed (see FIG. 10B). In this embodiment, a stack including titanium and copper is used for the conductive layer 186. Specifically, a 10-nm-thick titanium layer and a 100-nm-thick copper layer are formed in this order by a sputtering method.

[Step 16]

Next, a resist mask is formed by a photolithography method (not illustrated). With the use of the resist mask as a mask, part of the conductive layer 186 is selectively removed to form the electrode 112a and the electrode 112b (see FIG. 11A). One of the electrode 112a and the electrode 112b can function as a source electrode, and the other can function as a drain electrode.

The conductive layer 186 can be removed by a dry etching method, a wet etching method, or the like. Both the dry etching method and the wet etching method may be used.
[Step 17]

Figure 11A:
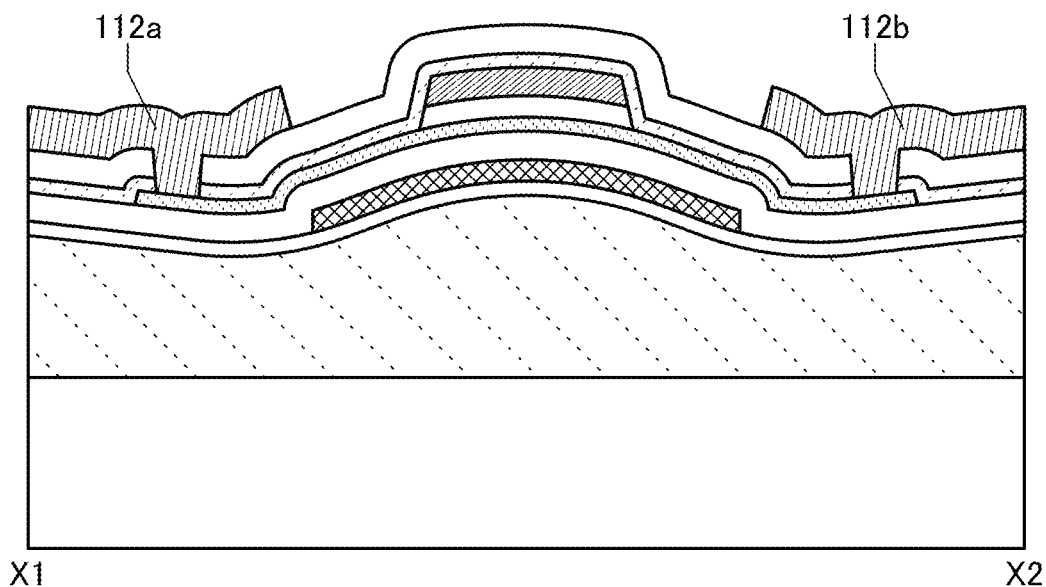
FIGS. 11A and 11B illustrate manufacturing steps of a transistor.
Figure 11B:
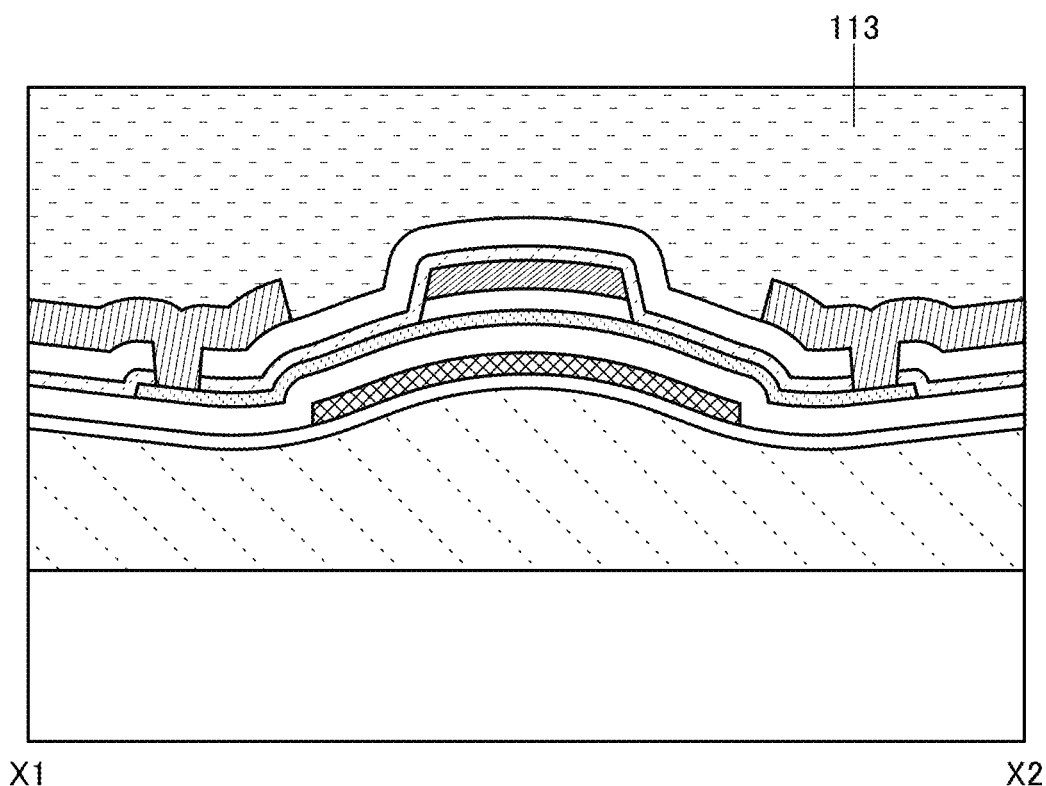

Then, the insulating layer 113 having a flat surface is formed (see FIG. 11B). In this embodiment, a 1.5-μm-thick acrylic resin layer is formed as the insulating layer 113. Note that the insulating layer 113 is not necessarily provided depending on the purpose or the intended use.

Through the above steps, the transistor 100 can be manufactured. In one embodiment of the present invention, the maximum process temperature in formation of the transistor 100 can be lower than or equal to 400° C. Thus, the transistor 100 can be manufactured with improved productivity. In addition, a semiconductor device including the transistor 100 can be manufactured with improved productivity.

This embodiment can be implemented in appropriate combination with any of the structures described in the other embodiments and the like.

Embodiment 2

In this embodiment, a modification example of the transistor 100 described in Embodiment 1 will be described with reference to drawings. Note that differences from the transistor 100 are mainly described to avoid repeated description. Embodiment 1 can be referred to for the portions that are not described in this embodiment.

Modification Example 1

Figure 12A:
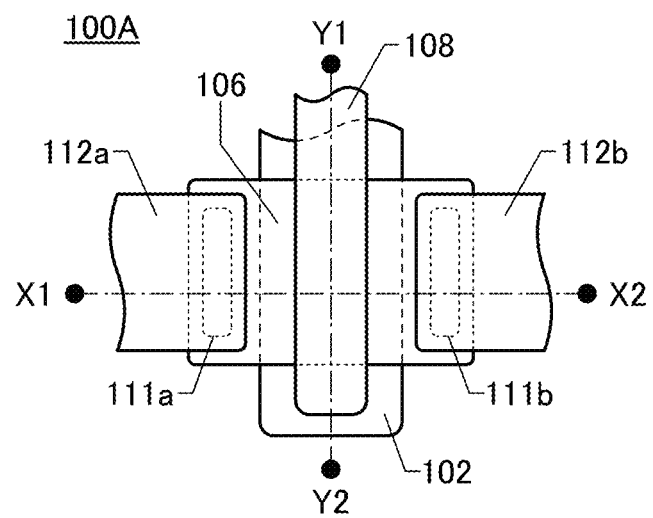
FIGS. 12A and 12B illustrate a transistor.
Figure 12B:
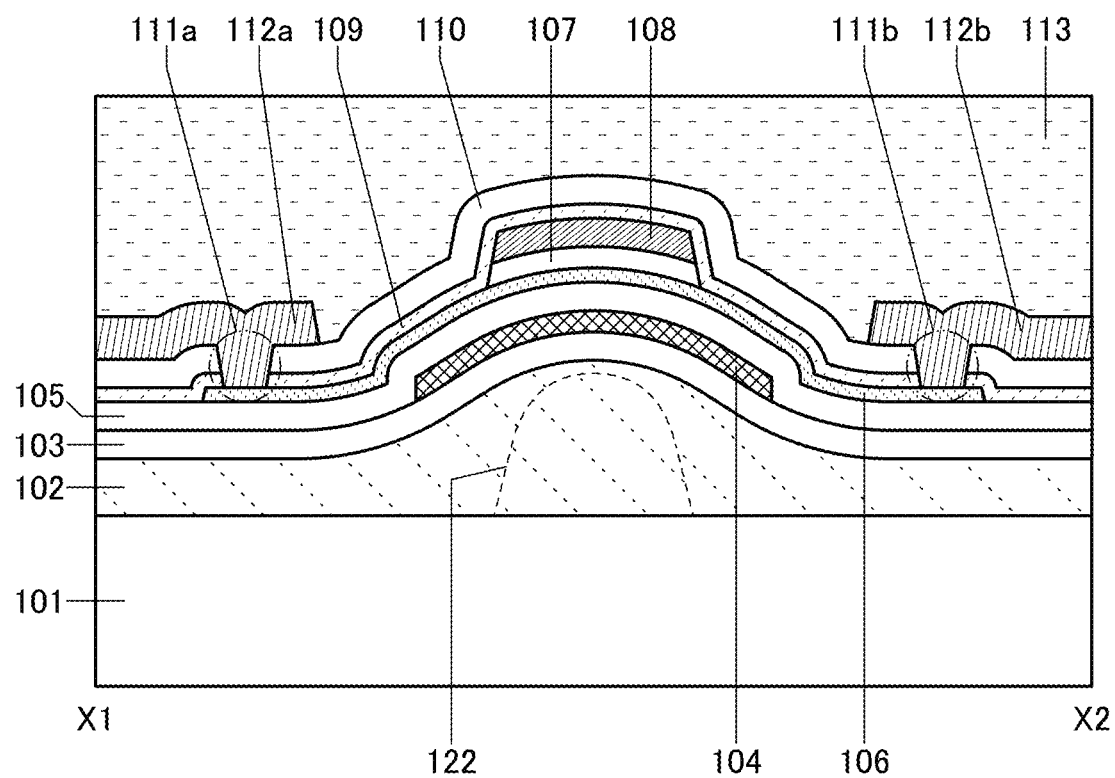
Figure 13:
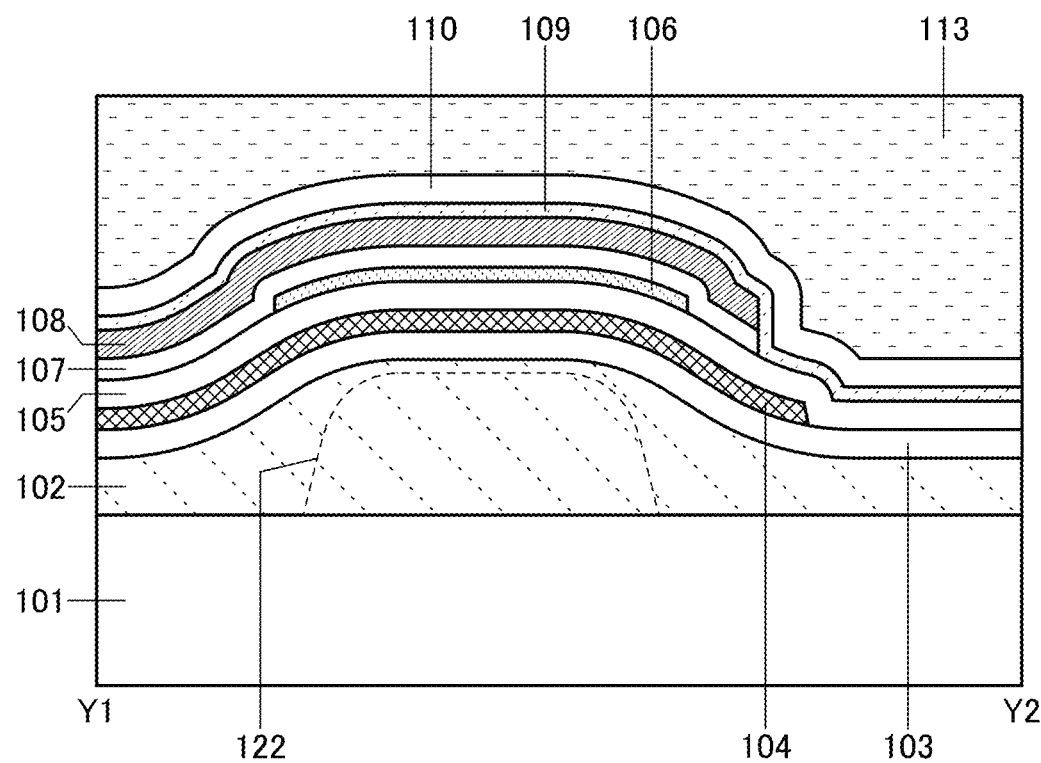
FIG. 13 illustrates a transistor.

FIG. 12A is a plan view of a transistor 100A. FIG. 12B is a cross-sectional view (in the channel length direction) of the portion indicated by dashed-dotted line X1-X2 in FIG. 12A. FIG. 13 is a cross-sectional view (in the channel width direction) of the portion indicated by dashed-dotted line Y1-Y2 in FIG. 12A.

The transistor 100A, having almost the same structure as the transistor 100, is different from the transistor 100 in including a structure body 122 between the insulating layer 102 and the substrate 101. In the transistor 100A, the semiconductor layer 106, the electrode 104, and the electrode 108 each have a region overlapping the structure body 122.

The insulating layer 102 covers the structure body 122, thereby having a projection. The height or shape of the projection can be arbitrarily set by changing the size of the structure body 122. The structure body 122 can be formed using any of the above-described insulating materials. Depending on the purpose or the intended use, the structure body 122 may be formed using a conductive material, a semiconductor material, or the like.

Providing the insulating layer 102 with the projection by the use of the structure body 122 makes the range of materials used for the transistor wider than that in the case of employing the method described in the above embodiment, which utilizes the difference in mechanical strength between the layers. Thus, the thickness, the Young's modulus, the stress, and the like of the insulating layer 102, the insulating layer 103, the electrode 104, and the insulating layer 105 can be set relatively freely.

Next, an example of a manufacturing method of the transistor 100A will be described.
[Step 1a]

Figure 14A:
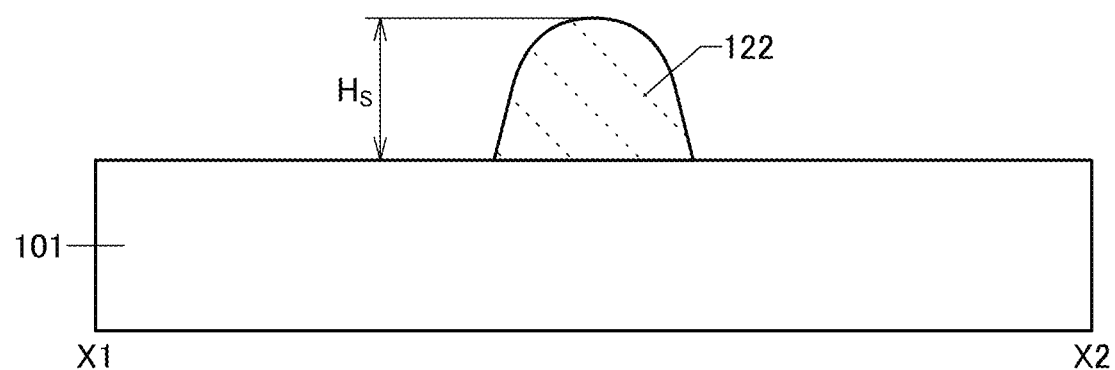
FIGS. 14A and 14B illustrate manufacturing steps of a transistor.

Step 1a is performed instead of Step 1 described in Embodiment 1. In this embodiment, a photosensitive polyimide layer is formed over the substrate 101 and photolithography is employed to form the structure body 122 (see FIG. 14A). The use of the photosensitive polyimide layer makes it possible to form the structure body 122 without a resist mask. The height $H_S$ of the structure body 122 can be adjusted by changing the thickness of the photosensitive polyimide layer. In this embodiment, the structure body 122 whose height $H_S$ is 2.0 μm is formed.

Note that the structure body 122 may be formed using a non-photosensitive material. In that case, the structure body 122 is formed by a typical patterning method that uses a resist mask or the like, for example.
[Step 2a]

Figure 14B:
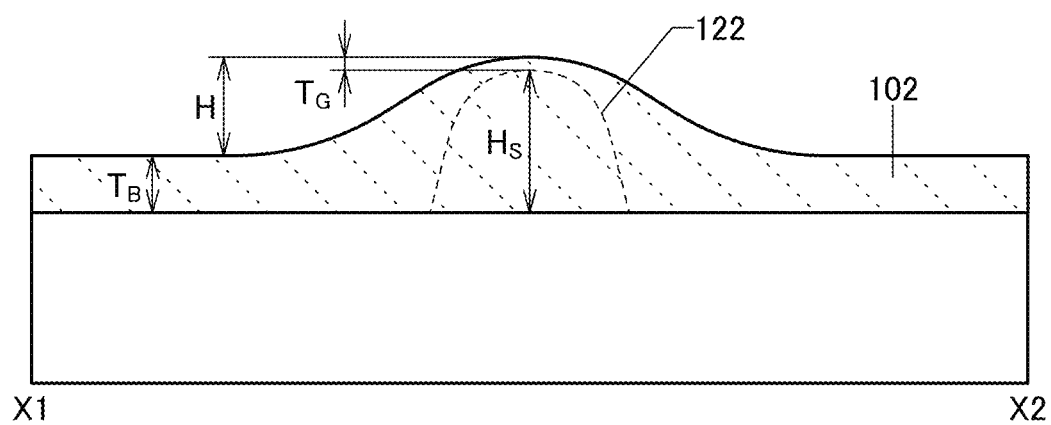

Next, the insulating layer 102 is formed (see FIG. 14B). In this embodiment, a polyimide layer whose thinnest portion not overlapping the structure body 122 has a thickness TB of 1.0 μm is formed as the insulating layer 102. Specifically, a liquid polyimide is applied onto the substrate 101 and the structure body 122 by a droplet discharge method and baking is performed at 400° C. in a nitrogen atmosphere for one hour.

In the case where the insulating layer 102 is formed using a liquid material, the thickness $T_G$ of the portion of the insulating layer 102 that overlaps the top of the structure body 122 and the thickness $T_B$ depend on the viscosity and the applied amount of the material. The height H of the projection is obtained by subtracting the thickness $T_B$ from the sum of the height $H_S$ and the thickness $T_G$.

The structure body 122 and the insulating layer 102 are preferably formed using materials having the same components.

The steps including and after Step 1b can be performed in a manner similar to that of the steps including and after Step 2 described in Embodiment 1.

Modification Example 2

Figure 15A:
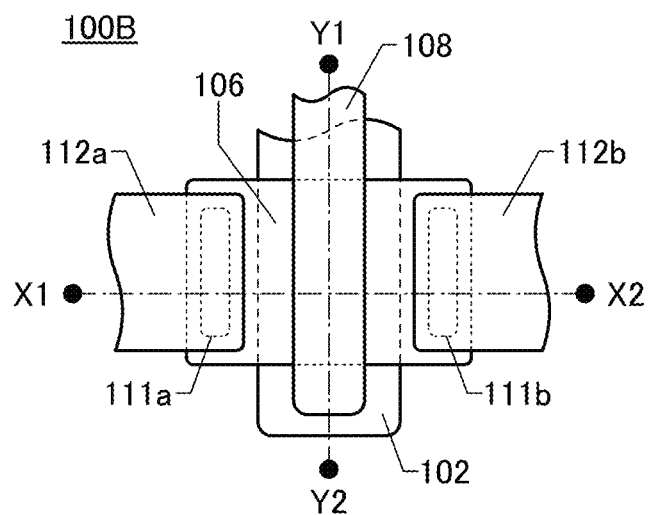
FIGS. 15A and 15B illustrate a transistor.
Figure 15B:
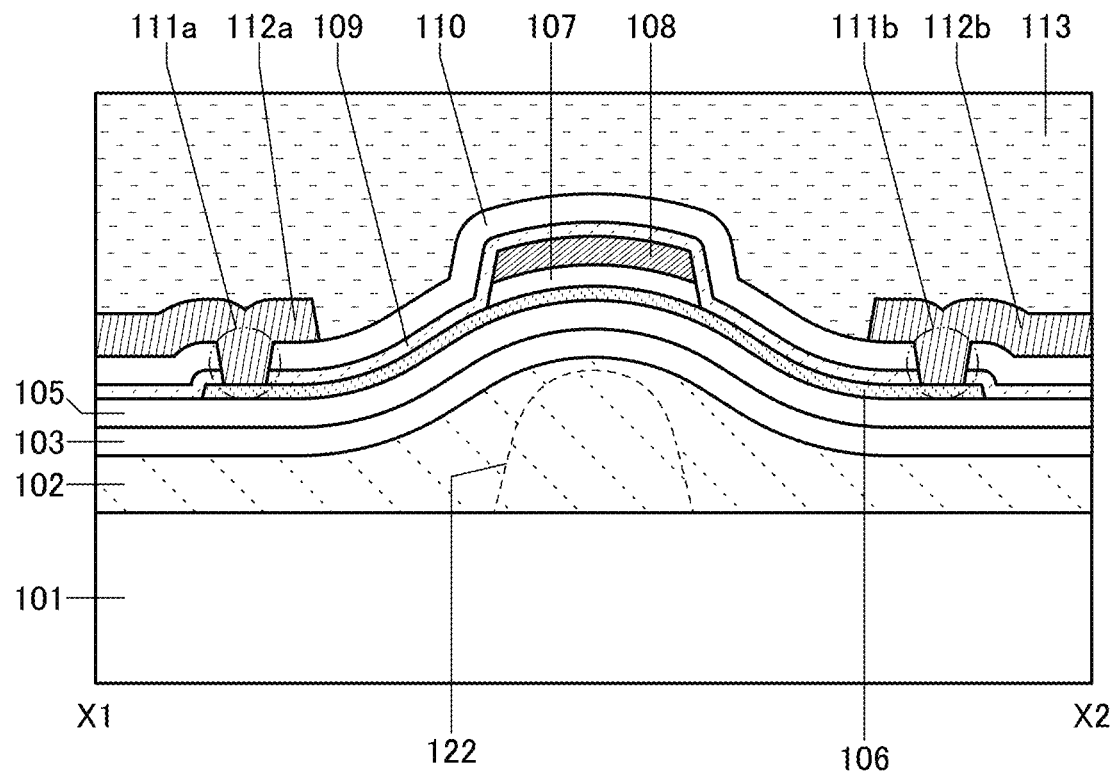
Figure 16:
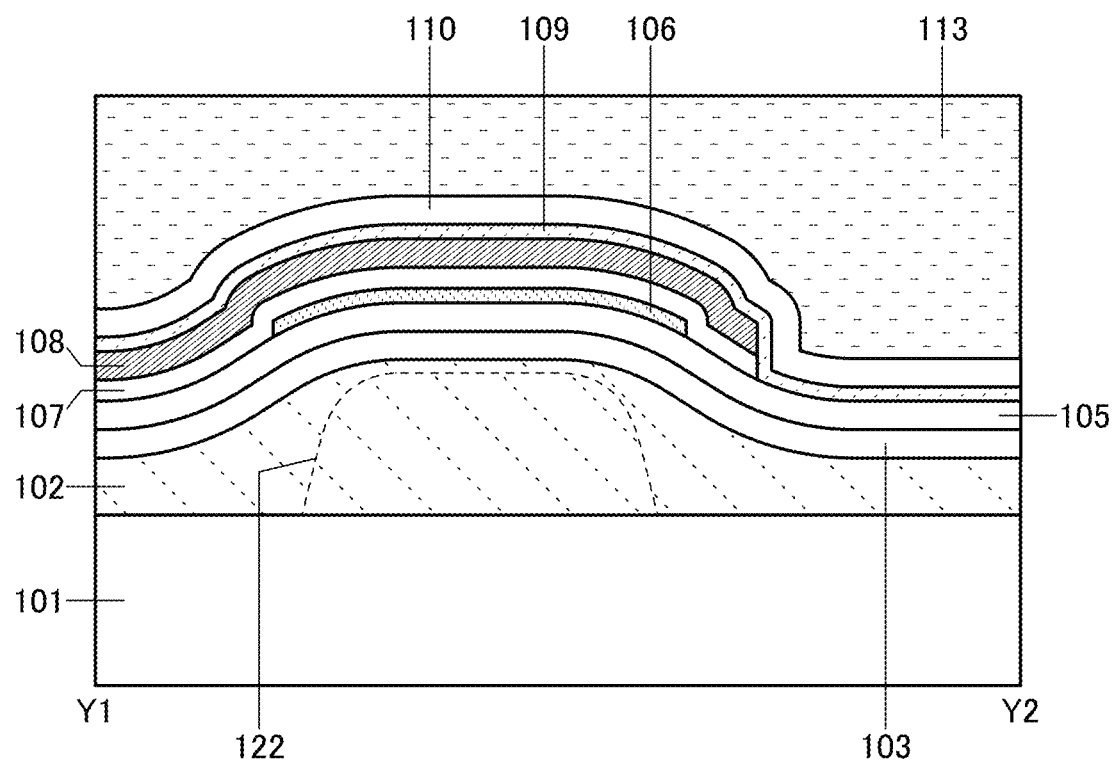
FIG. 16 illustrates a transistor.

FIG. 15A is a plan view of a transistor 100B. FIG. 15B is a cross-sectional view (in the channel length direction) of the portion indicated by dashed-dotted line X1-X2 in FIG. 15A. FIG. 16 is a cross-sectional view (in the channel width direction) of the portion indicated by dashed-dotted line Y1-Y2 in FIG. 15A.

The transistor 100B has the structure of the transistor 100A without the electrode 104. The electrode 104 is not necessarily provided, as determined by required performance, purpose, or the like of the transistor. When the electrode 104 is not provided, the number of steps for manufacturing the transistor is reduced; thus, the manufacturing cost can be reduced. Moreover, the manufacturing yield of the transistor can be increased.

Modification Example 3

Figure 17A:
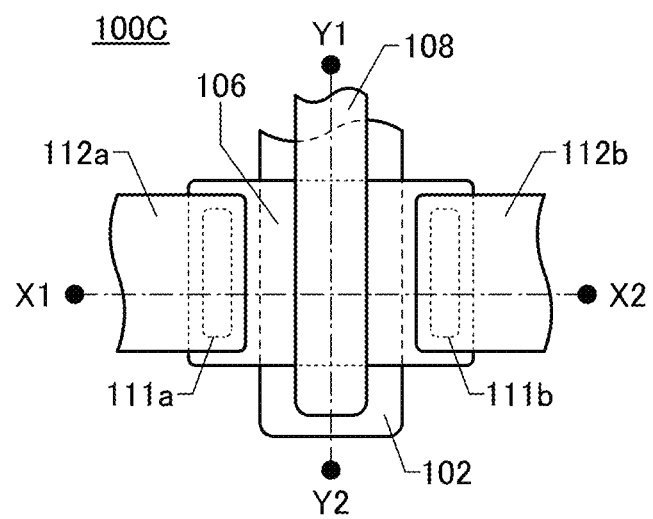
FIGS. 17A and 17B illustrate a transistor.
Figure 17B:
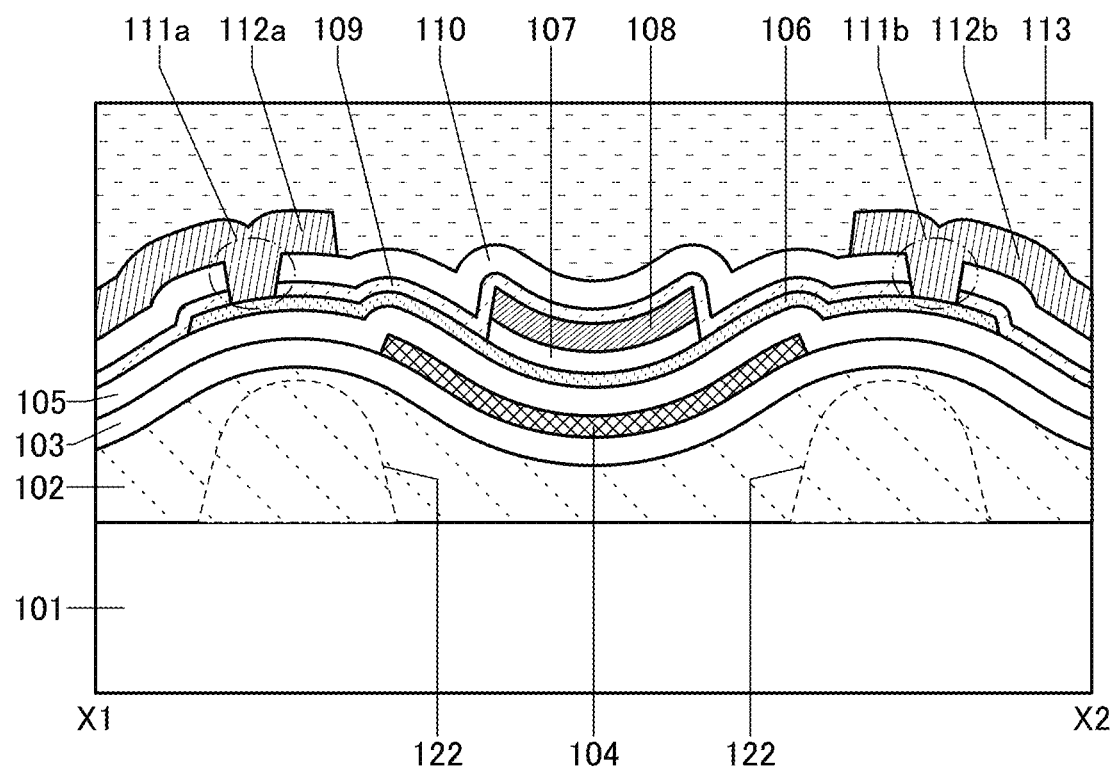
Figure 18:
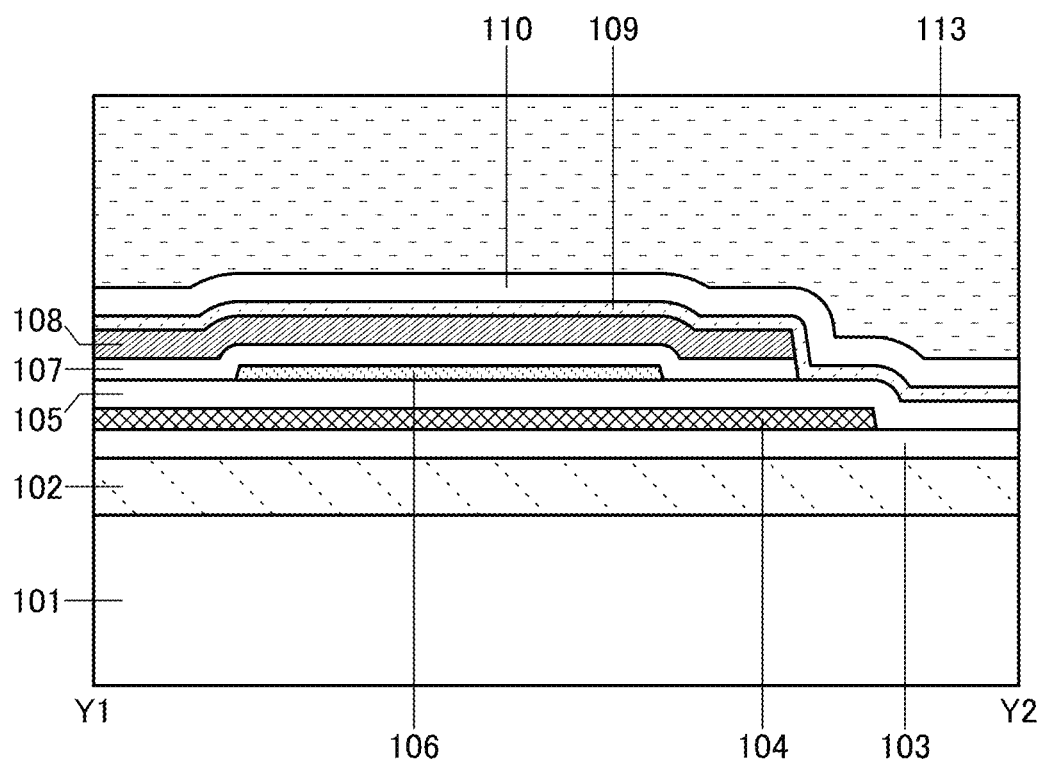
FIG. 18 illustrates a transistor.

FIG. 17A is a plan view of a transistor 100C. FIG. 17B is a cross-sectional view (in the channel length direction) of the portion indicated by dashed-dotted line X1-X2 in FIG. 17A. FIG. 18 is a cross-sectional view (in the channel width direction) of the portion indicated by dashed-dotted line Y1-Y2 in FIG. 17A.

Providing a plurality of structure bodies 122 forms a depression in the insulating layer 102. The transistor 100C has a structure similar to that of the transistor 100A. The transistor 100C is different from the transistor 100A in that the semiconductor layer 106, the electrode 104, and the electrode 108 each have a region overlapping the depression of the insulating layer 102. The transistor 100C has a region where the channel formation region overlaps the depression of the insulating layer 102. The transistor 100C also has a region where the channel formation region does not overlap the projection of the insulating layer 102.

This embodiment can be implemented in appropriate combination with any of the structures described in the other embodiments and the like.

Embodiment 3

A transistor 150, which has a structure different from the structures of the transistors 100, 100A, 100B, and 100C in the above embodiments, will be described with reference to drawings. Note that differences from the transistor 100 are mainly described to avoid repeated description. The above embodiments can be referred to for the portions that are not described in this embodiment.

<Structure Example of Transistor 150>

Figure 19A:
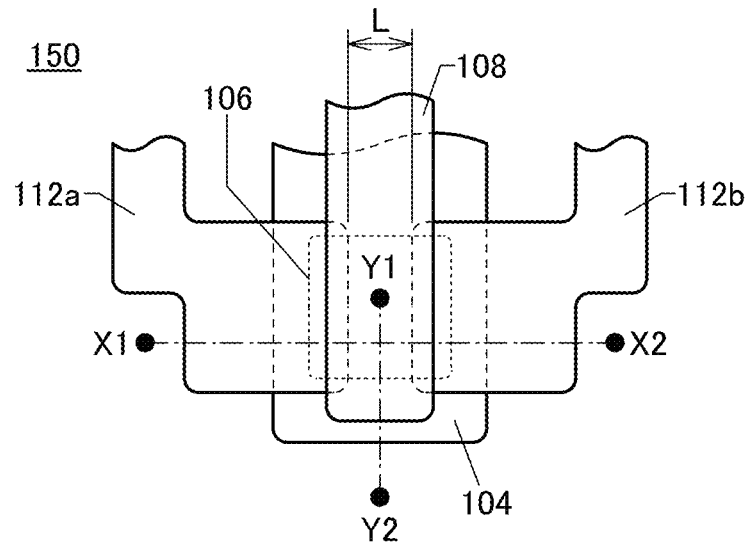
FIGS. 19A and 19B illustrate a transistor.
Figure 19B:
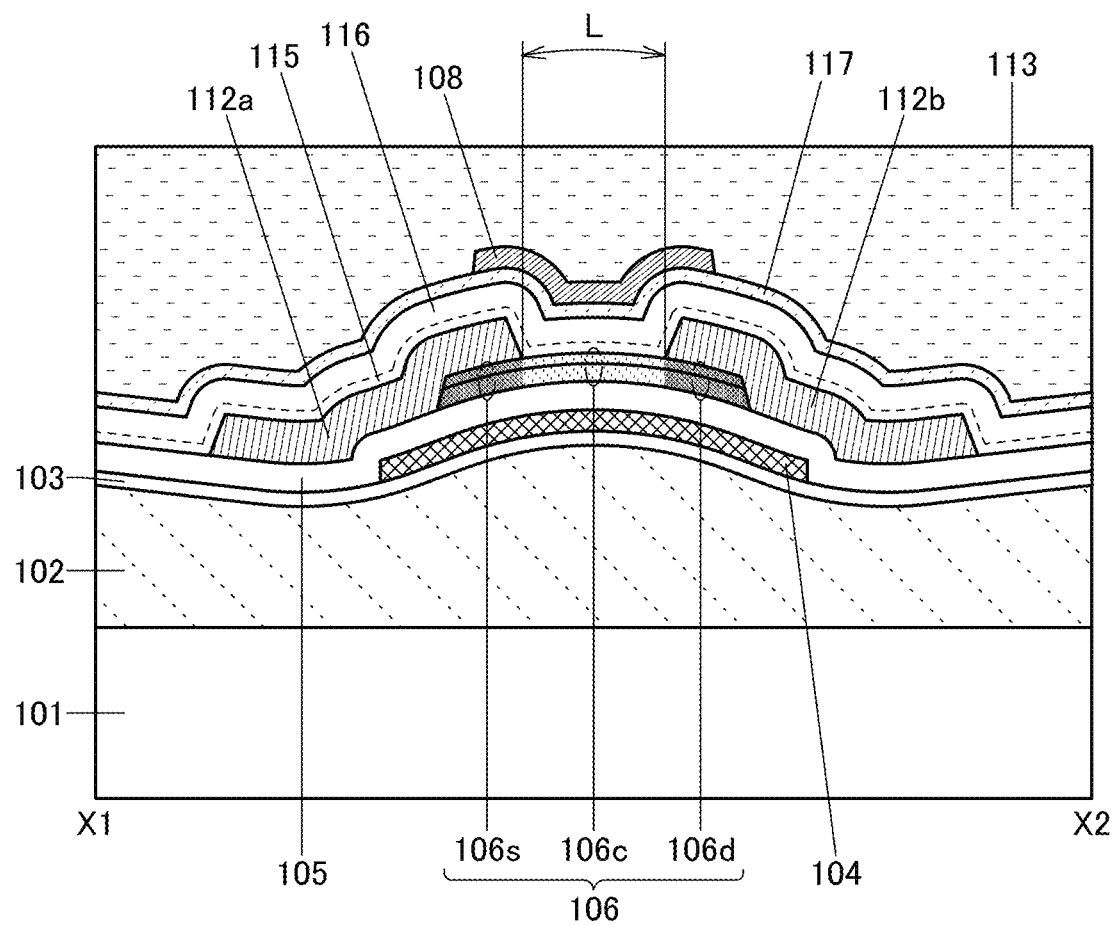
Figure 20:
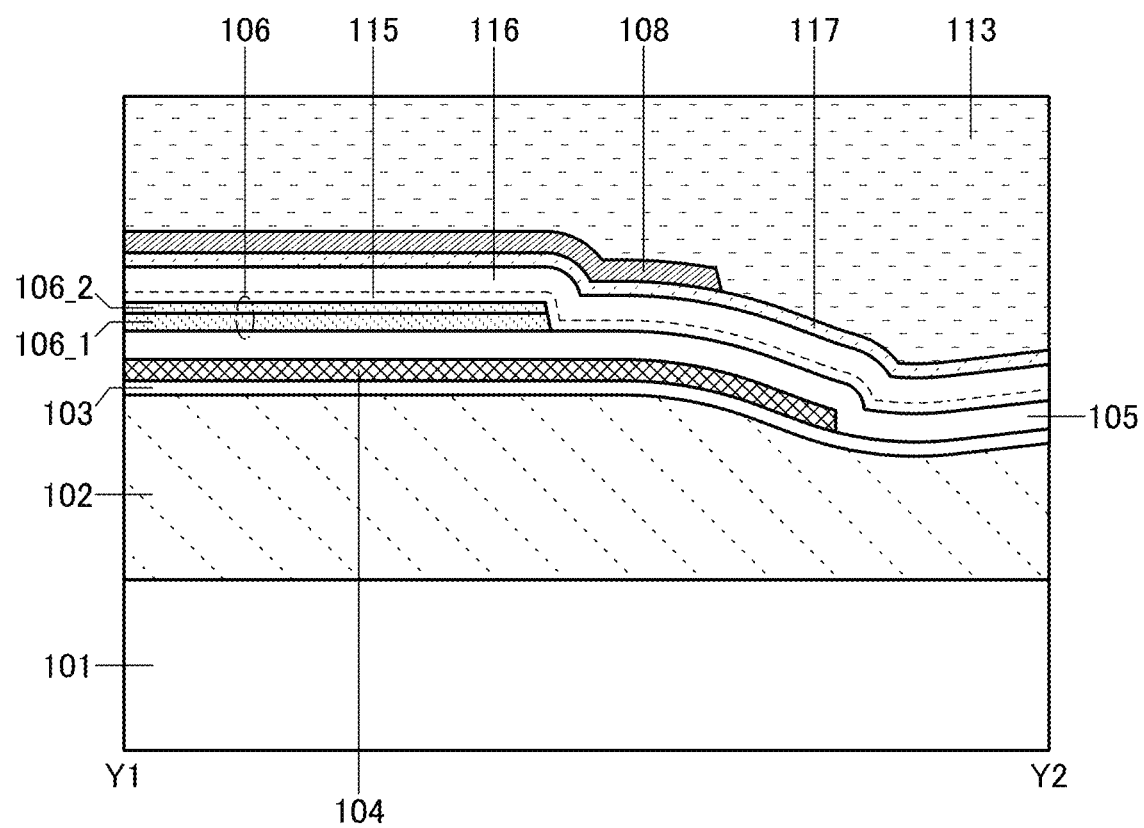
FIG. 20 illustrates a transistor.

FIG. 19A is a plan view of the transistor 150. FIG. 19B is a cross-sectional view (in the channel length direction) of the portion indicated by dashed-dotted line X1-X2 in FIG. 19A. FIG. 20 is a cross-sectional view (in the channel width direction) of the portion indicated by dashed-dotted line Y1-Y2 in FIG. 19A.

The transistor 150 described in this embodiment is a kind of bottom-gate transistor. The transistor 150 is provided over the substrate 101 with the insulating layer 102 and the insulating layer 103 provided therebetween. The transistor 150 includes the electrode 104, the insulating layer 105, the semiconductor layer 106 (the semiconductor layer 106_1 and the semiconductor layer 106_2), the electrode 112a, the electrode 112b, an insulating layer 115, an insulating layer 116, an insulating layer 117, and the electrode 108.

The electrode 112a can serve as one of a source electrode and a drain electrode. The electrode 112b can function as the other of the source electrode and the drain electrode. The insulating layer 113 having a flat surface may be provided over the transistor 150.

Figure 21A:
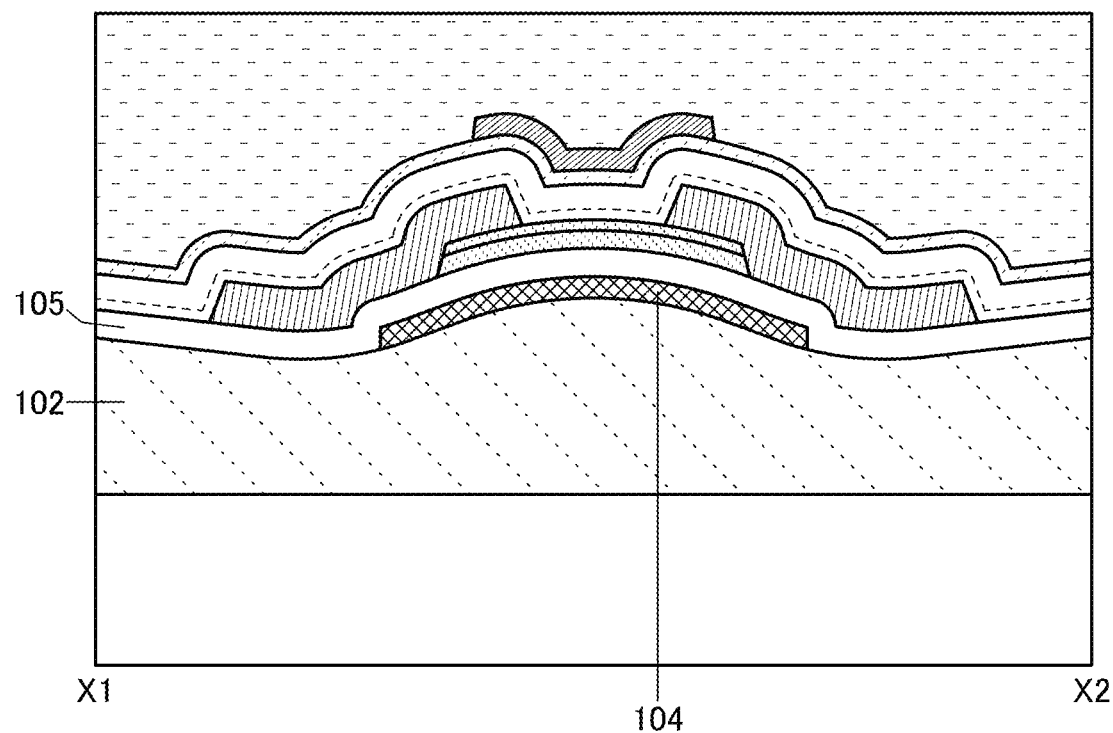
FIGS. 21A and 21B illustrate a transistor.
Figure 21B:
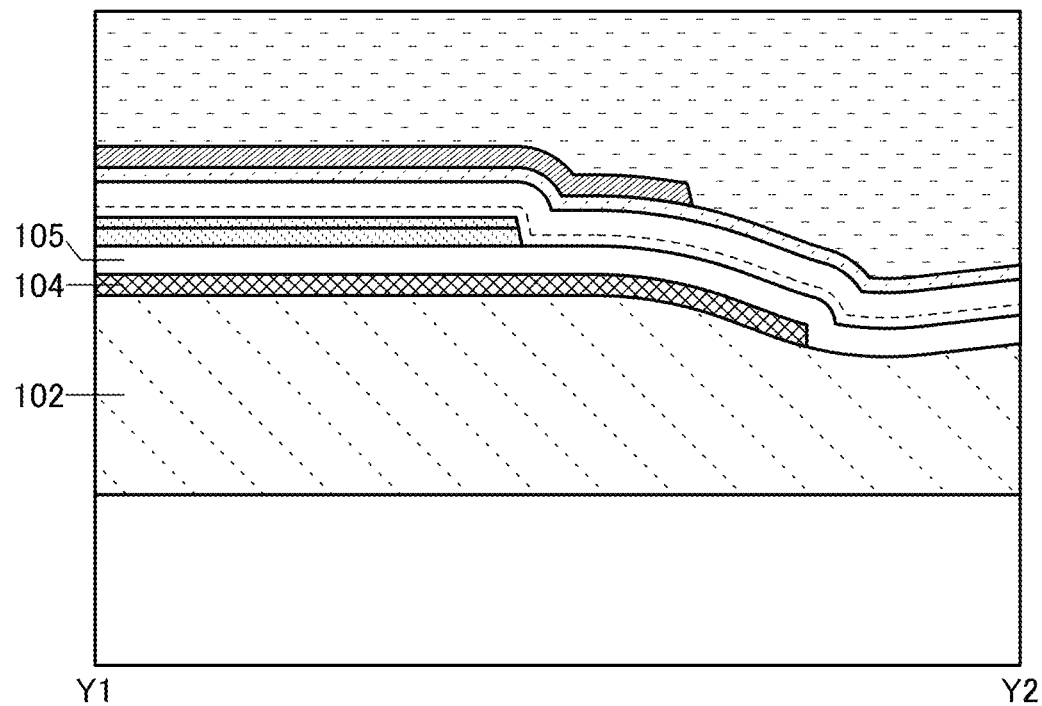

The insulating layer 105 may be formed using an insulating material that is unlikely to transmit impurities, in which case the insulating layer 103 is not necessarily provided (see FIGS. 21A and 21B). FIG. 21A is a cross-sectional view corresponding to FIG. 19B. FIG. 21B is a cross-sectional view corresponding to FIG. 20.

Figure 22A:
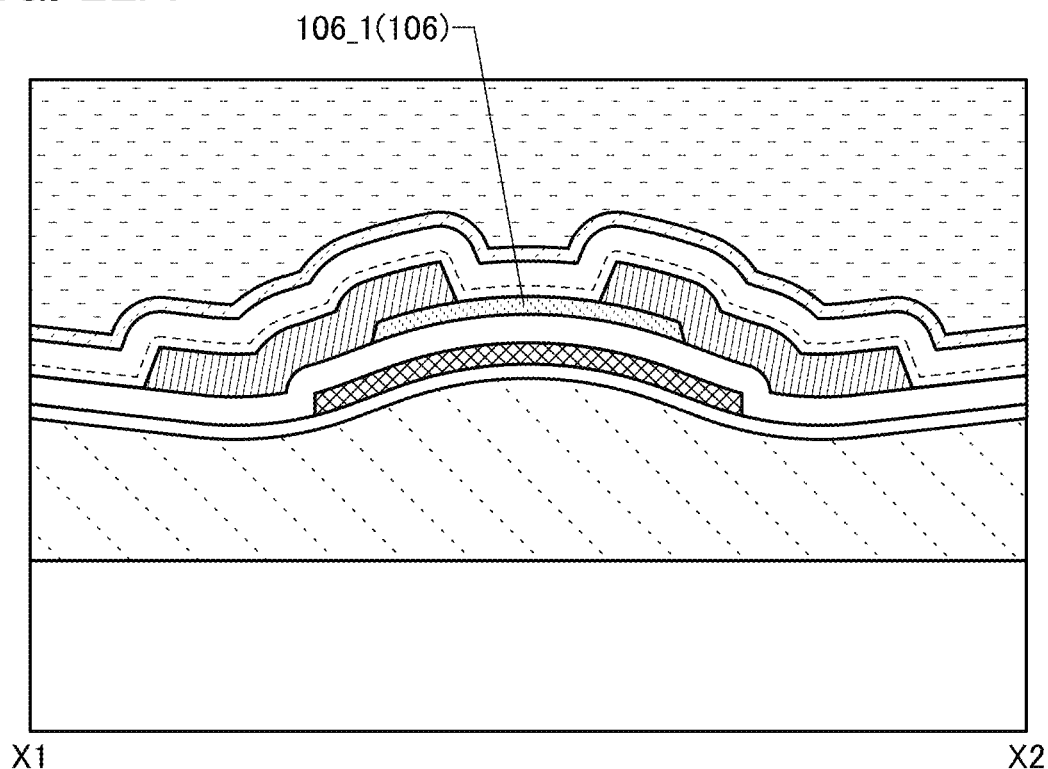
FIGS. 22A and 22B each illustrate a transistor.
Figure 22B:
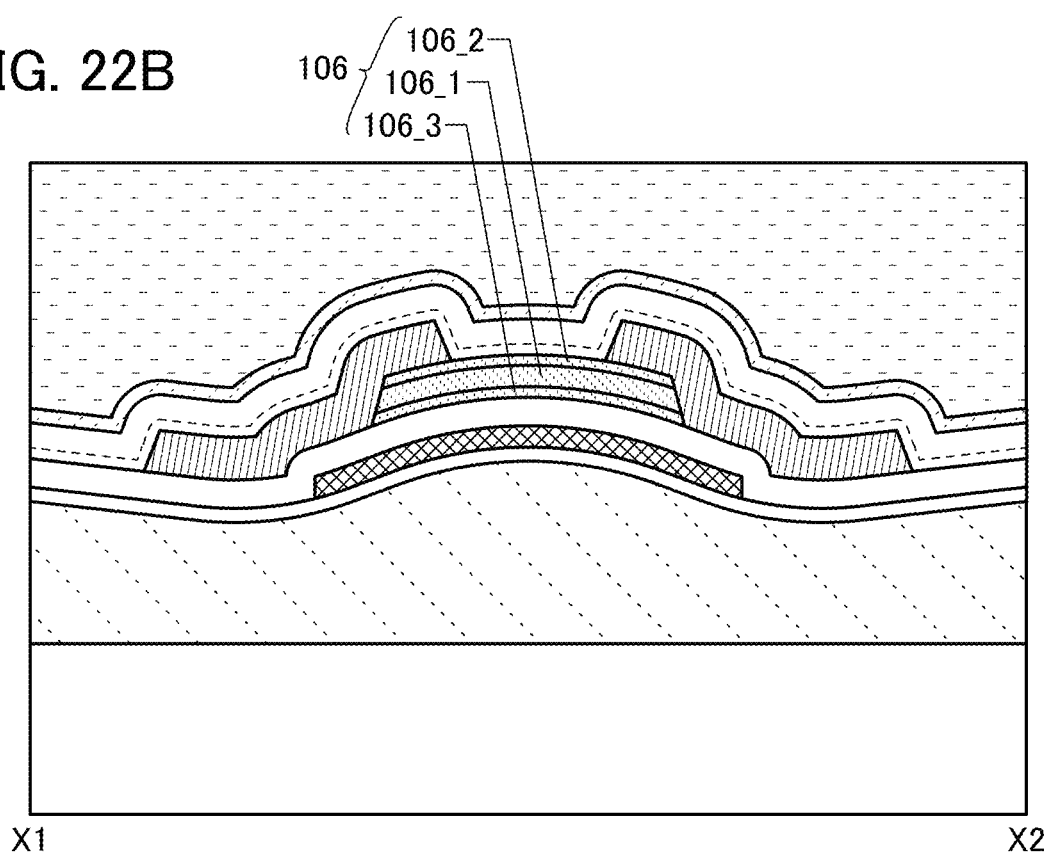

In the example illustrated in FIGS. 19A and 19B and FIG. 20, the semiconductor layer 106 of the transistor 150 has a two-layer structure of the semiconductor layer 106_1 and the semiconductor layer 106_2. The semiconductor layer 106 may be a single layer or a stack of three or more layers. For example, the semiconductor layer 106 may consist only of the semiconductor layer 106_1 as illustrated in FIG. 22A. Alternatively, the semiconductor layer 106 may have a three-layer structure of the semiconductor layer 106_1, the semiconductor layer 106_2, and the semiconductor layer 106_3 as illustrated in FIG. 22B, for example. Needless to say, the semiconductor layer 106 may be a stack of four or more layers. Note that FIGS. 22A and 22B are cross-sectional views corresponding to FIG. 19B.

In the transistor 150, a region of the semiconductor layer 106 that overlaps the electrode 104 and that is positioned between the electrode 112a and the electrode 112b in a plan view serves as a channel formation region. A region of the semiconductor layer 106 that is in contact with the electrode 112a serves as one of a source region and a drain region. A region of the semiconductor layer 106 that is in contact with the electrode 112b serves as the other of the source region and the drain region. Specifically, the region 106c illustrated in FIG. 19B serves as the channel formation region. The region 106s illustrated in FIG. 19B serves as one of the source region and the drain region. The region 106d illustrated in FIG. 19B serves as the other of the source region and the drain region.

In some of FIG. 20 and subsequent drawings, the region 106c, the region 106s, and the region 106d are not illustrated.

The channel length L of the transistor 150 is the length from the end portion of the electrode 112a that overlaps the semiconductor layer 106 to the end portion of the electrode 112b that overlaps the semiconductor layer 106 (see FIGS. 19A and 19B). The channel formation region of the transistor 150 overlaps the projection of the insulating layer 102.

<Example of Method for Manufacturing Transistor 150>

An example of a method for manufacturing the transistor 150 will be described with reference to FIGS. 23A and 23B, FIGS. 24A and 24B, FIGS. 25A and 25B, and FIGS. 26A and 26B. The cross-sectional views of FIGS. 23A and 23B, FIGS. 24A and 24B, FIGS. 25A and 25B, and FIGS. 26A and 26B correspond to the cross section of the portion indicated by the dashed-dotted line X1-X2 in FIG. 19A. Note that differences from the manufacturing method of the transistor 100 are mainly described to avoid repeated description. Embodiment 1, for example, can be referred to for the portions that are not described in this embodiment.

First, the steps up to Step 5 in the manufacturing method of the transistor 100 are performed.

[Step 1b]

Figure 23A:
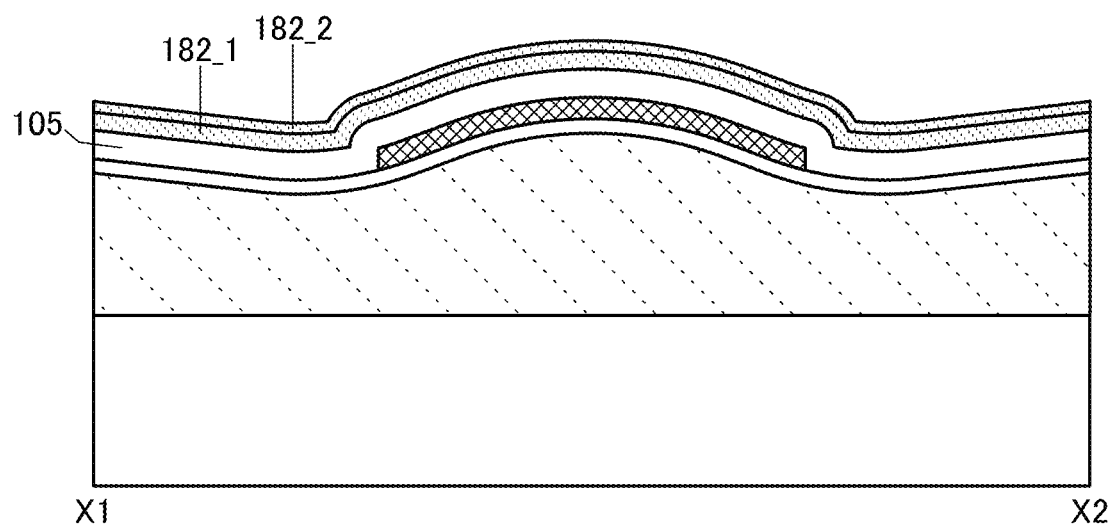
FIGS. 23A and 23B illustrate manufacturing steps of a transistor.
Figure 23B:
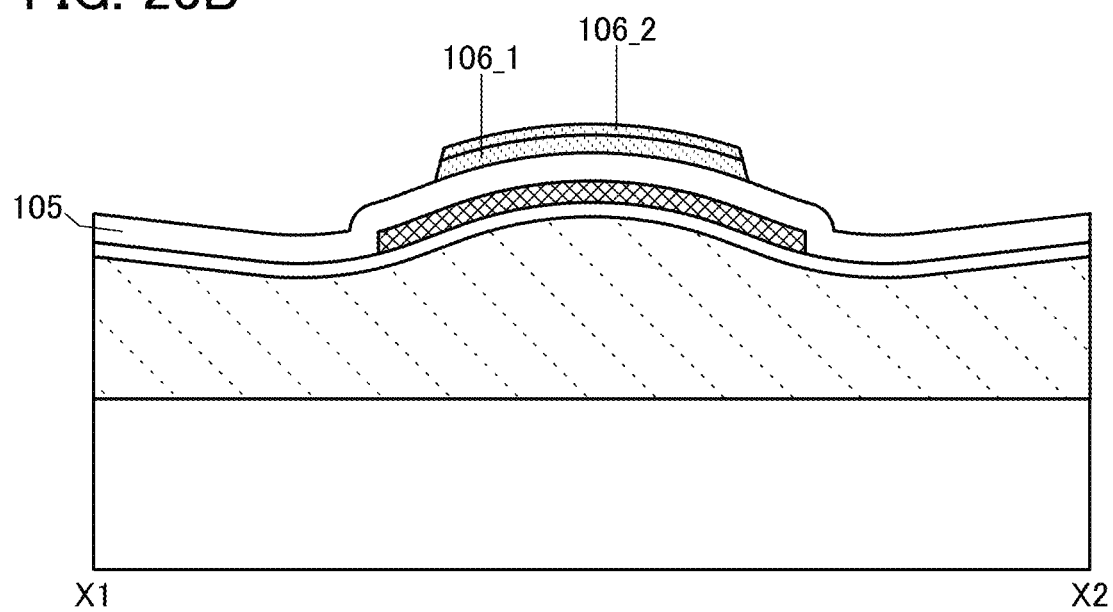

Next, a semiconductor layer 182_1 is formed, and a semiconductor layer 182_2 is formed over the semiconductor layer 182_1 (see FIG. 23A). Note that before the semiconductor layer 182_1 is formed, an oxygen gas may be supplied to generate plasma, in which case oxygen can be added to the insulating layer 105, which is a surface where the semiconductor layer 182_1 is formed.

In this embodiment, for the semiconductor layer 182_1, indium gallium zinc oxide is deposited by a sputtering method using a target with an atomic ratio In:Ga:Zn=4:2:4.1. Oxygen or a mixed gas of oxygen and a rare gas is used as a sputtering gas. In this embodiment, a mixed gas of oxygen and argon in which the flow rate ratio of oxygen is 10% is used as the sputtering gas.

Then, for the semiconductor layer 182_2, indium gallium zinc oxide is deposited by a sputtering method using a target with an atomic ratio In:Ga:Zn=1:1:1.2. Oxygen or a mixed gas of oxygen and a rare gas is used as a sputtering gas. For example, a sputtering gas with an oxygen proportion of 100% is used. The flow rate ratio of oxygen in the sputtering gas for forming the semiconductor layer 182_2 is preferably 70% or more, further preferably 80% or more, still further preferably 100%. By increasing the proportion (flow rate ratio) of oxygen in the sputtering gas, the crystallinity of the oxide semiconductor layer can be increased.

For the oxide semiconductor layer for forming the semiconductor layer 106_2, it is preferable to use an oxide semiconductor layer with high crystallinity. For example, in a subsequent etching step for forming the electrode 112a and the electrode 112b, an exposed portion of the semiconductor layer 106 is etched and the semiconductor layer 106 is damaged in some cases. An oxide semiconductor layer with high crystallinity is not likely to be etched in this etching step. Using an oxide semiconductor layer with high crystallinity as the semiconductor layer 106_2 can reduce damage caused to the oxide semiconductor layer in the etching step; thus, the reliability of the transistor can be improved.

By introducing an impurity element after formation of the semiconductor layer 182_2, the threshold voltage of the transistor 150 can be changed. An impurity element can be introduced by an ion implantation method, an ion doping method, a plasma immersion ion implantation method, plasma treatment using a gas containing an impurity element, or the like.

After the semiconductor layer 182_2 is formed, heat treatment and/or oxygen doping treatment may be performed. Heat treatment and oxygen doping treatment may be repeated a plurality of times.

Furthermore, after heat treatment is performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor layer and oxygen can be supplied to the oxide semiconductor layer at the same time. Consequently, oxygen vacancies in the oxide semiconductor layer can be reduced.

[Step 2b]

Then, a resist mask is formed by a photolithography method as in Step 7 above (not illustrated). With the use of the resist mask as a mask, part of the semiconductor layer 182_1 and part of the semiconductor layer 182_2 are selectively removed, so that the island-shaped semiconductor layer 106_1 and the island-shaped semiconductor layer 106_2 are formed (see FIG. 23B).

[Step 3b]

Figure 24A:
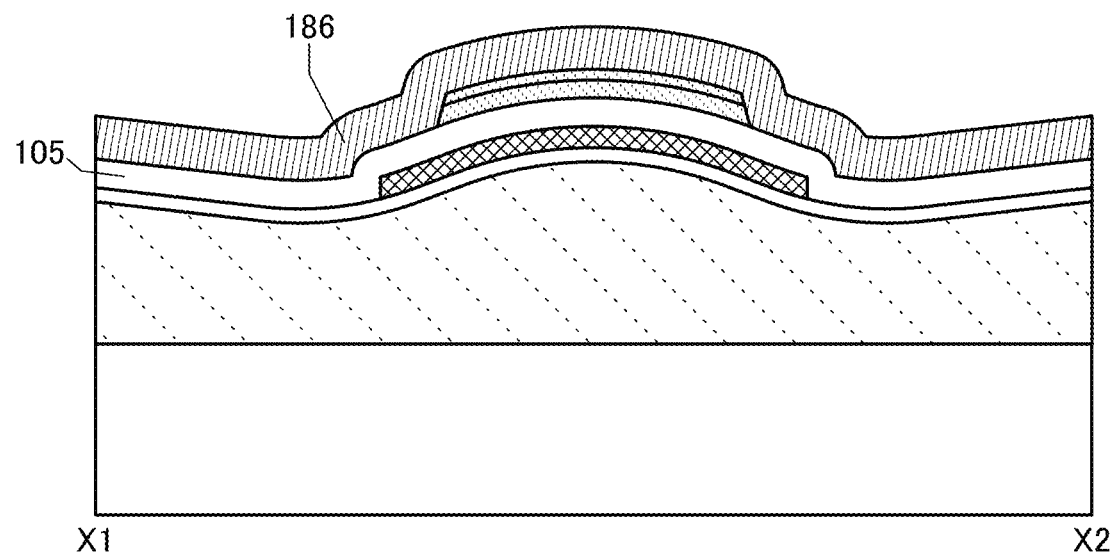
FIGS. 24A and 24B illustrate manufacturing steps of a transistor.
Figure 24B:
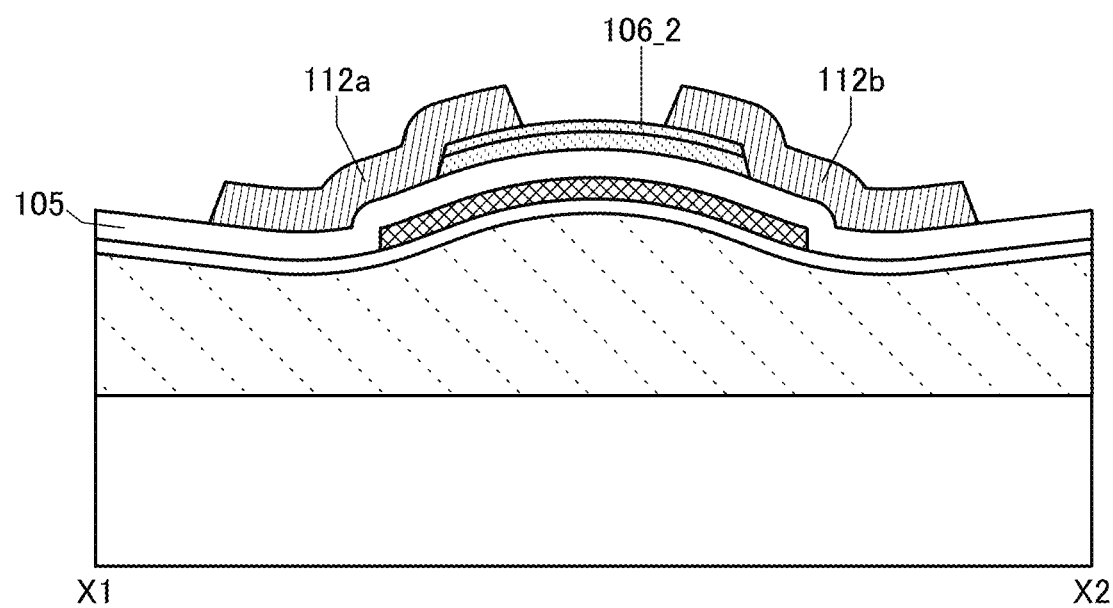

Next, the conductive layer 186 for forming the electrodes 112a and 112b is formed as in Step 15 above (see FIG. 24A). In this embodiment, a stack including tungsten, aluminum, and titanium is used for the conductive layer 186. Specifically, a 50-nm-thick tungsten layer, a 400-nm-thick aluminum layer, and a 100-nm-thick titanium layer are formed in this order by a sputtering method.

[Step 4b]

Next, a resist mask is formed by a photolithography method as in Step 16 above (not illustrated). With the use of the resist mask as a mask, part of the conductive layer 186 is selectively removed to form the electrode 112a and the electrode 112b (see FIG. 24B). One of the electrode 112a and the electrode 112b can function as a source electrode, and the other can function as a drain electrode. At this time, an exposed portion of the semiconductor layer 106_2 is removed in some cases.

[Step 5b]

Figure 25A:
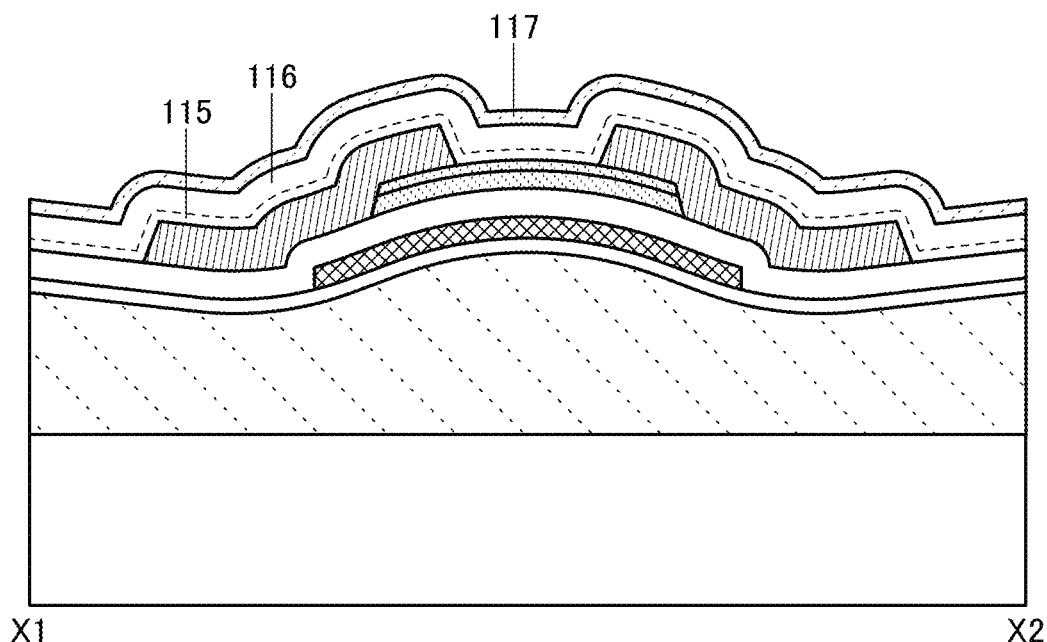
FIGS. 25A and 25B illustrate manufacturing steps of a transistor.

Next, the insulating layer 115, the insulating layer 116, and the insulating layer 117 are formed in this order (see FIG. 25A).

In this embodiment, a 30-nm-thick silicon oxynitride layer is formed as the insulating layer 115 under the conditions where a silane gas at a flow rate of 50 sccm and a dinitrogen monoxide gas at a flow rate of 2000 sccm are supplied as source gases to a reaction chamber of a PECVD apparatus, the pressure in the reaction chamber is controlled to 20 Pa, the substrate temperature is controlled to 350° C., and a power of 130 W is supplied using a 27.12 MHz high-frequency power source.

A 400-nm-thick silicon oxynitride layer is formed as the insulating layer 116 under the conditions where a silane gas at a flow rate of 160 sccm and a dinitrogen monoxide gas at a flow rate of 4000 sccm are supplied as source gases to a reaction chamber of a PECVD apparatus, the pressure in the reaction chamber is controlled to 200 Pa, the substrate temperature is controlled to 220° C., and a power of 1500 W is supplied using a 27.12 MHz high-frequency power source.

The insulating layer 116 is preferably an insulating layer containing excess oxygen. Further, it is preferable that the amount of defects in the insulating layer 116 be small. Typically, the spin density of a signal which appears at g=2.001 originating from a dangling bond of silicon is preferably lower than $1.5 \times 10^{18}$ spins/cm$^3$, further preferably lower than or equal to $1 \times 10^{18}$ spins/cm$^3$ by ESR measurement. Note that the insulating layer 116 is more distant from the semiconductor layer 106 than the insulating layer 115 and thus may have a higher defect density than the insulating layer 115.

As the insulating layer 116, a silicon oxide layer or a silicon oxynitride layer may be formed under the conditions where the substrate is held at a temperature ranging from 180° C. to 400° C., the pressure in the reaction chamber into which source gases are introduced ranges from 100 Pa to 250 Pa, preferably from 100 Pa to 200 Pa, and a high-frequency power of 0.17 W/cm$^2$ to 0.5 W/cm$^2$, preferably 0.25 W/cm$^2$ to 0.35 W/cm$^2$ is supplied to an electrode provided in the reaction chamber.

In formation of the insulating layer 116, when the high-frequency power with the above power density is supplied in the reaction chamber at the above pressure, decomposition efficiency of the source gases is increased in plasma. That is, oxygen radicals increase in the reaction chamber, and oxidation of the source gases proceeds. Thus, the oxygen content of the insulating layer 116 can be higher than that in the stoichiometric composition.

In the insulating layer formed at a substrate temperature within the above range, the bond between silicon and oxygen is weak, and accordingly, part of oxygen in the insulating layer is released by heat treatment in a later step. Thus, it is possible to form an insulating layer which contains more oxygen than that in the stoichiometric composition and contains excess oxygen.

Note that in the formation conditions for the insulating layer 116, the flow rate of the deposition gas containing silicon relative to the oxidizing gas can be increased, whereby the amount of defects in the insulating layer 116 can be reduced. Typically, it is possible to form an oxide insulating layer in which the amount of defects is small, i.e., the spin density of a signal that appears at g=2.001 originating from a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor can be improved.

Note that in the step of forming the insulating layer 116, the insulating layer 115 functions as a protective layer for the semiconductor layer 106. Therefore, the insulating layer 116 can be formed using the high-frequency power having a high power density while damage to the semiconductor layer 106 is reduced.

A 100-nm-thick silicon nitride layer is formed as the insulating layer 117 under the conditions where a silane gas at a flow rate of 50 sccm, a nitrogen gas at a flow rate of 5000 sccm, and an ammonia gas at a flow rate of 100 sccm are supplied as source gases to a reaction chamber of a PECVD apparatus, the pressure in the reaction chamber is controlled to 100 Pa, the substrate temperature is controlled to 350° C., and a power of 1000 W is supplied using a 27.12 MHz high-frequency power source.

[Step 6b]

Figure 25B:
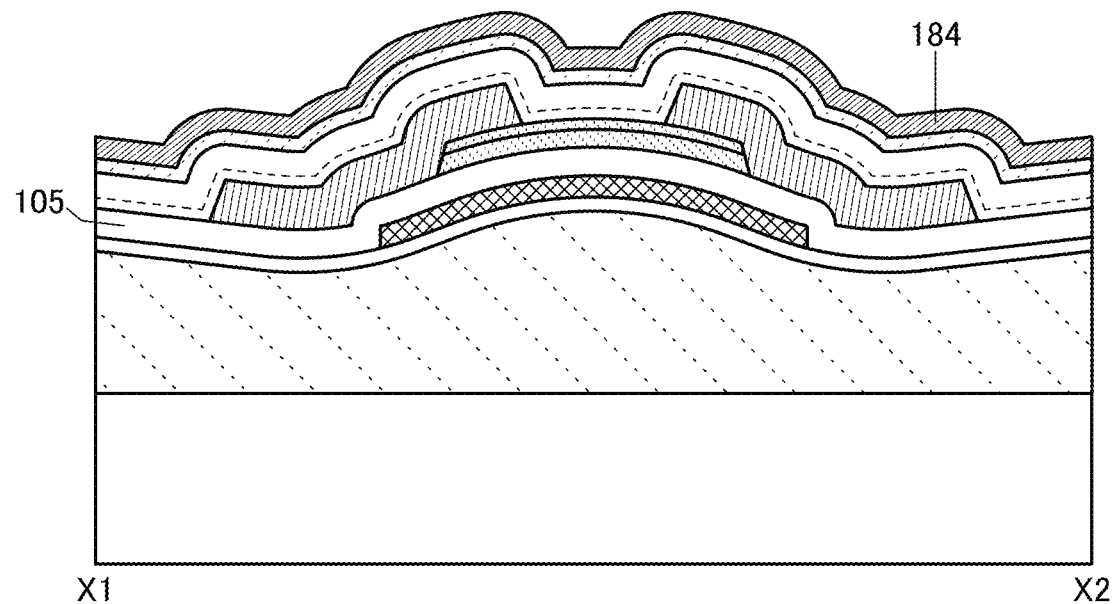

Then, the conductive layer 184 for forming the electrode 108 is formed as in Step 9 above (see FIG. 25B). In this embodiment, as the conductive layer 184, a layer of indium tin oxide containing silicon is formed to a thickness of 100 nm by a sputtering method.

[Step 7b]

Next, a resist mask is formed by a photolithography method as in Step 10 above (not illustrated). With the use of the resist mask as a mask, part of the conductive layer 184 is selectively removed, so that the electrode 108 is formed (see FIG. 26A).

[Step 8b]

Figure 26A:
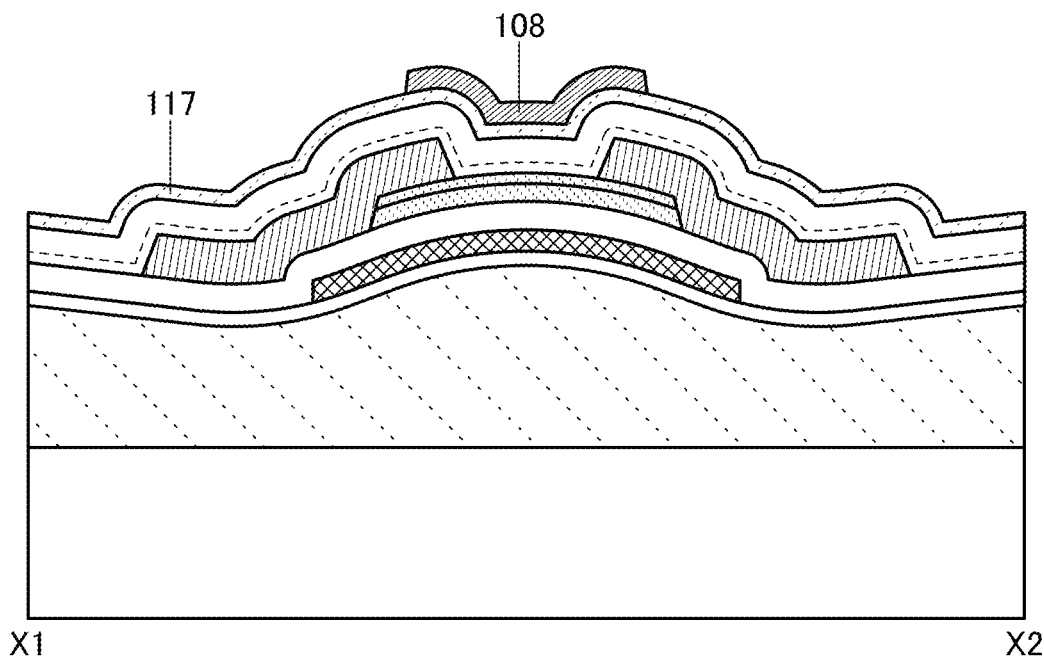
FIGS. 26A and 26B illustrate manufacturing steps of a transistor.
Figure 26B:
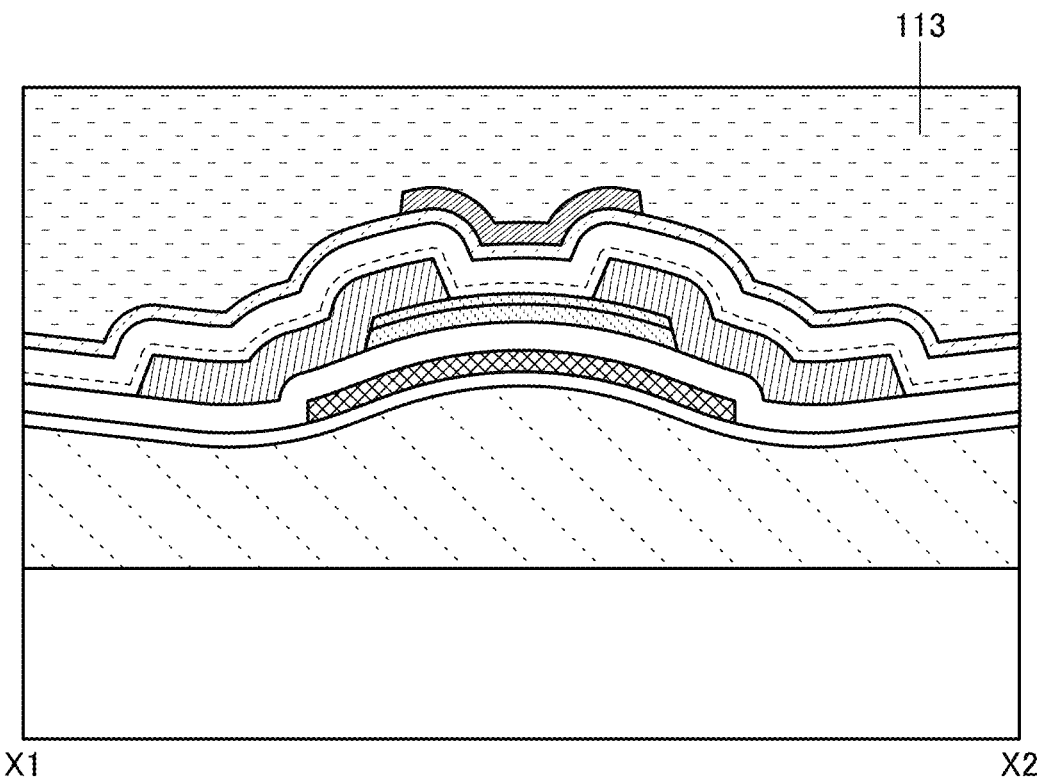

Then, the insulating layer 113 having a flat surface is formed (see FIG. 26B). In this embodiment, a 1.5-μm-thick acrylic resin layer is formed as the insulating layer 113. Note that the insulating layer 113 is not necessarily provided depending on the purpose or the intended use.

Through the above steps, the transistor 150 can be manufactured.

This embodiment can be implemented in appropriate combination with any of the structures described in the other embodiments and the like.

Embodiment 4

A modification example of the transistor 150 described in Embodiment 3 will be described in this embodiment with reference to drawings. Note that differences from the transistor 150 are mainly described to avoid repeated description. Embodiment 3 can be referred to for the portions that are not described in this embodiment.

Modification Example 1

Figure 27A:
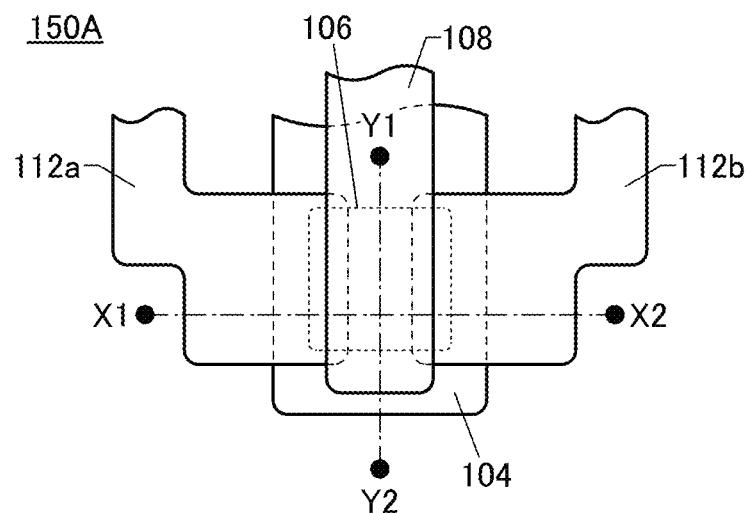
FIGS. 27A and 27B illustrate a transistor.
Figure 27B:
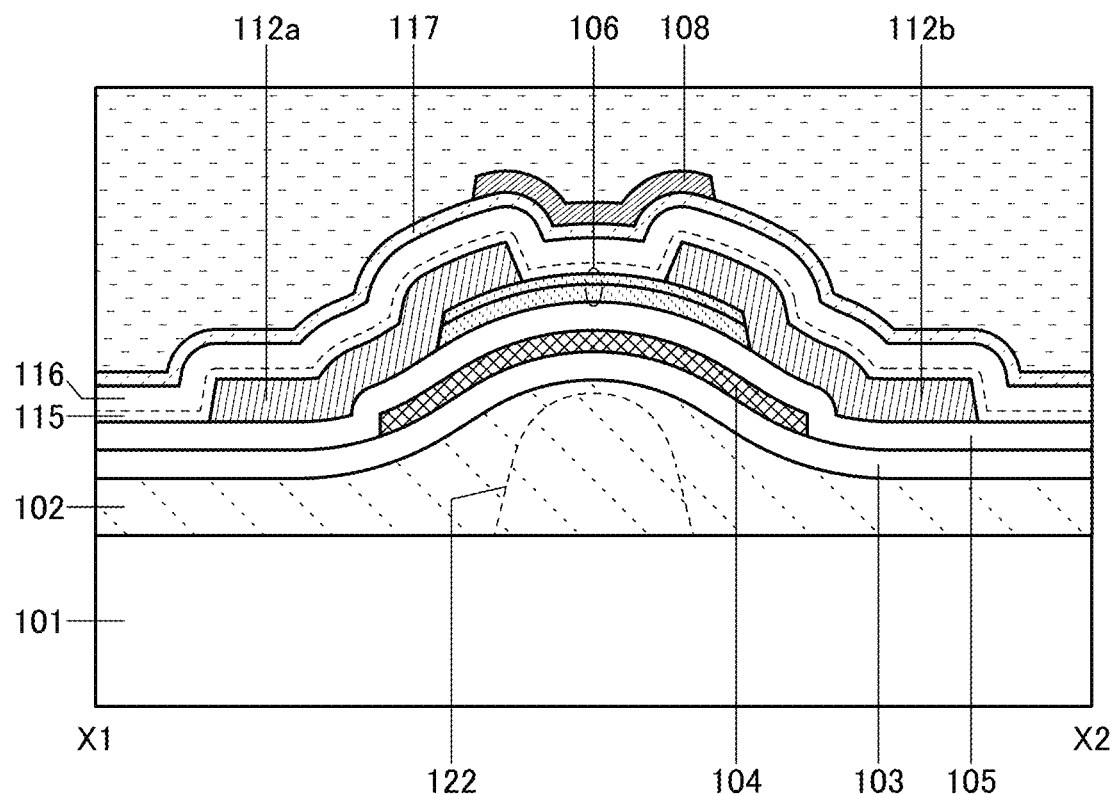
Figure 28:
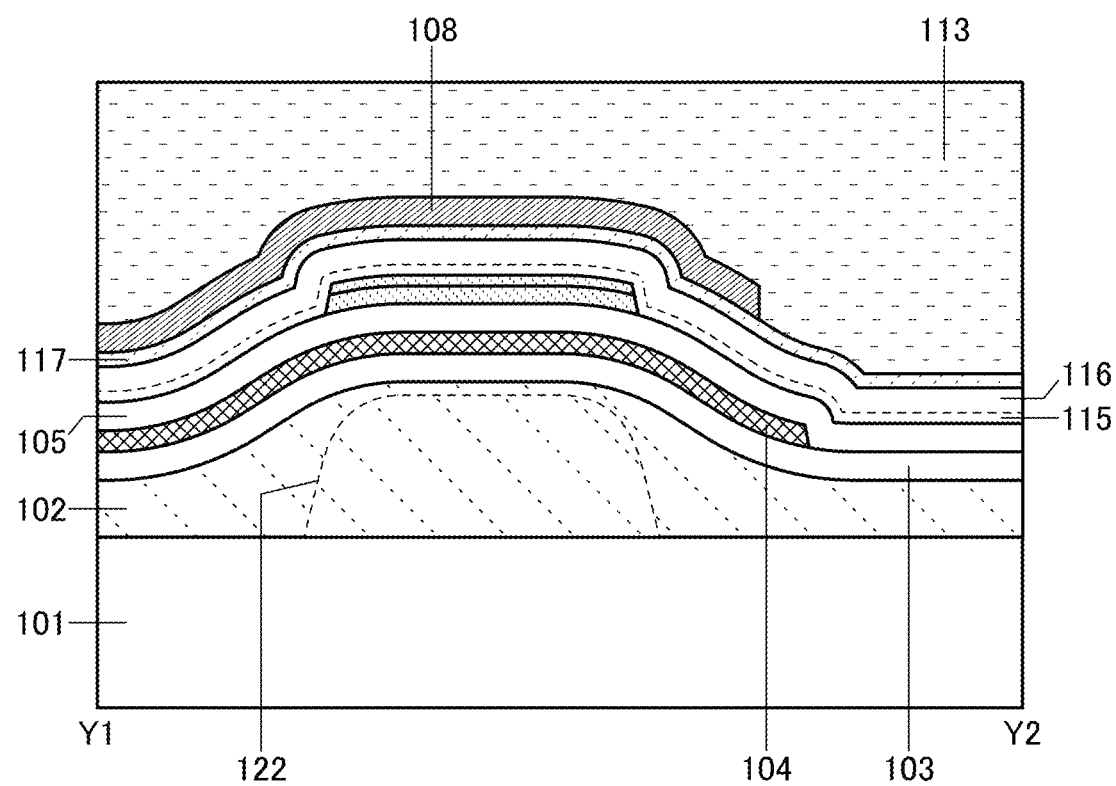
FIG. 28 illustrates a transistor.

FIG. 27A is a plan view of a transistor 150A. FIG. 27B is a cross-sectional view (in the channel length direction) of the portion indicated by dashed-dotted line X1-X2 in FIG. 27A. FIG. 28 is a cross-sectional view (in the channel width direction) of the portion indicated by dashed-dotted line Y1-Y2 in FIG. 27A.

The transistor 150A, having almost the same structure as the transistor 150, is different from the transistor 150 in including the structure body 122 between the insulating layer 102 and the substrate 101. In the transistor 150A, the semiconductor layer 106, the electrode 104, and the electrode 108 each have a region overlapping the structure body 122.

The effect of the use of the structure body 122 and the manufacturing method of the structure body are described in Embodiment 2 and thus will not be described in this embodiment.

Modification Example 2

Figure 29A:
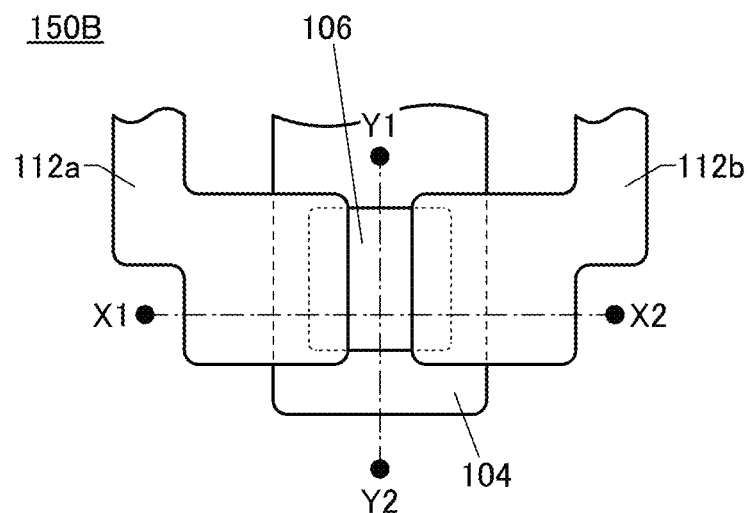
FIGS. 29A and 29B illustrate a transistor.
Figure 29B:
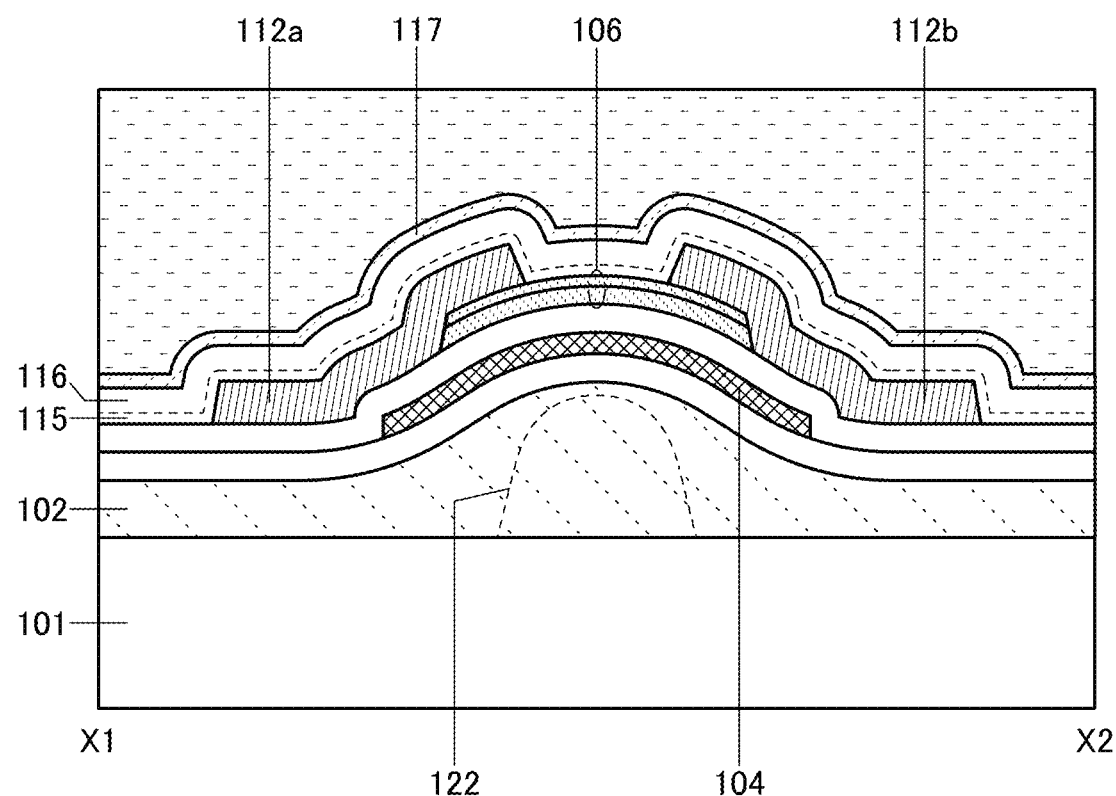
Figure 30:
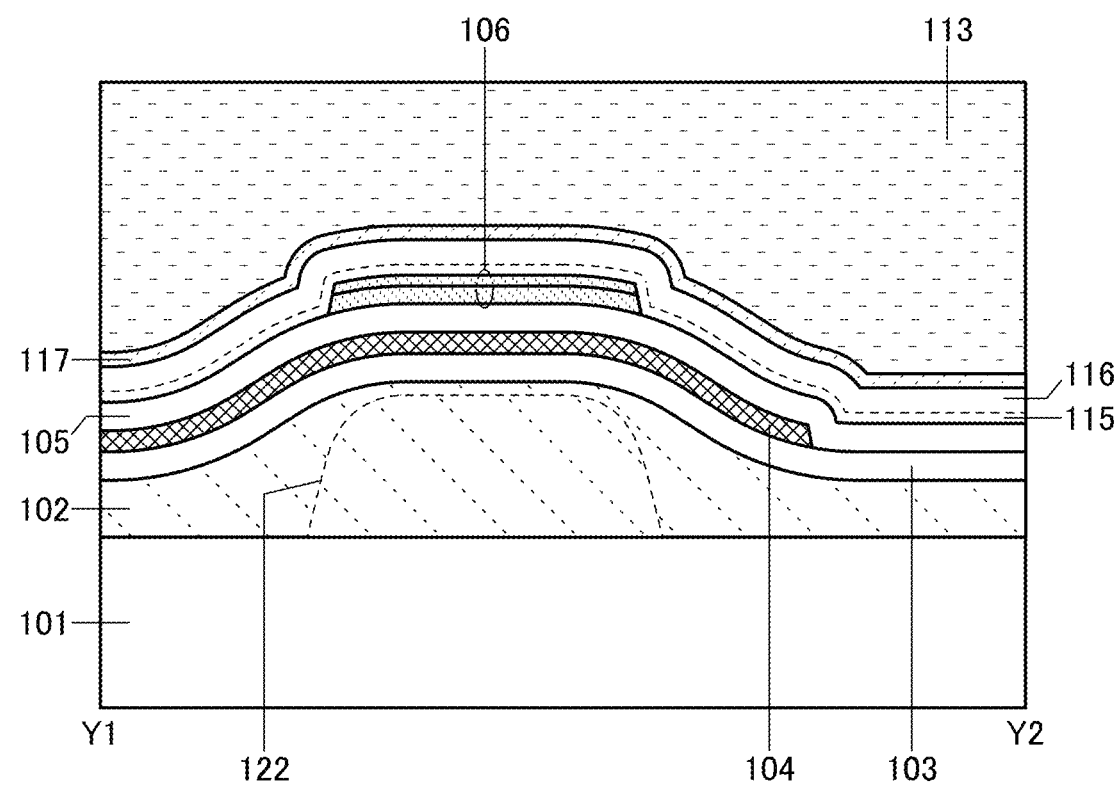
FIG. 30 illustrates a transistor.

FIG. 29A is a plan view of a transistor 150B. FIG. 29B is a cross-sectional view (in the channel length direction) of the portion indicated by dashed-dotted line X1-X2 in FIG. 29A. FIG. 30 is a cross-sectional view (in the channel width direction) of the portion indicated by dashed-dotted line Y1-Y2 in FIG. 29A.

The transistor 150B has the structure of the transistor 150A without the electrode 108. The electrode 108 is not necessarily provided, as determined by required performance, purpose, or the like of the transistor. When the electrode 108 is not provided, the number of steps for manufacturing the transistor is reduced; thus, the manufacturing cost can be reduced. Moreover, the manufacturing yield of the transistor can be increased.

Modification Example 3

Figure 31A:
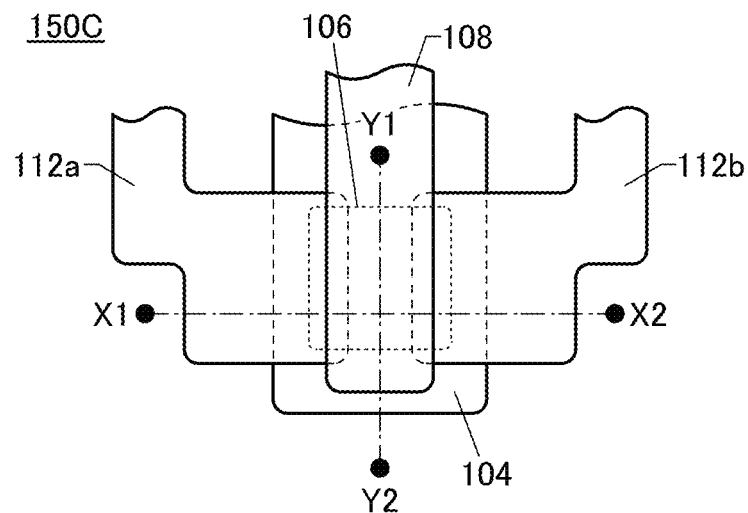
FIGS. 31A and 31B illustrate a transistor.
Figure 31B:
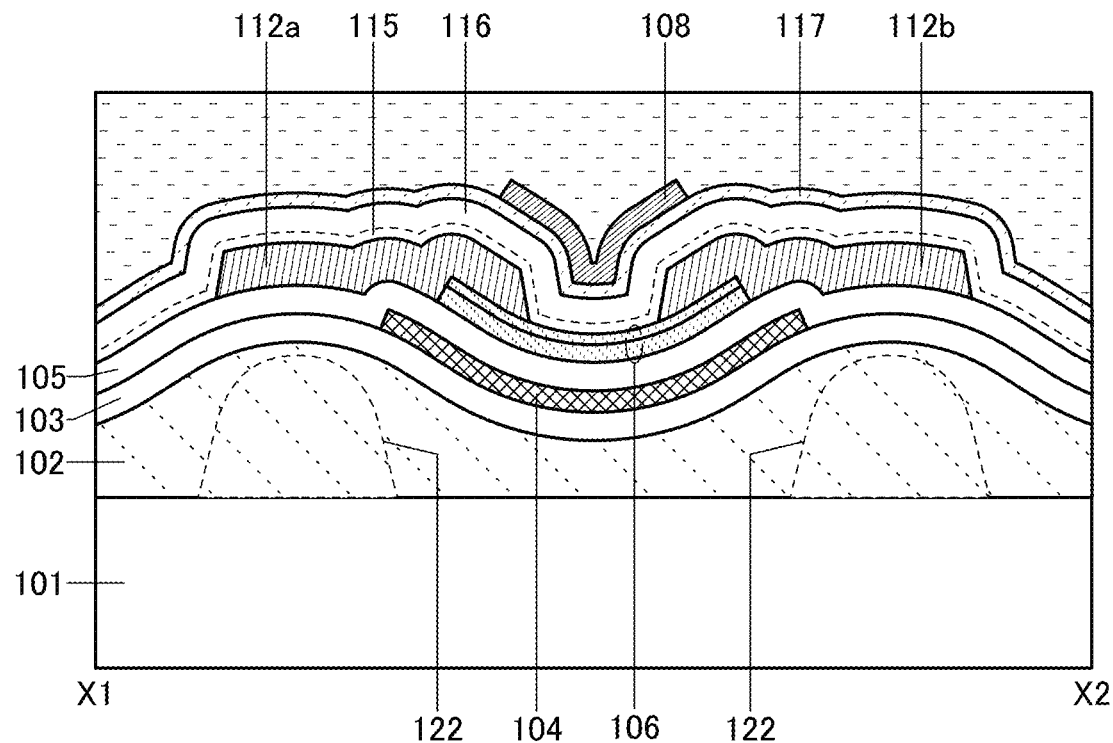
Figure 32:
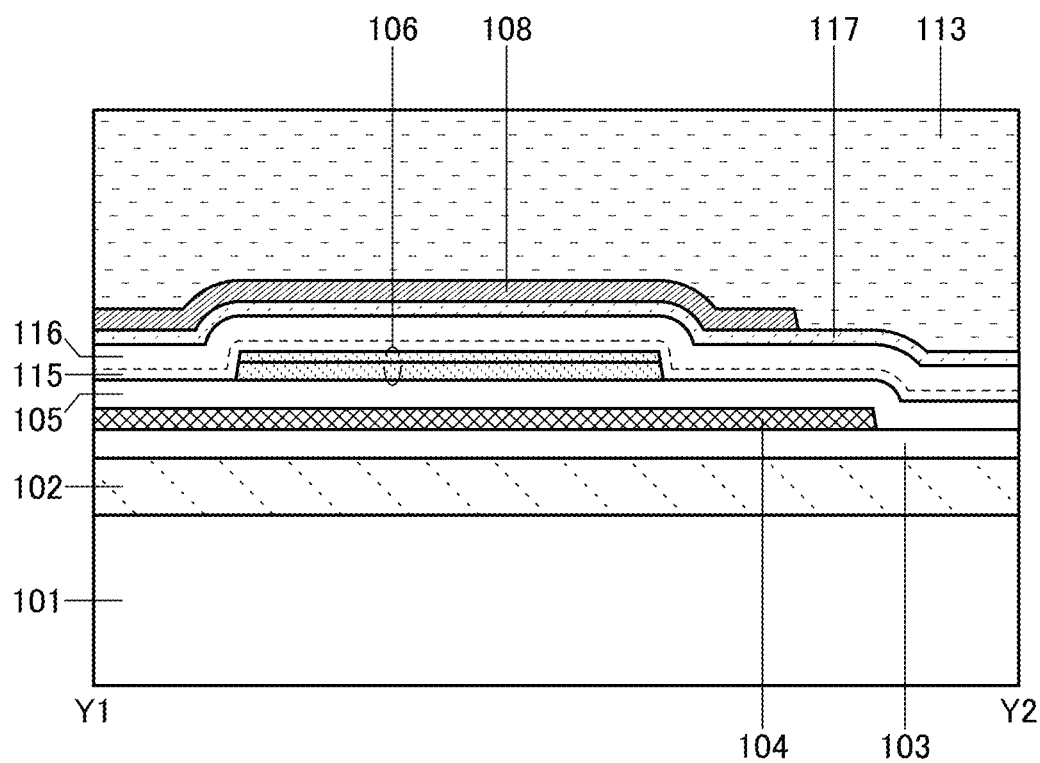
FIG. 32 illustrates a transistor.

FIG. 31A is a plan view of a transistor 150C. FIG. 31B is a cross-sectional view (in the channel length direction) of the portion indicated by dashed-dotted line X1-X2 in FIG. 31A. FIG. 32 is a cross-sectional view (in the channel width direction) of the portion indicated by dashed-dotted line Y1-Y2 in FIG. 31A.

Providing a plurality of structure bodies 122 forms a depression in the insulating layer 102. The transistor 150C has a structure similar to that of the transistor 150A. The transistor 150C is different from the transistor 150A in that the semiconductor layer 106, the electrode 104, and the electrode 108 each have a region overlapping the depression of the insulating layer 102. The transistor 150C has a region where the channel formation region overlaps the depression of the insulating layer 102. The transistor 150C also has a region where the channel formation region does not overlap the projection of the insulating layer 102.

This embodiment can be implemented in appropriate combination with any of the structures described in the other embodiments and the like.

Embodiment 5

In this embodiment, a display device and a display module will be described as examples of a semiconductor device including any of the transistors disclosed in this specification and the like.

A structure example of a display device 200 is described with reference to drawings. Note that this embodiment mainly describes a light-emitting display device in which a light-emitting element is used as a display element. As the display device 200, a display device having a top-emission structure is described as an example. Note that the display device 200 can be a display device having a bottom-emission structure or a dual-emission structure.

When a liquid crystal element is used as the display element, the display device 200 can be a liquid crystal display device.

<Structure Example of Display Device>

Figure 34A:
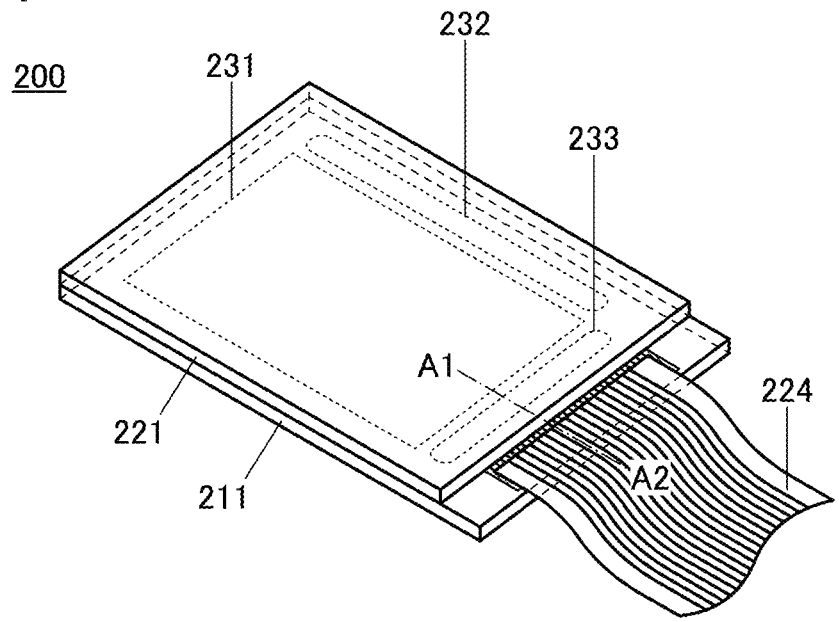
FIGS. 34A and 34B illustrate a display device.
Figure 34B:
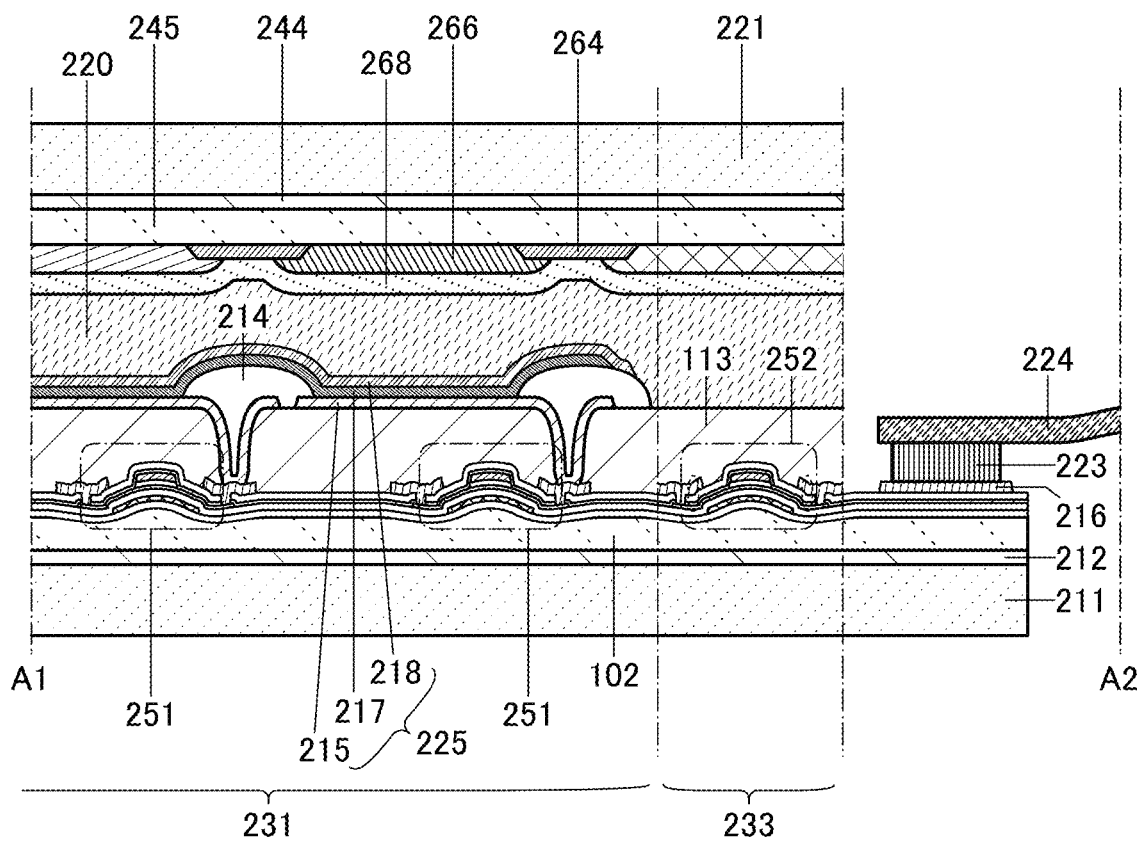

FIG. 34A is a perspective view of the display device 200 to which a flexible printed circuit (FPC) 224 serving as an external electrode is connected. FIG. 34B is a cross-sectional view of the portion indicated by the dashed-dotted line A1-A2 in FIG. 34A.

The display device 200 described in this embodiment includes a display region 231, a circuit 232, and a circuit 233. The display region 231 includes a plurality of pixels. One pixel includes a transistor 251 and a light-emitting element 225 that includes an electrode 215, an EL layer 217, and an electrode 218. The transistor 251 is electrically connected to the light-emitting element 225. The transistor 251 has a function of controlling the amount of light emitted from the light-emitting element 225. The display device 200 includes a terminal electrode 216. The light-emitting element 225 has a function of emitting white light, for example.

The FPC 224 and the terminal electrode 216 are electrically connected to each other through an anisotropic conductive layer 223. Part of the terminal electrode 216 is electrically connected to the circuit 232 and/or the circuit 233. Note that the terminal electrode 216 is formed using the same conductive layer as the conductive layer for forming the electrode 112a and the electrode 112b.

The circuit 232 and the circuit 233 each include a plurality of transistors 252. The circuit 232 and the circuit 233 each have a function of determining which of the light-emitting elements 225 in the display region 231 is supplied with a signal through the FPC 224.

Any of the transistors disclosed in the above embodiments can be used as the transistor 251 and the transistor 252. For example, the transistor 100, the transistor 150, or the like can be used. In addition, the insulating layer 113 is formed over the transistor 251 and the transistor 252, and the electrode 215 is formed over the insulating layer 113. The electrode 215 is electrically connected to a drain electrode of the transistor 251 through an opening formed in the insulating layer 113. A partition 214 is formed over the electrode 215, and the EL layer 217 and the electrode 218 are formed over the electrode 215 and the partition 214.

In the display device 200, a substrate 211 and a substrate 221 are attached to each other with a bonding layer 220 provided therebetween.

One surface of the substrate 211 is adjacent to the insulating layer 102 with a bonding layer 212 positioned therebetween. One surface of the substrate 221 is adjacent to an insulating layer 245 with a bonding layer 244 positioned therebetween. The one surface of the substrate 221 is provided with a light-blocking layer 264 with the insulating layer 245 positioned therebetween. The one surface of the substrate 221 is also provided with a coloring layer 266 and an overcoat layer 268 with the insulating layer 245 positioned therebetween.

The coloring layer 266 is provided to overlap the light-emitting element 225. The coloring layer 266 has a function of transmitting light in a specific wavelength range. The white light emitted by the light-emitting element 225 and passing through the coloring layer 266 is converted into light in a specific wavelength range. When the coloring layer 266 that transmits light in the red wavelength range is used, the white light can be converted into red light. When the coloring layer 266 that transmits light in the green wavelength range is used, the white light can be converted into green light. When the coloring layer 266 that transmits light in the blue wavelength range is used, the white light can be converted into blue light.

In this manner, a pixel that emits light in a specific wavelength range can be formed. Full-color display can be achieved by making a pixel that emits red light, a pixel that emits green light, and a pixel that emits blue light collectively function as one pixel and by controlling the amount of light emitted from each pixel. Thus, these three pixels function as sub-pixels. The colors of light emitted by the three sub-pixels are not limited to the combination of red, green, and blue and may be yellow, cyan, and magenta.

Four sub-pixels may collectively function as one pixel. For example, a sub-pixel that emits white light may be added to the three sub-pixels that emit red light, green light, and blue light. The addition of the sub-pixel that controls white light can increase the luminance of the display region. When a larger number of sub-pixels emitting light of colors such as red, green, blue, yellow, cyan, and magenta are combined as appropriate and function as one pixel, the range of color reproduction can be increased.

The light emitted by the light-emitting element 225 is not limited to white light. For example, the light-emitting element 225 that emits red light, the light-emitting element 225 that emits green light, the light-emitting element 225 that emits blue light, and the like may be used, in which case the coloring layer 266 can be omitted.

The coloring layer 266 transmitting light in the red wavelength range may overlap the light-emitting element 225 emitting red light. The coloring layer 266 transmitting light in the green wavelength range may overlap the light-emitting element 225 emitting green light. The coloring layer 266 transmitting light in the blue wavelength range may overlap the light-emitting element 225 emitting blue light. The overlap between the light-emitting element 225 and the coloring layer 266 reduces reflection of external light, which increases the display quality of the display device.

Using the pixels arranged in a matrix of 1920×1080, the display device 200 can display an image with full high-definition (Full HD, also referred to as 2K resolution, 2K1K, 2K, or the like) quality. Using the pixels arranged in a matrix of 3840×2160, the display device 200 can display an image with Ultra HD (also referred to as 4K resolution, 4K2K, 4K, or the like) quality. Using the pixels arranged in a matrix of 7680×4320, the display device 200 can display an image with "Super Hi-Vision" (also referred to as 8K resolution, 8K4K, 8K, or the like) quality. Using a larger number of pixels, the display device 200 can display an image with 16K or 32K resolution.

A flexible material such as an organic resin can be used for the substrate 211 and the substrate 221. In the case where the display device 200 has a bottom-emission structure or a dual-emission structure, a material having a light-transmitting property with respect to light emitted from the EL layer 217 is used for the substrate 211. In the case where the display device 200 has a top-emission structure or a dual-emission structure, a material having a light-transmitting property with respect to light emitted from the EL layer 217 is used for the substrate 221.

The thickness of each of the substrate 211 and the substrate 221 is preferably greater than or equal to 5 μm and less than or equal to 100 μm, further preferably greater than or equal to 10 μm and less than or equal to 50 μm. One or both of the substrate 211 and the substrate 221 may be a stacked-layer substrate that includes a plurality of layers.

It is preferable that the substrate 211 and the substrate 221 be formed using the same material and have the same thickness. However, depending on the purpose, the substrates 211 and 221 may be formed using different materials or have different thicknesses.

Examples of the flexible and visible-light-transmitting materials that can be used for the substrate 211 and the substrate 221 include a polyethylene terephthalate resin, a polyethylene naphthalate resin, a polyacrylonitrile resin, a polyimide resin, a polymethylmethacrylate resin, a polycarbonate resin, a polyethersulfone resin, a polyamide resin, a cycloolefin resin, a polystyrene resin, a polyamide imide resin, a polyvinylchloride resin, and polytetrafluoroethylene (PTFE). Furthermore, when a light-transmitting property is not necessary, a non-light-transmitting substrate may be used. For example, aluminum or the like may be used for the substrate 221 or the substrate 211.

The thermal expansion coefficients of the substrate 221 and the substrate 211 are preferably less than or equal to 30 ppm/K, more preferably less than or equal to 10 ppm/K. In addition, on surfaces of the substrate 221 and the substrate 211, a protective film having low water permeability may be formed in advance; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the substrate 221 and the substrate 211.

With such substrates, a non-breakable display device can be provided. Alternatively, a lightweight display device can be provided. Alternatively, an easily bendable display device can be provided.

<Example of Pixel Circuit Configuration>

Next, an example of a specific configuration of the display device 200 is described with reference to FIGS. 35A to 35C.

Figure 35A:
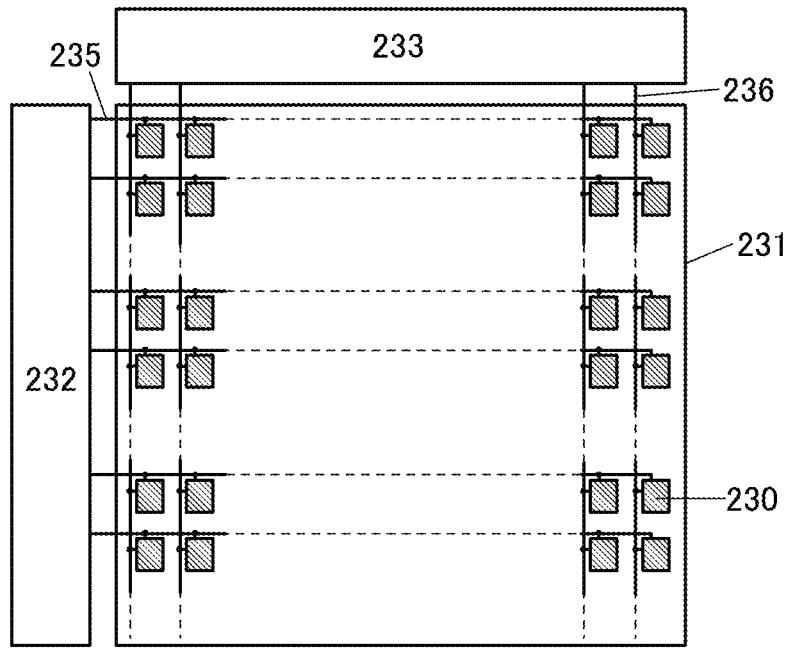
FIGS. 35A to 35C are a block diagram and circuit diagrams illustrating one mode of a display device.

FIG. 35A is a block diagram illustrating the configuration of the display device 200. The display device 200 includes the display region 231, the circuit 232, and the circuit 233. The circuit 232 functions as a scan line driver circuit, for example, and the circuit 233 functions as a signal line driver circuit, for example.

The display device 200 includes m scan lines 235 which are arranged parallel or substantially parallel to each other and whose potentials are controlled by the circuit 232, and n signal lines 236 which are arranged parallel or substantially parallel to each other and whose potentials are controlled by the circuit 233. The display region 231 includes a plurality of pixels 230 arranged in a matrix of m rows by n columns. Note that m and n are each an integer of 1 or more.

Each of the scan lines 235 is electrically connected to the n pixels 230 in the corresponding row among the pixels 230 arranged in the display region 231. Each of the signal lines 236 is electrically connected to the m pixels 230 in the corresponding column among the pixels 230.

In some cases, the circuits 232 and 233 may be collectively called a driver circuit portion. The pixel 230 includes a pixel circuit 237 and the light-emitting element 225. The pixel circuit 237 is a circuit that drives the light-emitting element 225. A transistor included in the driver circuit portion and a transistor included in the pixel circuit 237 can be formed at the same time. That is, with the use of the transistor described in this specification and the like, part of the driver circuit portion or the entire driver circuit portion can be formed over a substrate where a pixel portion is formed, whereby a system-on-panel can be obtained.

Part of the driver circuit portion or the entire driver circuit portion may be formed over another substrate and electrically connected to the display device 200. For example, part of the driver circuit portion or the entire driver circuit portion may be formed using a single crystal substrate and electrically connected to the display device 200.

Figure 35B:
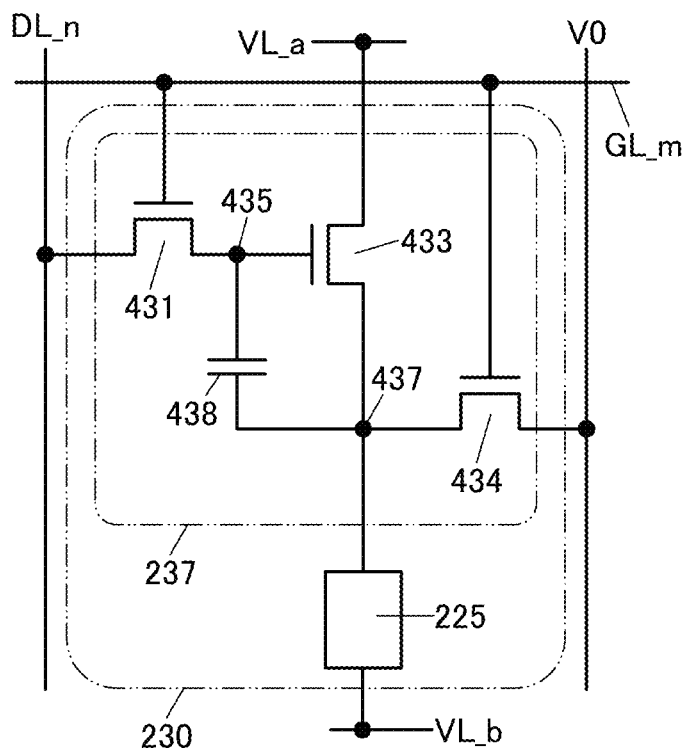
Figure 35C:
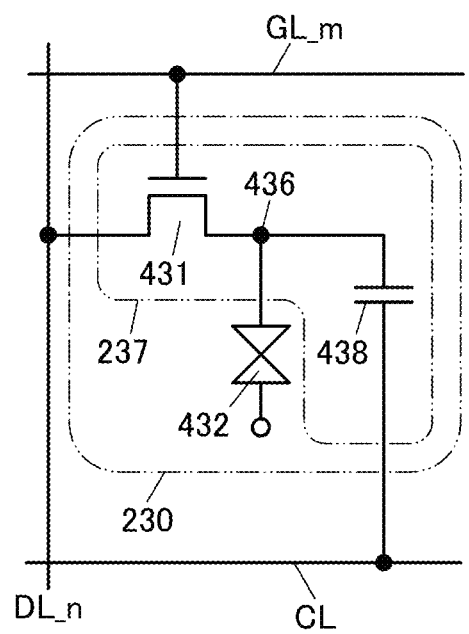

FIGS. 35B and 35C illustrate circuit configurations that can be used for the pixels 230 in the display device illustrated in FIG. 35A.

[Example of Pixel Circuit for Light-Emitting Display Device]

The pixel circuit 237 illustrated in FIG. 35B includes a transistor 431, a capacitor 438, a transistor 433, and a transistor 434. The pixel circuit 237 is electrically connected to the light-emitting element 225 that can function as a display element.

One of a source and a drain of the transistor 431 is electrically connected to a wiring to which a data signal is supplied (hereinafter referred to as a signal line DL_n). A gate of the transistor 431 is electrically connected to a wiring to which a gate signal is supplied (hereinafter referred to as a scan line GL_m).

The transistor 431 has a function of controlling whether to write a data signal to a node 435.

One of a pair of electrodes of the capacitor 438 is electrically connected to the node 435, and the other is electrically connected to a node 437. The other of the source and the drain of the transistor 431 is electrically connected to the node 435.

The capacitor 438 functions as a storage capacitor for storing data written to the node 435.

One of a source and a drain of the transistor 433 is electrically connected to a potential supply line VL_a, and the other is electrically connected to the node 437. A gate of the transistor 433 is electrically connected to the node 435.

One of a source and a drain of the transistor 434 is electrically connected to a potential supply line V0, and the other of the source electrode and the drain electrode of the transistor 434 is electrically connected to the node 437. A gate of the transistor 434 is electrically connected to the scan line GL_m.

One of an anode and a cathode of the light-emitting element 225 is electrically connected to a potential supply line VL_b, and the other is electrically connected to the node 437.

As the light-emitting element 225, an organic electroluminescent element (also referred to as an organic EL element) or the like can be used, for example. Note that the light-emitting element 225 is not limited to organic EL elements; an inorganic EL element including an inorganic material can be used, for example.

As a power supply potential, a potential on the relatively high potential side or a potential on the relatively low potential side can be used, for example. A power supply potential on the high potential side is referred to as a high power supply potential (also referred to as VDD), and a power supply potential on the low potential side is referred to as a low power supply potential (also referred to as VSS). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

A high power supply potential VDD is supplied to one of the potential supply line VL_a and the potential supply line VL_b, and a low power supply potential VSS is supplied to the other, for example.

In the display device including the pixel circuit 237 in FIG. 35B, the pixel circuits 237 are sequentially selected row by row by the circuit 232, whereby the transistors 431 and the transistors 434 are turned on and a data signal is written to the nodes 435.

When the transistors 431 and the transistors 434 are turned off, the pixel circuits 237 in which the data signal has been written to the nodes 435 are brought into a holding state. Furthermore, the amount of current flowing between the source and the drain of the transistor 433 is controlled in accordance with the potential of the data signal written to the node 435. The light-emitting element 225 emits light with a luminance corresponding to the amount of flowing current. This operation is sequentially performed row by row; thus, an image is displayed.

[Example of Pixel Circuit for Liquid Crystal Display Device]

The pixel circuit 237 illustrated in FIG. 35C includes the transistor 431 and the capacitor 438. The pixel circuit 237 is electrically connected to a liquid crystal element 432 that can function as a display element.

The potential of one of a pair of electrodes of the liquid crystal element 432 is set according to the specifications of the pixel circuits 237 as appropriate. The alignment state of the liquid crystal element 432 depends on data written to a node 436. A common potential may be applied to one of the pair of electrodes of the liquid crystal element 432 included in each of the plurality of pixel circuits 237. The potential supplied to one of the pair of electrodes of the liquid crystal element 432 in the pixel circuit 237 in one row may be different from the potential supplied to one of the pair of electrodes of the liquid crystal element 432 in the pixel circuit 237 in another row.

Examples of a method of driving the display device including the liquid crystal element 432 include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the method of driving the display device include an electrically controlled birefringence (ECB) mode, a polymer-dispersed liquid crystal (PDLC) mode, a polymer network liquid crystal (PNLC) mode, and a guest-host mode. Note that one embodiment of the present invention is not limited thereto, and various liquid crystal elements and driving methods can be used.

The liquid crystal element 432 may be formed using a liquid crystal composition including liquid crystal exhibiting a blue phase and a chiral material. The liquid crystal exhibiting a blue phase has a short response time of 1 msec or less. Since the liquid crystal exhibiting a blue phase is optically isotropic, alignment treatment is not necessary and viewing angle dependence is small.

In the pixel circuit 237 in the m-th row and the n-th column, one of the source and the drain of the transistor 431 is electrically connected to the signal line DL_n, and the other is electrically connected to the node 436. The gate of the transistor 431 is electrically connected to the scan line GL_m. The transistor 431 has a function of controlling whether to write a data signal to the node 436.

One of the pair of electrodes of the capacitor 438 is electrically connected to a wiring to which a particular potential is supplied (a capacitor line CL), and the other is electrically connected to the node 436. The other of the pair of electrodes of the liquid crystal element 432 is electrically connected to the node 436. The potential of the capacitor line CL is set in accordance with the specifications of the pixel circuit 237 as appropriate. The capacitor 438 functions as a storage capacitor for storing data written to the node 436.

For example, in the display device including the pixel circuit 237 in FIG. 35C, the pixel circuits 237 are sequentially selected row by row by the circuit 232, whereby the transistors 431 are turned on and a data signal is written to the nodes 436.

When the transistors 431 are turned off, the pixel circuits 237 in which the data signal has been written to the nodes 436 are brought into a holding state. This operation is sequentially performed row by row; thus, an image can be displayed on the display region 231.

[Display Element]

The display device of one embodiment of the present invention can employ various modes and can include various display elements. Examples of the display elements include an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube, which are display media whose contrast, luminance, reflectance, transmittance, or the like is changed by electrical or magnetic action. Alternatively, quantum dots may be used as the display element. Note that examples of display devices having EL elements include an EL display. Examples of display devices including an electron emitter include a field emission display (FED), an SED-type flat panel display (SED: surface-conduction electron-emitter display), and the like. Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. The display device may be a plasma display panel (PDP). The display device may be a retina scanning type projection device.

In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by metal organic chemical vapor deposition (MOCVD). Note that when the graphene is provided, the GaN semiconductor layers included in the LED can also be formed by a sputtering method.

<Example of Method for Manufacturing Display Device>
[Formation of Element Substrate]

Figure 36A:
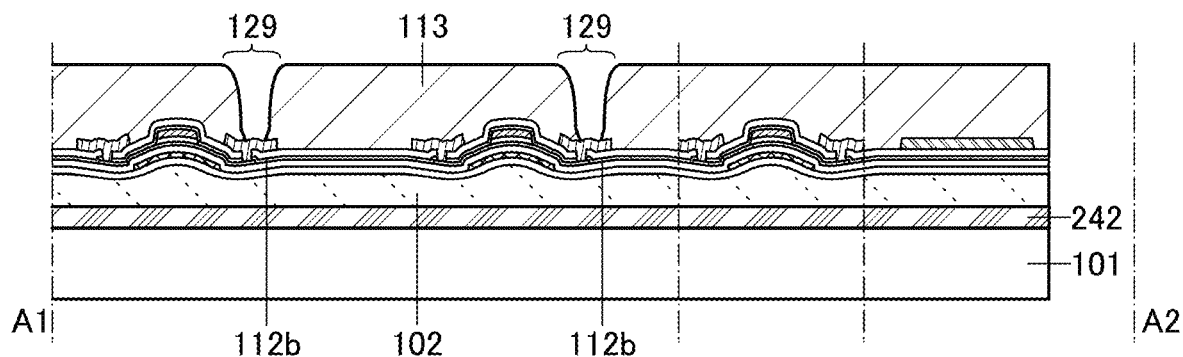
FIGS. 36A to 36D illustrate manufacturing steps of a display device.

First, a separation layer 242 is formed over the substrate 101, and the insulating layer 102 is formed over the separation layer 242 (see FIG. 36A). The subsequent steps are performed as in the manufacturing method described in Embodiment 1, whereby the components up to the insulating layer 113 are formed. In this embodiment, a layer that releases hydrogen by absorbing light and generating heat is used as the separation layer 242. An example of such a layer is a hydrogenated amorphous silicon (a-Si:H) layer. A hydrogenated amorphous silicon layer can be formed by a PECVD method using a deposition gas containing silane ($SiH_4$), for example. Alternatively, the separation layer 242 may be a silicon layer having crystallinity. In order that the separation layer 242 can contain much hydrogen, heat treatment may be performed in an atmosphere containing hydrogen after formation of the separation layer 242.

The thickness of the separation layer 242 is preferably greater than or equal to 1 nm and less than or equal to 200 nm, further preferably greater than or equal to 5 nm and less than or equal to 100 nm, for example.

After the components up to the insulating layer 113 are formed, openings 129 are formed in regions that overlap the electrode 112b. When the insulating layer 113 is formed using a photosensitive material, the opening 129 can be formed without a resist mask. A surface of the electrode 112b is partly exposed at the bottom portion of the opening 129.

Figure 36B:
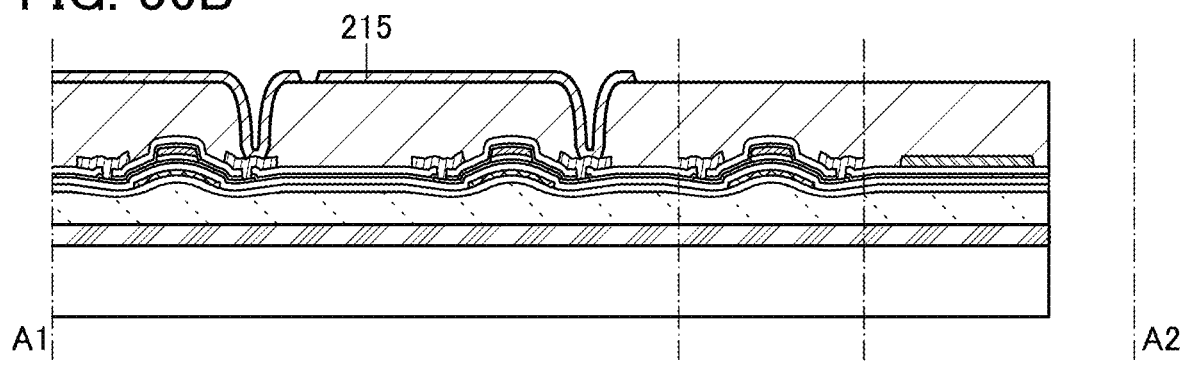

Next, the electrode 215 is formed over the insulating layer 113 (see FIG. 36B). The electrode 215 is preferably formed using a conductive material that efficiently reflects light emitted from the EL layer 217 formed later. Note that the electrode 215 may have a stacked-layer structure of a plurality of layers without limitation to a single-layer structure. For example, in the case where the electrode 215 is used as an anode, a layer in contact with the EL layer 217 may be a light-transmitting layer, such as an indium tin oxide layer, having a work function higher than that of the EL layer 217, and a layer having high reflectance (e.g., aluminum, an alloy containing aluminum, or silver) may be provided in contact with the layer.

The electrode 215 can be formed in such a manner that a conductive layer to be the electrode 215 is formed over the insulating layer 113, a resist mask is formed over the conductive layer, and a region of the conductive layer that is not covered with the resist mask is etched. The conductive layer can be etched by a dry etching method, a wet etching method, or both a dry etching method and a wet etching method. The resist mask can be formed by a photolithography method, a printing method, an inkjet method, or the like as appropriate. Formation of the resist mask by an inkjet method needs no photomask; thus, the manufacturing cost can be reduced. The resist mask is removed after the formation of the electrode 215.

Figure 36C:
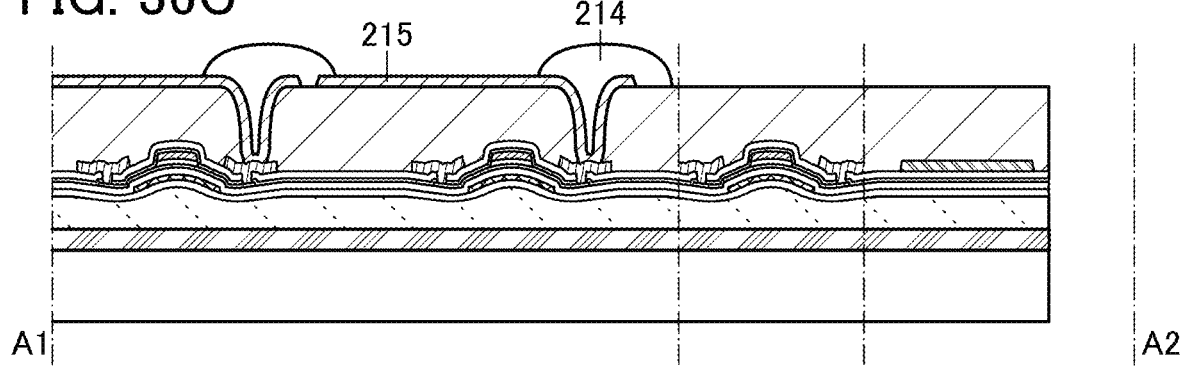

Next, the partition 214 is formed (see FIG. 36C). The partition 214 is provided in order to prevent an unintended electrical short-circuit between the light-emitting elements 225 in adjacent pixels and unintended light emission from the light-emitting elements 225. In the case of using a metal mask for formation of the EL layer 217 described later, the partition 214 has a function of preventing the contact of the metal mask with the electrode 215. The partition 214 can be formed of an organic resin such as an epoxy resin, an acrylic resin, or an imide resin or an inorganic material such as silicon oxide. The partition 214 is preferably formed so that its sidewall has a tapered shape or a tilted surface with a continuous curvature. The sidewall of the partition 214 having the above-described shape enables favorable coverage with the EL layer 217 and the electrode 218 formed later.

Then, the EL layer 217 is formed. A structure of the EL layer 217 is described in Embodiment 8.

The electrode 218 is used as a cathode in this embodiment, and thus is preferably formed using a material that has a low work function and can inject electrons into the EL layer 217. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 218. As the buffer layer, an oxide of an alkaline earth metal, a halide, a magnesium-silver alloy, or the like can also be used.

Figure 36D:
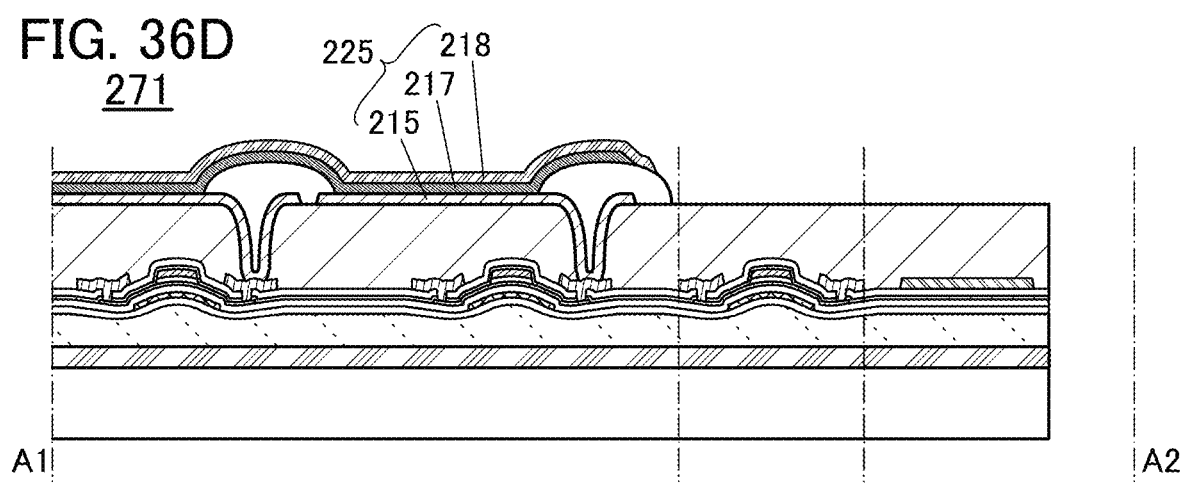

In the case where light emitted from the EL layer 217 is extracted through the electrode 218, the electrode 218 preferably has a property of transmitting visible light. The light-emitting element 225 includes the electrode 215, the EL layer 217, and the electrode 218 (see FIG. 36D).

In this embodiment, the substrate 101 over which the transistor and the light-emitting element 225 are provided is referred to as an element substrate 271.

[Formation of Counter Substrate]

Figure 37A:
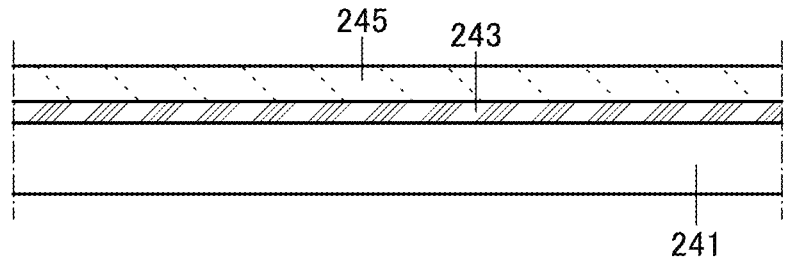
FIGS. 37A to 37D illustrate manufacturing steps of a display device.

A separation layer 243 and the insulating layer 245 are formed over a substrate 241 (see FIG. 37A). The substrate 241 can be formed using a material similar to that of the substrate 101. The separation layer 243 can be formed using a material and a method similar to those of the separation layer 242. The insulating layer 245 can be formed using a material and a method similar to those of the insulating layer 102.

Figure 37B:
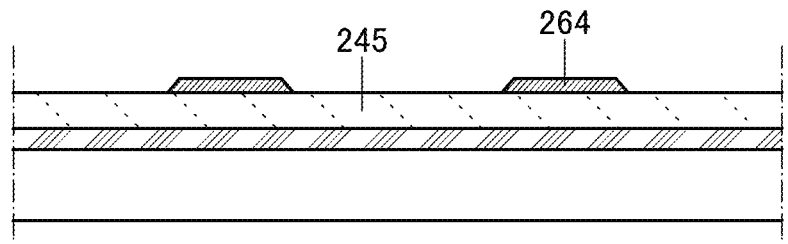
Figure 37C:
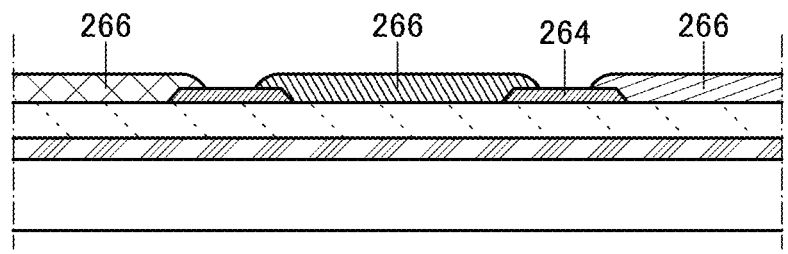

Next, the light-blocking layer 264 is formed over the insulating layer 245 (see FIG. 37B). After that, the coloring layer 266 is formed (see FIG. 37C).

The light-blocking layer 264 and the coloring layer 266 each are formed in a desired position with any of various materials by a printing method, an inkjet method, a photolithography method, or the like.

Figure 37D:
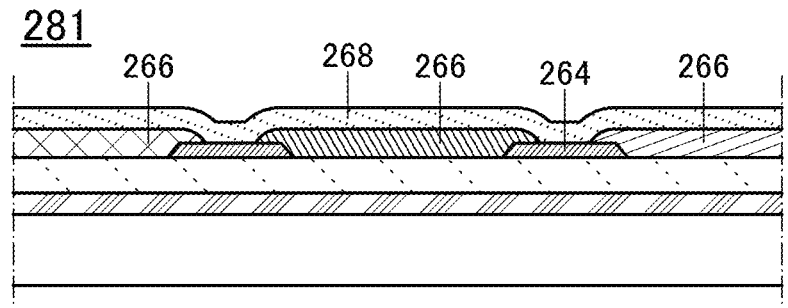

Next, the overcoat layer 268 is formed over the light-blocking layer 264 and the coloring layer 266 (see FIG. 37D).

For the overcoat layer 268, an organic insulating layer of an acrylic resin, an epoxy resin, polyimide, or the like can be used. With the overcoat layer 268, for example, an impurity or the like contained in the coloring layer 266 can be prevented from diffusing to the light-emitting element 225 side. Note that the overcoat layer 268 is not necessarily formed.

A light-transmitting conductive layer may be formed as the overcoat layer 268. The light-transmitting conductive layer is formed as the overcoat layer 268, so that the light emitted from the light-emitting element 225 can be transmitted through the overcoat layer 268, while ionized impurities can be prevented from passing through the overcoat layer 268.

The light-transmitting conductive layer can be formed using, for example, indium oxide, indium tin oxide (ITO), indium zinc oxide, zinc oxide, or zinc oxide to which gallium is added. Graphene or a metal layer that is thin enough to have a light-transmitting property can also be used.

Through the above-described steps, the components such as the coloring layer 266 can be formed over the substrate 241. In this embodiment, the substrate 241 over which the coloring layer 266 and the like are provided is referred to as a counter substrate 281.

[Attachment of Element Substrate to Counter Substrate]

Figure 38:
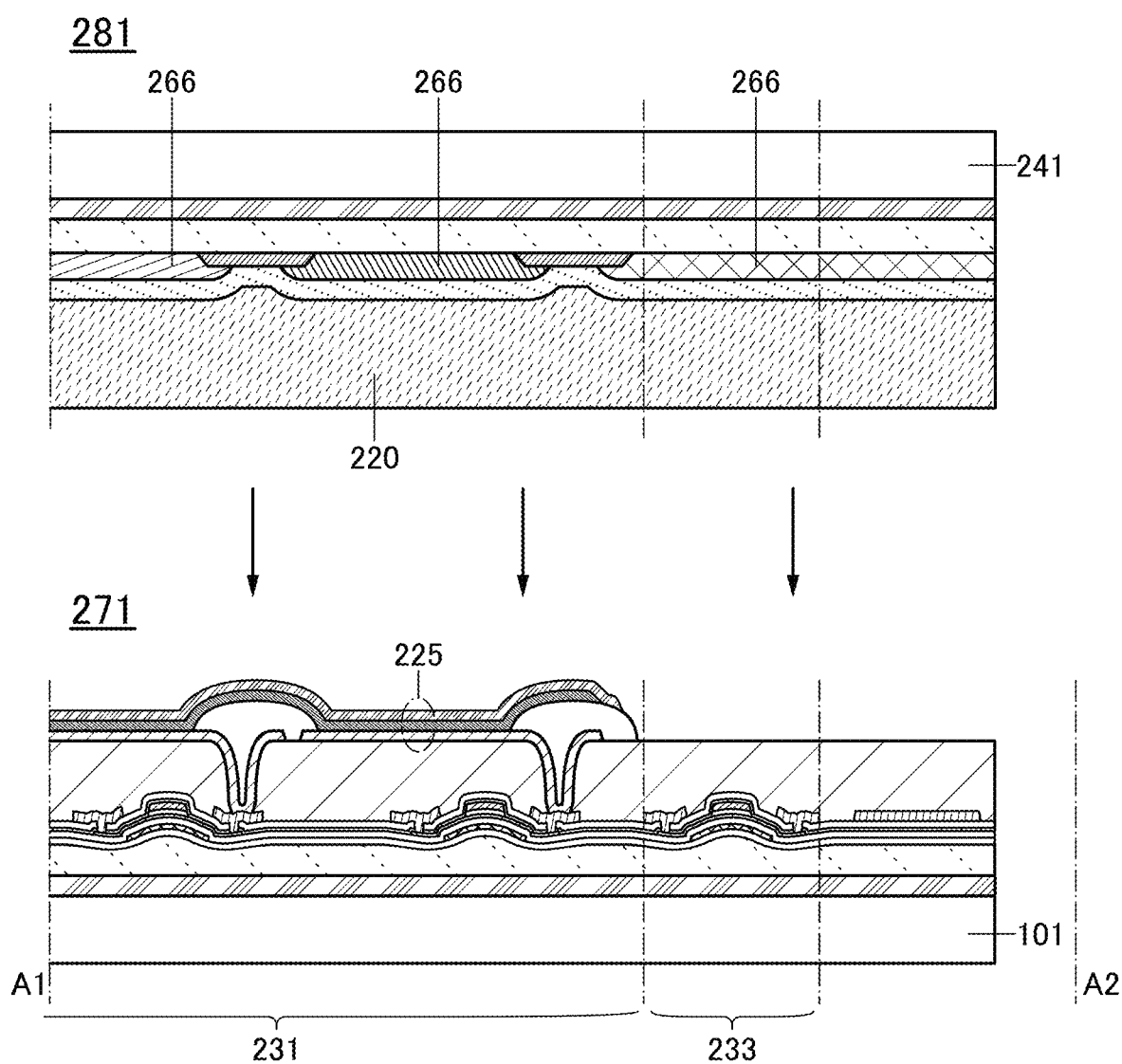
FIG. 38 illustrates a manufacturing step of a display device.

Next, the element substrate 271 is attached to the counter substrate 281 with the bonding layer 220 positioned therebetween such that the light-emitting element 225 included in the element substrate 271 faces the coloring layer 266 included in the counter substrate 281 (see FIG. 38).

A photo-curable adhesive, a reactive curable adhesive, a thermosetting adhesive, or an anaerobic adhesive can be used as the bonding layer 220. For example, an epoxy resin, an acrylic resin, or an imide resin can be used. In a top-emission structure, a drying agent (e.g., zeolite) having a size less than or equal to the wavelength of light or a filler (e.g., titanium oxide or zirconium) with a high refractive index is preferably mixed into the bonding layer 220, in which case the efficiency of extracting light emitted from the EL layer 217 can be improved.

Figure 39A:
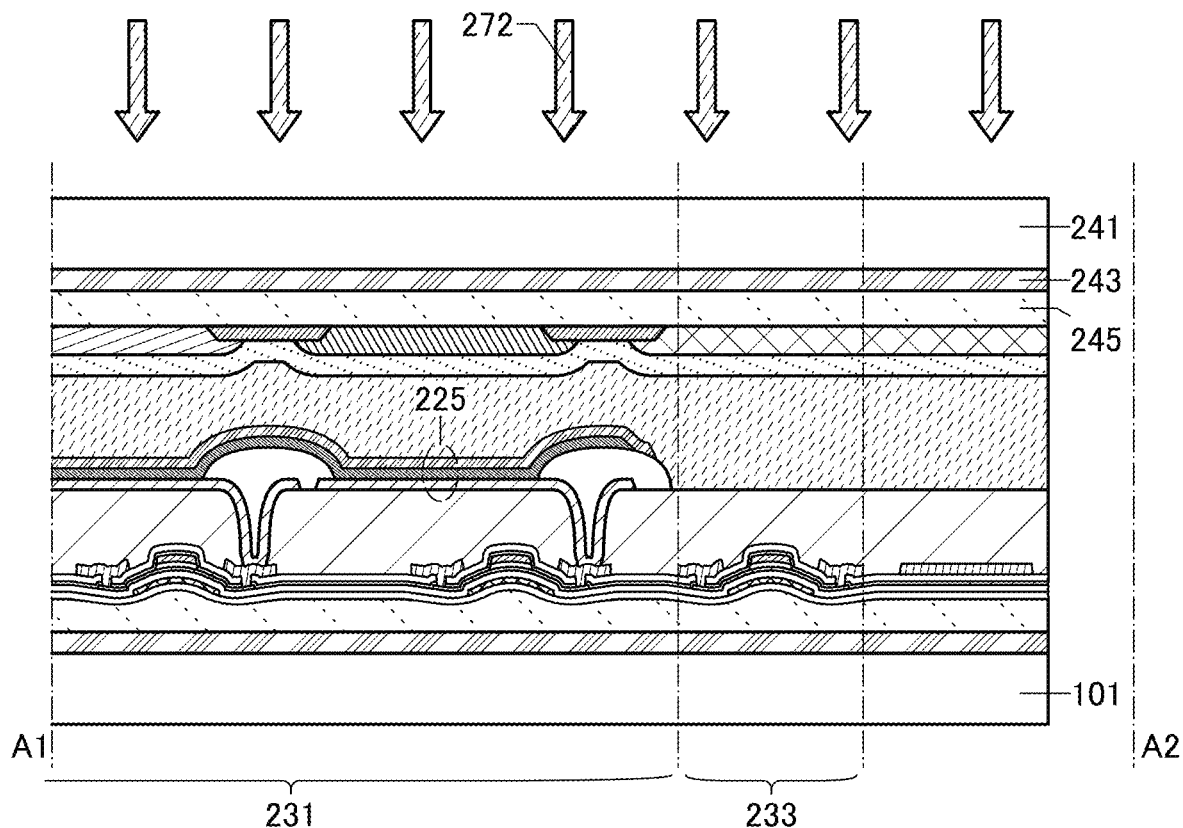
FIGS. 39A and 39B illustrate manufacturing steps of a display device.

Next, the separation layer 243 is irradiated with laser light 272 through the substrate 241 (see FIG. 39A). The region of the separation layer 243 that is subject to separation may be entirely irradiated with the laser light 272 at one time.

Alternatively, the region that is subject to separation may be divided into a plurality of regions and these regions may be irradiated with the laser light 272 one by one. The laser light 272 may be linear laser light.

The region that is subject to separation may be irradiated with the laser light 272 while the laser light 272 and/or the substrate 241 are/is relatively moved. In the case where the laser light 272 is linear laser light, the laser light 272 and/or the substrate 241 are/is moved relatively along the short-axis direction of the laser light 272.

The irradiation with the laser light 272 heats the separation layer 243 and releases hydrogen from the separation layer 243. At this time, the hydrogen is released in a gaseous state. The released gas remains in the vicinity of the interface between the separation layer 243 and the insulating layer 245 or in the vicinity of the interface between the separation layer 243 and the substrate 241. This reduces adhesion, particularly adhesion between the separation layer 243 and the insulating layer 245, which allows the substrate 241 and the separation layer 243 to be easily separated from the insulating layer 245.

Part of the hydrogen contained in the separation layer 243 sometimes remains in the separation layer 243. Thus, the separation layer 243 is embrittled and separation easily occurs in the separation layer 243 in some cases.

The laser light 272 is preferably light at least part of which passes through the substrate 241 and which has a wavelength such that the light is absorbed by the separation layer 243. The laser light 272 is preferably light having a wavelength such that the light is absorbed by the insulating layer 245.

Note that the insulating layer 245 sometimes absorbs part of the laser light 272. Thus, an element such as a transistor is irradiated with the laser light 272 which is transmitted through the separation layer 243 and an adverse effect on the characteristics of the element can be suppressed.

The laser light 272 is preferably light in a wavelength range from visible light to ultraviolet light. For example, light having a wavelength of greater than or equal to 200 nm and less than or equal to 400 nm, preferably greater than or equal to 250 nm and less than or equal to 350 nm can be used. In particular, an excimer laser having a wavelength of 308 nm is preferably used because the productivity is increased. The excimer laser is preferable because the excimer laser can be used also for laser crystallization of low-temperature polysilicon (LTPS), so that the existing LTPS production line device can be used and new capital investment is not necessary. Alternatively, a solid-state UV laser (also referred to as a semiconductor UV laser), such as a UV laser having a wavelength of 355 nm which is the third harmonic of an Nd:YAG laser, may be used. A solid-state laser is preferable because it does not use a gas and thus the running cost can be reduced to approximately ⅓ of the case of using an excimer laser. Further alternatively, a pulsed laser such as a picosecond laser may be used.

Figure 39B:
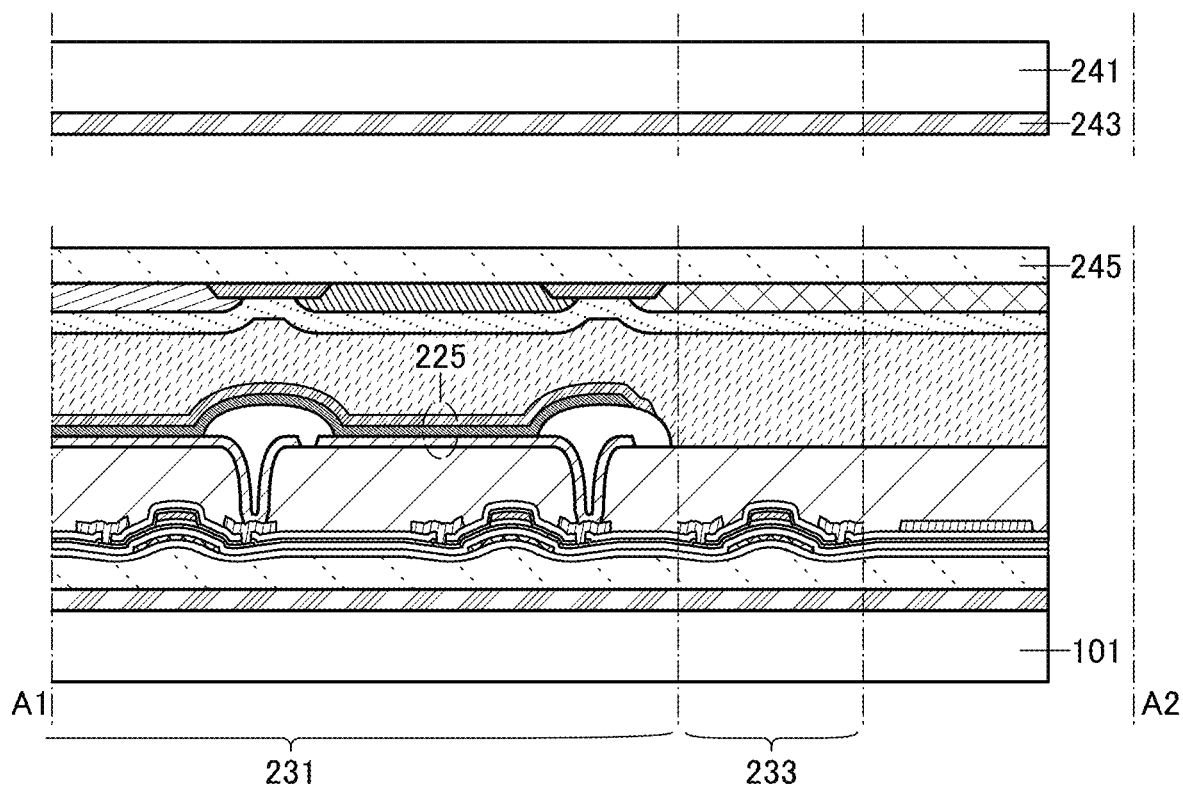

Next, the substrate 241 and the separation layer 243 are separated from the insulating layer 245 (see FIG. 39B). For example, the separation of the substrate 241 and the separation layer 243 from the insulating layer 245 can be performed by applying tensile stress to the substrate 241 perpendicularly. Specifically, the substrate 241 and the separation layer 243 can be peeled by pulling up the substrate 241 by part of its suction-attached top surface. At this time, the separation trigger is preferably formed by inserting a sharp instrument such as a knife between the substrate 241 and the insulating layer 245.

Figure 40A:
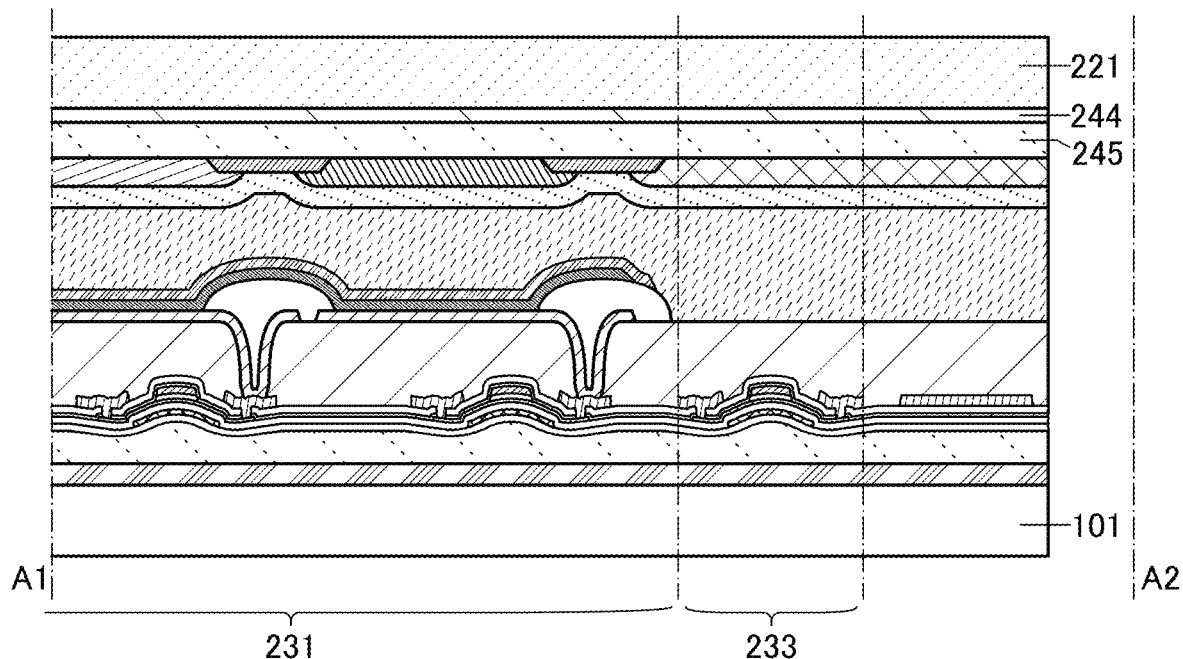
FIGS. 40A and 40B illustrate manufacturing steps of a display device.

Then, the substrate 221 is attached to the insulating layer 245 with the adhesive layer 244 positioned therebetween (see FIG. 40A). Any of a variety of curable adhesives, e.g., photo-curable adhesives such as a UV curable adhesive, a reactive curable adhesive, a thermosetting adhesive, and an anaerobic adhesive, can be used for the adhesive layer 244. Still alternatively, an adhesive sheet or the like may be used.

Figure 40B:
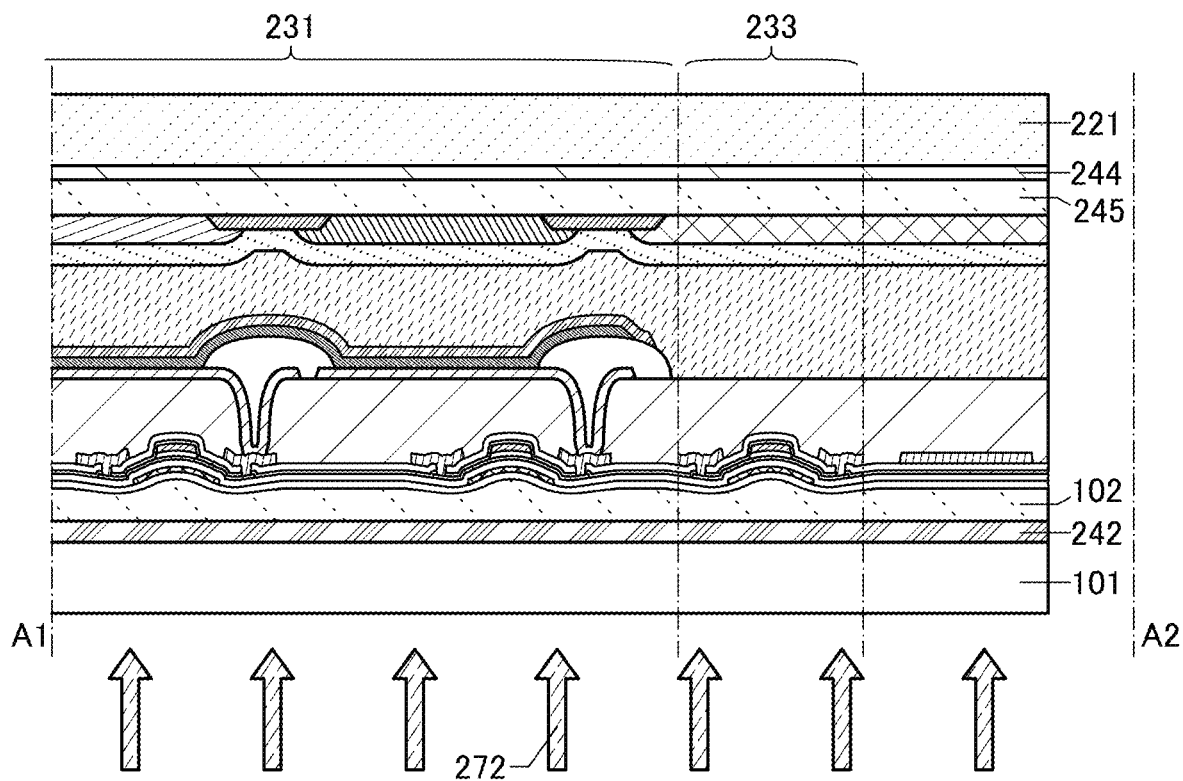

Next, the separation layer 242 is irradiated with the laser light 272 through the substrate 101 (see FIG. 40B). The region of the separation layer 242 that is subject to separation may be entirely irradiated with the laser light 272 at one time. Alternatively, the region that is subject to separation may be divided into a plurality of regions and these regions may be irradiated with the laser light 272 one by one. The laser light 272 may be linear laser light.

Figure 41A:
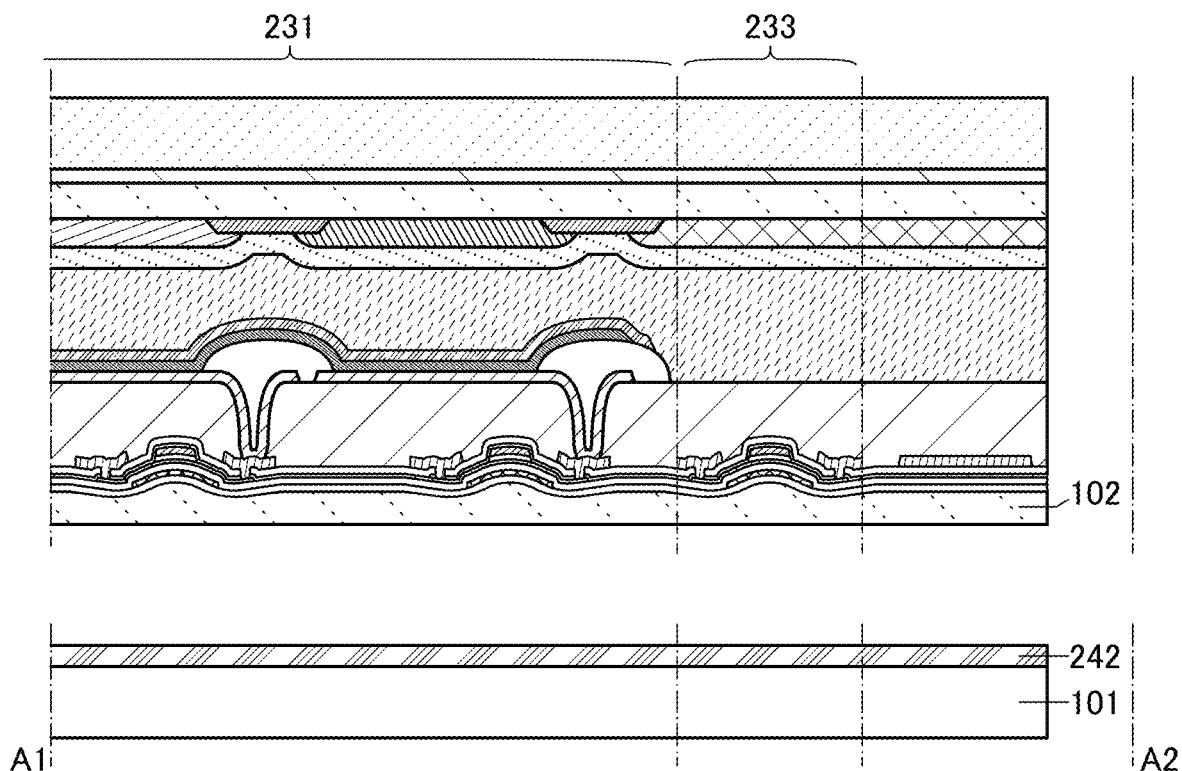
FIGS. 41A and 41B illustrate manufacturing steps of a display device.

Next, the substrate 101 and the separation layer 242 are separated from the insulating layer 245 (see FIG. 41A). The separation of the substrate 101 and the separation layer 242 from the insulating layer 245 can be performed in a manner similar to that of the above-described separation of the substrate 241 and the separation layer 243 from the insulating layer 245.

Figure 41B:
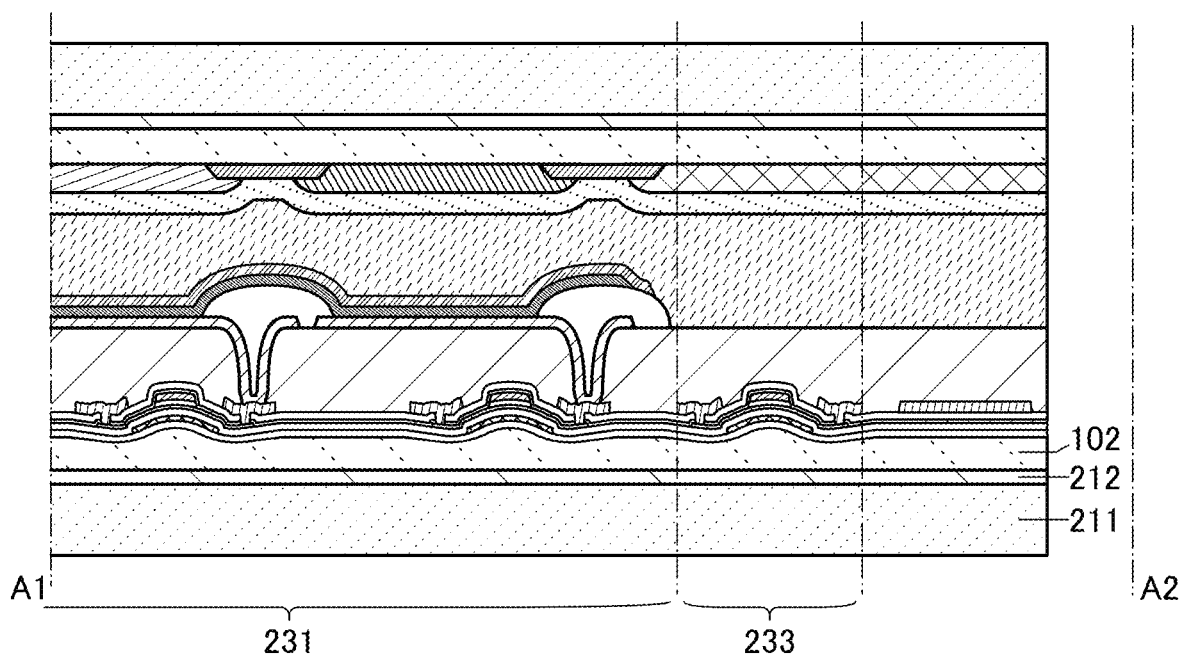

Next, the substrate 211 is attached to the insulating layer 245 with the bonding layer 212 positioned therebetween (see FIG. 41B). For the adhesive layer 212, a material similar to that of the adhesive layer 244 can be used. For the substrate 211, a material similar to that of the substrate 221 can be used.

Figure 42A:
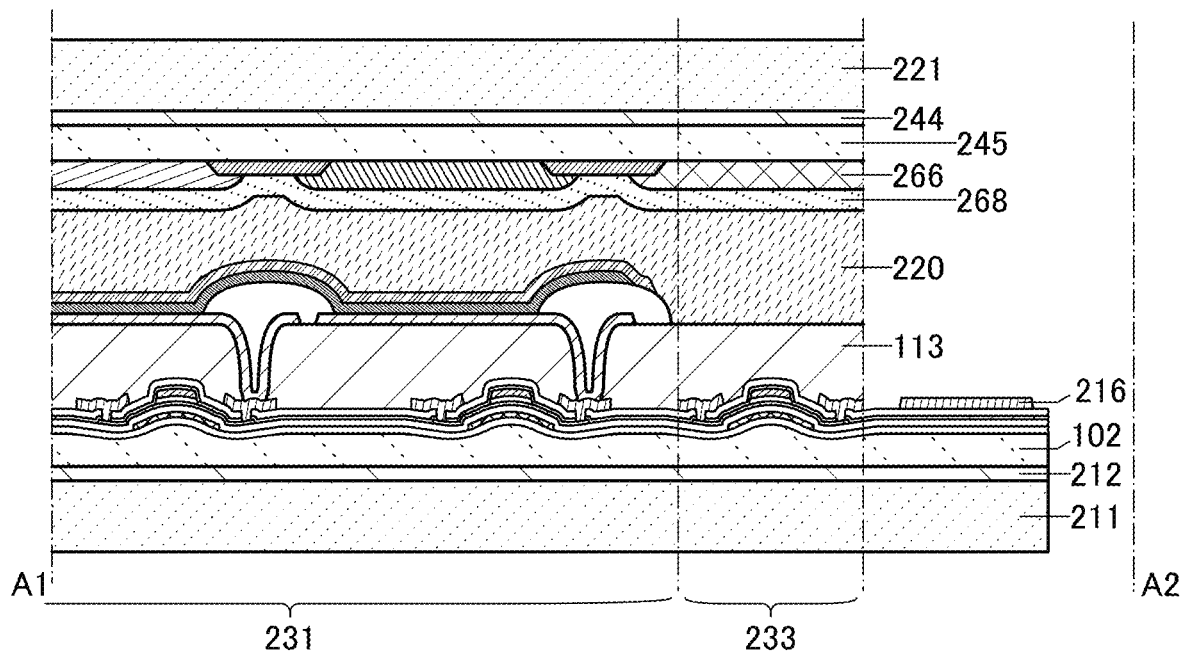
FIGS. 42A and 42B illustrate manufacturing steps of a display device.

After that, the insulating layer 113, the adhesive layer 220, the overcoat layer 268, the coloring layer 266, the insulating layer 245, the adhesive layer 244, and the substrate 221 are partly removed to expose the terminal electrode 216 (see FIG. 42A).

Figure 42B:
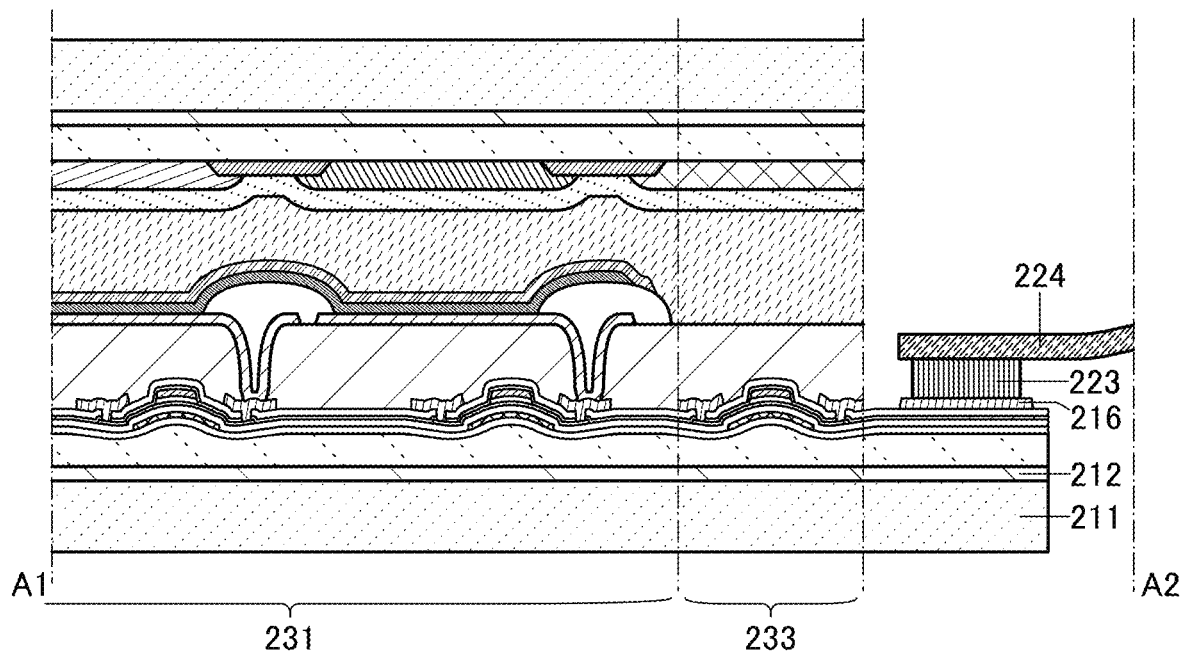

Then, the FPC 224 is electrically connected to the terminal electrode 216 through the anisotropic conductive layer 223 (see FIG. 42B). In the above-described manner, the display device 200 to which the FPC 224 is connected can be fabricated.

This embodiment can be implemented in appropriate combination with any of the structures described in the other embodiments and the like.

Embodiment 6

This embodiment describes another example of a display device. In this embodiment, a description is made of portions different from the above embodiments to avoid repetition of the same description. Other embodiments and the like can be referred to for the portions that are not described in this embodiment.

Figure 43A:
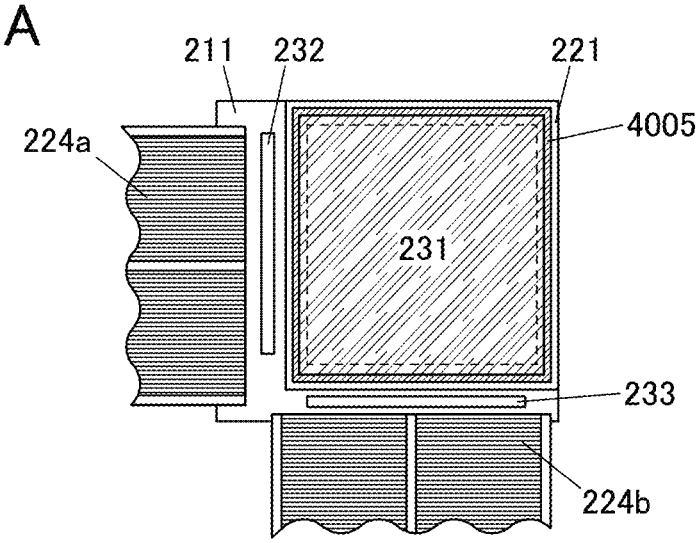
FIGS. 43A to 43C each illustrate a display device.
Figure 43B:
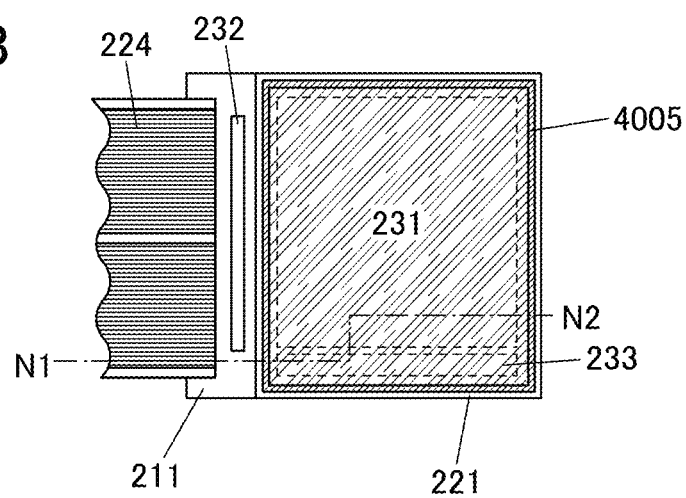
Figure 43C:
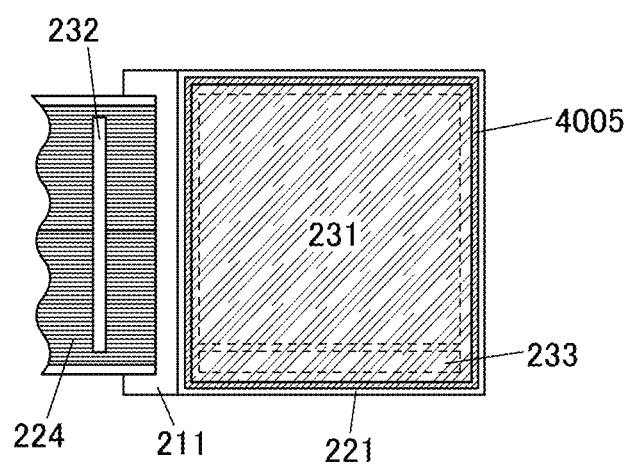

FIGS. 43A to 43C are plan views of display devices in this embodiment. In FIG. 43A, a sealant 4005 is provided to surround the display region 231. A region of the substrate 211 and a region of the substrate 221 overlap each other with the sealant 4005 positioned therebetween. A region of the substrate 211 and a region of the substrate 221 overlap each other with the display region 231 positioned therebetween.

Over the substrate 211 of the display device illustrated in FIG. 43A, the circuits 232 and 233 formed using a single crystal semiconductor or a polycrystalline semiconductor over separately prepared substrates are mounted in regions other than the region surrounded by the sealant 4005. The circuit 232 serves as a signal line driver circuit, for example. The circuit 233 serves as a scan line driver circuit, for example.

Signals and potentials are supplied from an FPC 224a and an FPC 224b to the circuit 232, the circuit 233, or the display region 231.

In FIGS. 43B and 43C, the sealant 4005 is provided to surround the display region 231 and the circuit 233 that are provided over the substrate 211. A region of the substrate 211 and a region of the substrate 221 overlap each other with the sealant 4005 positioned therebetween. A region of the substrate 211 and a region of the substrate 221 overlap each other with the display region 231 positioned therebetween. A region of the substrate 211 and a region of the substrate 221 overlap each other with the circuit 233 positioned therebetween.

The display region 231 and the circuit 233 are sealed together with a display element by the substrate 211, the sealant 4005, and the substrate 221. Over the substrate 211 in FIGS. 43B and 43C, the circuit 232 that is formed using a single crystal semiconductor or a polycrystalline semiconductor over a separately prepared substrate is mounted in a region other than the region surrounded by the sealant 4005.

In FIG. 43A, the circuit 232 is mounted over the substrate 211 in a region between the display region 231 and the FPC 224a. The circuit 233 is mounted over the substrate 211 in a region between the display region 231 and the FPC 224b. In FIG. 43B, the circuit 232 is mounted over the substrate 211 in a region between the display region 231 and the FPC 224. In FIG. 43C, the circuit 232 is mounted over the FPC 224.

The circuit 232 is not necessarily formed separately and mounted over the substrate 211 or the FPC 224 as in the examples illustrated in FIGS. 43B and 43C. For example, part of a circuit included in the circuit 232 may be provided over the substrate 211 in a region surrounded by the sealant 4005. Alternatively, part of a circuit included in the circuit 232 may be mounted over the FPC 224.

The connection method of a separately formed driver circuit is not particularly limited; wire bonding, a chip on glass (COG), a tape carrier package (TCP), a chip on film (COF), or the like can be used. FIG. 43A illustrates an example in which the circuit 232 and the circuit 233 are mounted by a COG. FIG. 43B illustrates an example in which the circuit 232 is mounted by a COG. FIG. 43C illustrates an example in which the circuit 232 is mounted by a TCP.

In some cases, the display device encompasses a panel in which a display element is sealed, and a module in which an IC or the like including a controller is mounted on the panel.

Figure 44:
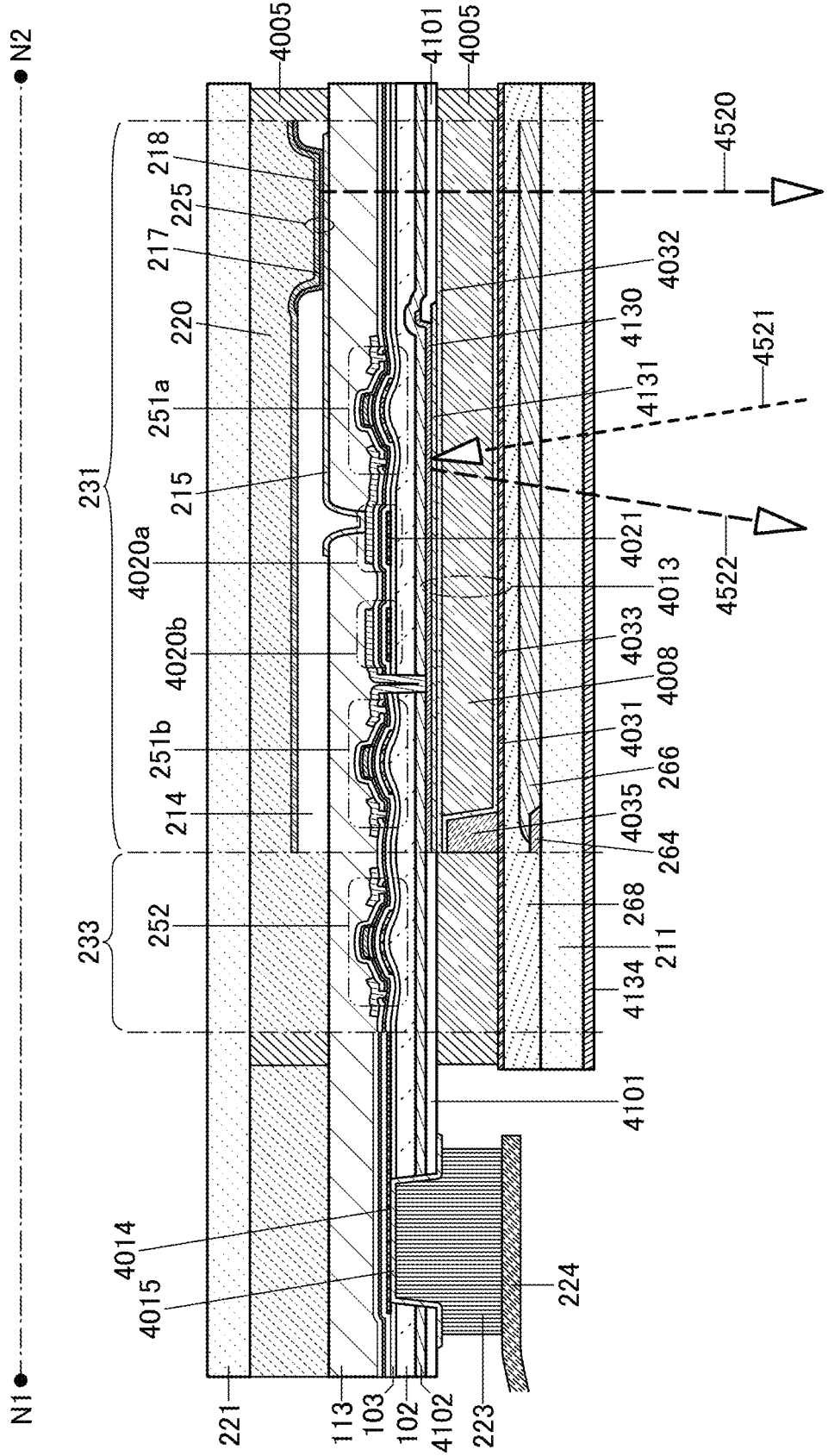
FIG. 44 illustrates a display device.

FIG. 44 shows an example of a cross-sectional structure of a display device including an EL element and a liquid crystal element in one pixel. Note that description is made mainly on portions different from the display device in FIGS. 34A and 34B to avoid repeated description. FIG. 44 corresponds to a cross-sectional view taken along dashed-dotted line N1-N2 in FIG. 43B. As shown in FIG. 44, the display device has an electrode 4015, and the electrode 4015 is electrically connected to a terminal included in the FPC 224 through the anisotropic conductive layer 223. The electrode 4015 is electrically connected to a wiring 4014 in an opening that is provided in the insulating layer 4101, the insulating layer 4102, the insulating layer 102, and the insulating layer 103.

The electrode 4015 is formed using the same conductive layer as the electrode 4131. The wiring 4014 is formed using the same conductive layer as the conductive layer for forming the electrodes 104 of a transistor 251a, a transistor 251b, and the transistor 252.

FIG. 44 illustrates the transistors 251a and 251b that are included in the display region 231 and the transistor 252 that is included in the circuit 233. The display device illustrated in FIG. 44 includes the transistor 251a, the transistor 251b, the transistor 252, a capacitor 4020a, and a capacitor 4020b over the insulating layer 102. The transistors 251a and 251b have the same structure as the transistor 251. The capacitor 4020a has a region where the electrode 4021 and part of the electrode 112a or the electrode 112b of the transistor 251a overlap each other with an insulating layer positioned therebetween. The electrode 4021 is formed using the same conductive layer as the electrode 104 of the transistor 251a. The capacitor 4020b has the same structure as the capacitor 4020a. The transistor 251a has a function of driving the light-emitting element 225 and the transistor 251b has a function of driving a liquid crystal element 4013.

The display device illustrated in FIG. 44 includes the insulating layer 4102 below the insulating layer 102. The display device includes, below the insulating layer 4102, a reflective electrode 4130, the insulating layer 4101, the electrode 4131, an alignment film 4032, a liquid crystal layer 4008, an alignment film 4033, a spacer 4035, an electrode 4031, the overcoat layer 268, the coloring layer 266, the substrate 211, and a polarizing plate 4134.

The liquid crystal element 4013 includes the electrode 4131, the electrode 4031, and the liquid crystal layer 4008. In the display device illustrated in FIG. 44, the alignment films 4032 and 4033 are provided so that the liquid crystal layer 4008 is positioned therebetween. A region of the electrode 4131 and a region of the electrode 4031 overlap each other with the liquid crystal layer 4008 positioned therebetween. The electrode 4131 has a region overlapped by the reflective electrode 4130. In addition, the electrode 4131 is electrically connected to one of a source and a drain of the transistor 251b through the reflective electrode 4130.

The spacer 4035 is a columnar spacer obtained by selective etching of an insulating layer and is provided in order to control the distance between the electrode 4131 and the electrode 4031 (a cell gap). Alternatively, a spherical spacer may be used as the spacer 4035.

The display device illustrated in FIG. 44 has functions as a light-emitting display device having a bottom emission structure and as a reflective liquid crystal display device. In the display device illustrated in FIG. 44, the coloring layer 266, the light-blocking layer 264, and the overcoat layer 268 are provided on the substrate 211 side.

Light 4520 emitted from the light-emitting element 225 is extracted through the substrate 211. Light 4521 entering through the substrate 211 is reflected by the reflective electrode 4130 and extracted through the substrate 211. When the light 4521 is transmitted through the coloring layer 266, light in a specific wavelength range is absorbed, so that the light 4521 becomes light 4522 in a wavelength range different from that of the light 4521. However, if the wavelength range of the entering light 4521 is within the wavelength range of light transmitted through the coloring layer 266, the wavelength range of the light 4522 is almost the same as that of the light 4521.

The insulating layers 4101 and 4102 can each be formed using a material and a method that are similar to those of the insulating layer 103 or the like. The reflective electrode 4130, the electrode 4131, and the electrode 4031 can each be formed using a material and a method that are similar to those of the electrode 104 or the like. In the display device illustrated in FIG. 44, the reflective electrode 4130 is formed using a conductive material having high light reflectivity and the electrodes 4131 and 4031 are formed using a conductive material having a light-transmitting property.

This embodiment can be implemented in appropriate combination with any of the structures described in the other embodiments and the like.

Embodiment 7

Figure 45:
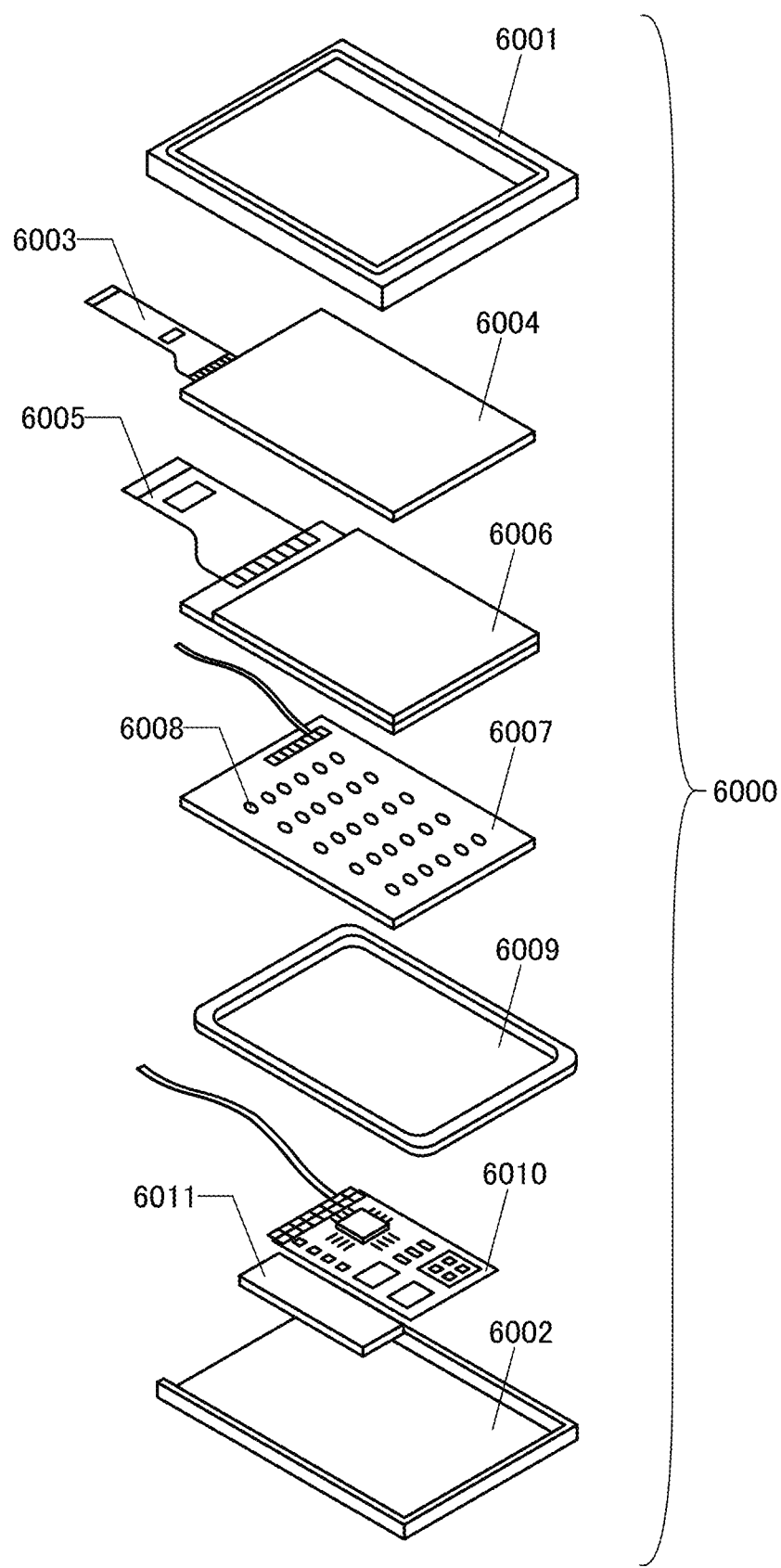
FIG. 45 illustrates an example of a display module.

In this embodiment, a display module is described as an example of a semiconductor device using the above-described transistor. In a display module 6000 illustrated in FIG. 45, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

A semiconductor device of one embodiment of the present invention can be used, for example, for the touch sensor 6004, the display panel 6006, and an integrated circuit mounted on the printed circuit board 6010. For example, the above-described display device can be used for the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch panel or a capacitive touch panel and can overlap the display panel 6006. A touch sensor function can be added to the display panel 6006. For example, an electrode for a touch sensor can be provided in each pixel of the display panel 6006 so that a capacitive touch sensor function is added. Alternatively, a photosensor can be provided in each pixel of the display panel 6006 so that an optical touch sensor function is added. In the case where the touch sensor 6004 is not necessarily provided, the touch sensor 6004 can be omitted.

The backlight unit 6007 includes a light source 6008. The light source 6008 may be provided at an end portion of the backlight unit 6007, and a light diffusing plate may be used. When a light-emitting display device or the like is used for the display panel 6006, the backlight unit 6007 can be omitted.

The frame 6009 protects the display panel 6006 and functions as an electromagnetic shield for blocking electromagnetic waves generated from the printed circuit board 6010 side. The frame 6009 may also function as a radiator plate.

The printed circuit board 6010 includes a power supply circuit, a signal processing circuit for outputting a video signal and a clock signal, and the like. As a power source for supplying power to the power supply circuit, the battery 6011 or a commercial power source may be used. Note that the battery 6011 can be omitted when a commercial power source is used as the power source.

The display module 6000 can be additionally provided with a polarizing plate, a retardation plate, a prism sheet, or the like.

This embodiment can be implemented in appropriate combination with any of the structures described in the other embodiments and the like.

Embodiment 8

In this embodiment, structure examples of a light-emitting element that can be used as the light-emitting element 225 will be described. Note that an EL layer 320 described in this embodiment corresponds to the EL layer 217 described in the above embodiment.

<Structure of Light-Emitting Element>

Figure 46A:
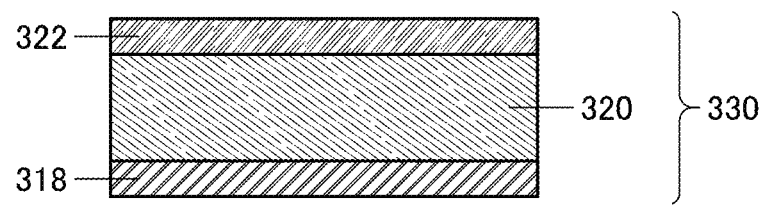
FIGS. 46A and 46B each illustrate a structure example of a light-emitting element.

In a light-emitting element 330 illustrated in FIG. 46A, the EL layer 320 is sandwiched between a pair of electrodes (electrodes 318 and 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in appropriate combination.

The light-emitting element 330 illustrated in FIG. 46A emits light when current flows by applying a potential difference between the electrode 318 and the electrode 322 and holes and electrons are recombined in the EL layer 320. In other words, a light-emitting region is formed in the EL layer 320.

In one embodiment of the present invention, light emitted from the light-emitting element 330 is extracted to the outside from the electrode 318 side or the electrode 322 side. Thus, one of the electrodes 318 and 322 is formed using a light-transmitting substance.

Figure 46B:
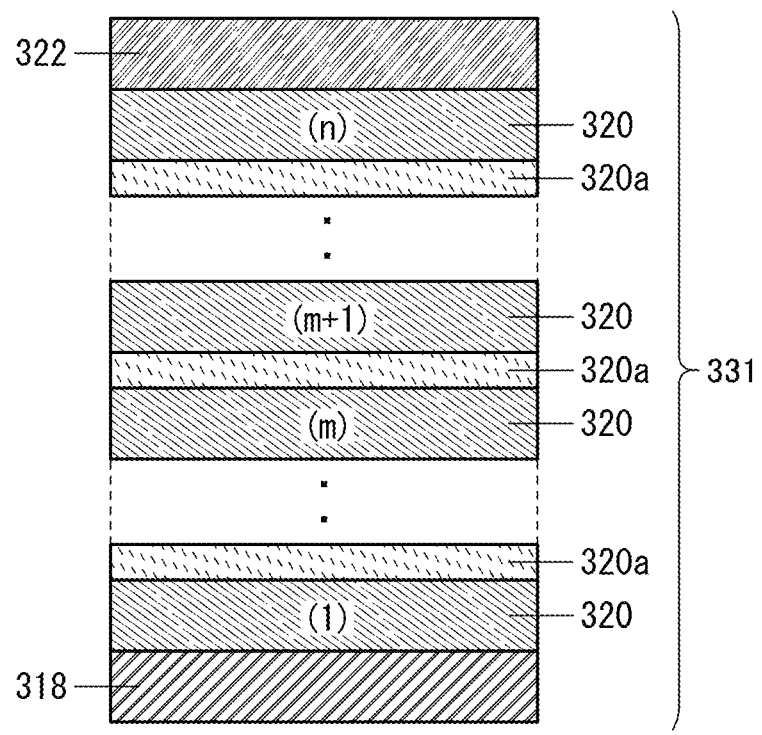

Note that a plurality of EL layers 320 may be stacked between the electrode 318 and the electrode 322 as in a light-emitting element 331 illustrated in FIG. 46B. In the case where n (n is a natural number of 2 or more) layers are stacked, an electric charge generation layer 320a is preferably provided between an m-th EL layer 320 and an (m+1)th EL layer 320. Note that m is a natural number greater than or equal to 1 and less than n.

The electric charge generation layer 320a can be formed using a composite material of an organic compound and a metal oxide, a metal oxide, or a composite material of an organic compound and an alkali metal, an alkaline earth metal, or a compound thereof; alternatively, these materials can be combined as appropriate. Examples of the composite material of an organic compound and a metal oxide include composite materials of an organic compound and a metal oxide such as vanadium oxide, molybdenum oxide, and tungsten oxide. As the organic compound, a variety of compounds can be used; for example, low molecular compounds such as an aromatic amine compound, a carbazole derivative, and an aromatic hydrocarbon and oligomers, dendrimers, and polymers of these low molecular compounds. Note that as the organic compound, it is preferable to use an organic compound that has a hole-transport property and has a hole mobility of $10^{-6}$ cm$^2$/Vs or higher. However, other substances may be used as long as their hole-transport properties are higher than their electron-transport properties. These materials used for the electric charge generation layer 320a have excellent carrier-injection properties and carrier-transport properties; thus, the light-emitting element 331 can be driven with low current and with low voltage.

Note that the electric charge generation layer 320a may be formed by a combination of a composite material of an organic compound and a metal oxide with another material. For example, the electric charge generation layer 320a may be formed by a combination of a layer containing the composite material of an organic compound and a metal oxide with a layer containing one compound selected from electron-donating substances and a compound having a high electron-transport property. Furthermore, the electric charge generation layer 320a may be formed by a combination of a layer containing the composite material of an organic compound and a metal oxide with a transparent conductive film.

The light-emitting element 331 having such a structure is unlikely to suffer the problem of energy transfer, quenching, or the like and has an expanded choice of materials, and thus can easily have both high emission efficiency and a long lifetime. Moreover, it is easy to obtain phosphorescence from one light-emitting layer and fluorescence from the other light-emitting layer.

The electric charge generation layer 320a has a function of injecting holes to one of the EL layers 320 that is in contact with the electric charge generation layer 320a and a function of injecting electrons to the other EL layer 320 that is in contact with the electric charge generation layer 320a, when voltage is applied to the electrodes 318 and 322.

The light-emitting element 331 illustrated in FIG. 46B can provide a variety of emission colors by changing the type of the light-emitting substance used for the EL layers 320. In addition, a plurality of light-emitting substances having different emission colors may be used as the light-emitting substances, so that light emission having a broad spectrum or white light emission can be obtained.

In the case of obtaining white light emission using the light-emitting element 331 in FIG. 46B, as for a combination of a plurality of EL layers, a structure for emitting white light including red light, blue light, and green light may be used. For example, the structure may include a light-emitting layer containing a blue fluorescent substance as a light-emitting substance and a light-emitting layer containing green and red phosphorescent substances as light-emitting substances. Alternatively, the structure may include a light-emitting layer emitting red light, a light-emitting layer emitting green light, and a light-emitting layer emitting blue light. Further alternatively, with a structure including light-emitting layers emitting light of complementary colors, white light emission can be obtained. In a stacked-layer element including two light-emitting layers in which light emitted from one of the light-emitting layers and light emitted from the other light-emitting layer have complementary colors to each other, the combinations of colors are as follows: blue and yellow, blue-green and red, and the like.

Note that in the structure of the above-described stacked-layer element, by providing the electric charge generation layer between the stacked light-emitting layers, the element can have a long lifetime in a high-luminance region while keeping the current density low. In addition, the voltage drop due to the resistance of the electrode material can be reduced, whereby uniform light emission in a large area is possible.

When the light-emitting element 330 or the light-emitting element 331 has a micro optical resonator (also referred to as microcavity) structure which allows light emitted from the EL layer 320 to resonate, lights with different wavelengths and narrowed spectra can be extracted even when one EL layer 320 is used for different light-emitting elements 330 or different light-emitting elements 331. The light-emitting element 330 and the light-emitting element 331 described in this embodiment can be used as the light-emitting element 225.

This embodiment can be implemented in appropriate combination with any of the structures described in the other embodiments.

Embodiment 9

A transistor and/or a semiconductor device of one embodiment of the present invention can be used in a variety of electronic devices. FIGS. 47A to 47G and FIGS. 48A and 48B illustrate examples of electronic devices including the transistor and/or the semiconductor device of one embodiment of the present invention.

Examples of electronic devices including the semiconductor device of one embodiment of the present invention are display devices of televisions, monitors, and the like; lighting devices; desktop personal computers and laptop personal computers; word processors; image reproduction devices that reproduce still images and moving images stored in recording media such as digital versatile discs (DVD); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information appliances; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects driven by electric motors using electric power from the power storage devices are also included in the category of electronic devices. Examples of the moving objects include electric vehicles (EV), hybrid electric vehicles (HEV) that include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecrafts.

Electronic devices illustrated in FIGS. 47A to 47G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 47A to 47G have a variety of functions. For example, the electronic devices in FIGS. 47A to 47G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 47A to 47G are not limited to the above, and the electronic devices can have a variety of functions. Although not illustrated in FIGS. 47A to 47G, the electronic devices may have a plurality of display portions. The electronic devices may be provided with a camera or the like and have a function of taking a still image, a function of taking a moving image, a function of storing the taken image in a memory medium (an external memory medium or a memory medium incorporated in the camera), a function of displaying the taken image on the display portion, or the like.

Figure 47A:
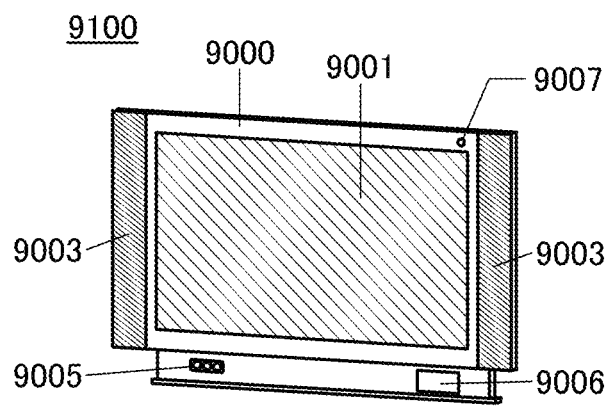
FIGS. 47A to 47G each illustrate an example of an electronic device.

FIG. 47A is a perspective view of a television device 9100. The television device 9100 can include the display portion 9001 having a large screen size of, for example, 50 inches or more, or 100 inches or more.

Figure 47D:
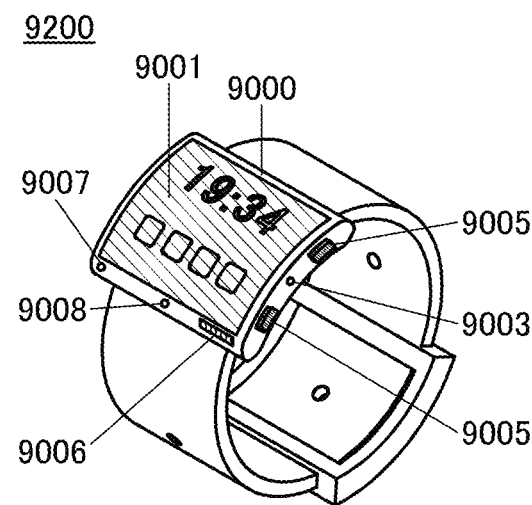
Figure 47B:
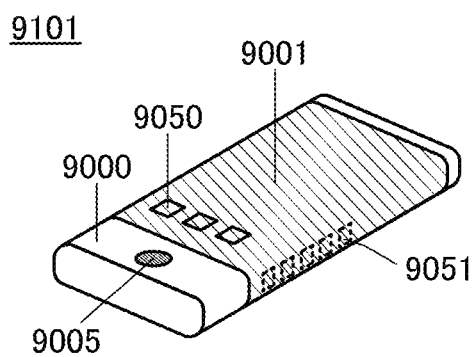

FIG. 47B is a perspective view of a portable information appliance 9101. The portable information appliance 9101 functions as, for example, one or more of a telephone set, a notebook, and an information browsing system. Specifically, the portable information appliance can be used as a smartphone. Note that the portable information appliance 9101 may include the speaker 9003, the connection terminal 9006, the sensor 9007, or the like. The portable information appliance 9101 can display letters and image information on its plurality of surfaces. For example, three operation buttons 9050 (also referred to as operation icons, or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 47E:
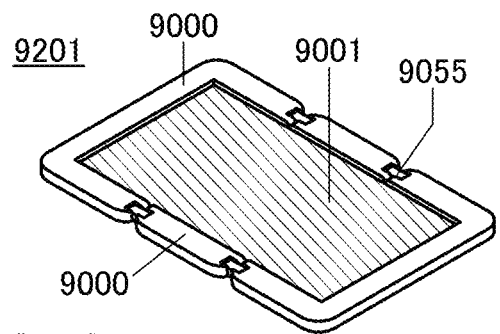
Figure 47C:
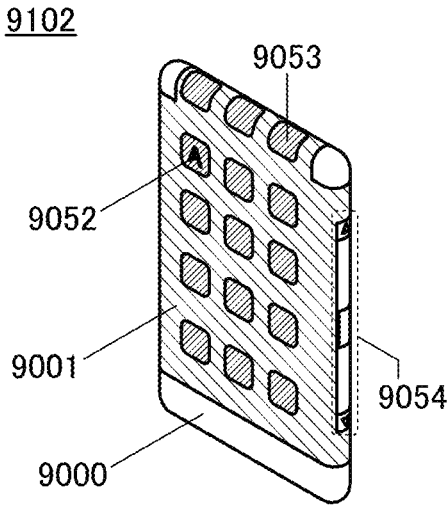

FIG. 47C is a perspective view of a portable information appliance 9102. The portable information appliance 9102 has a function of displaying information on three or more surfaces of the display portion 9001. Here, information 9052, information 9053, and information 9054 are displayed on different surfaces. For example, a user of the portable information appliance 9102 can see the display (here, the information 9053) with the portable information appliance 9102 put in a breast pocket of his/her clothes. Specifically, a caller's phone number, name, or the like of an incoming call is displayed in a position that can be seen from above the portable information appliance 9102. Thus, the user can see the display without taking out the portable information appliance 9102 from the pocket and decide whether to answer the call.

FIG. 47D is a perspective view of a watch-type portable information appliance 9200. The portable information appliance 9200 is capable of executing a variety of applications such as mobile phone calls, e-mailing, viewing and editing texts, music reproduction, Internet communication, and computer games. The display surface of the display portion 9001 is curved, and images can be displayed on the curved display surface. The portable information appliance 9200 can employ near field communication based on an existing communication standard. In that case, for example, mutual communication between the portable information appliance 9200 and a headset capable of wireless communication can be performed, and thus hands-free calling is possible. The portable information appliance 9200 includes the connection terminal 9006, and data can be directly transmitted to and received from another information appliance via a connector. Power charging through the connection terminal 9006 is possible. Note that the charging operation may be performed by wireless power feeding without using the connection terminal 9006.

Figure 47F:
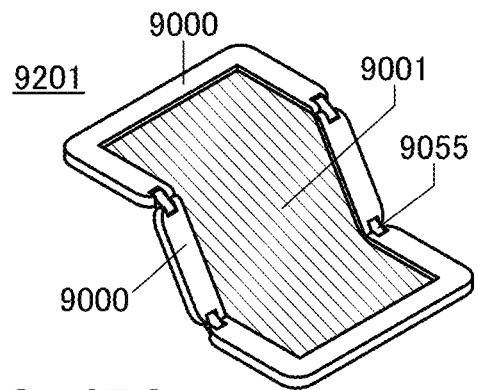
Figure 47G:
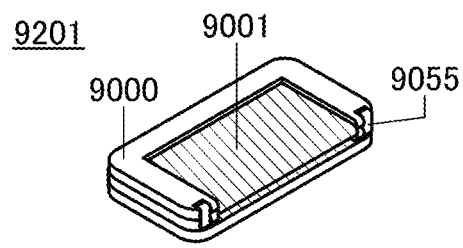

FIGS. 47E, 47F, and 47G are perspective views of a foldable portable information appliance 9201 that is opened, that is shifted from the opened state to the folded state or from the folded state to the opened state, and that is folded, respectively. The portable information appliance 9201 is highly portable when folded. When the portable information appliance 9201 is opened, a seamless large display region is highly browsable. The display portion 9001 of the portable information appliance 9201 is supported by three housings 9000 joined by hinges 9055. By folding the portable information appliance 9201 at a connection portion between two housings 9000 with the hinges 9055, the portable information appliance 9201 can be reversibly changed in shape from an opened state to a folded state. For example, the portable information appliance 9201 can be bent with a radius of curvature of greater than or equal to 1 mm and less than or equal to 150 mm.

Figure 48A:
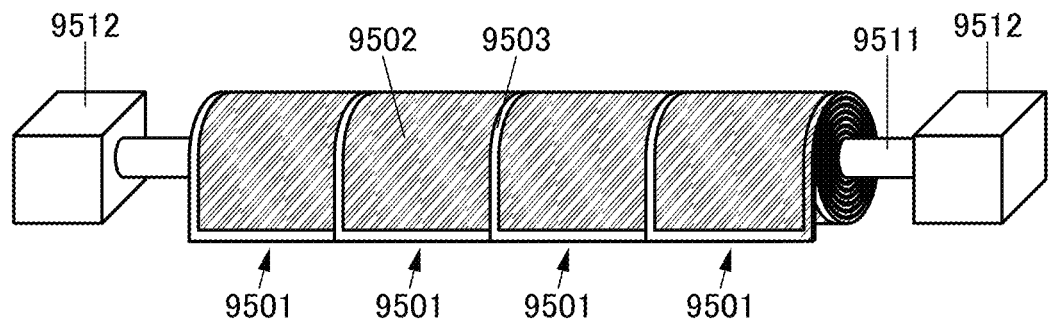
FIGS. 48A and 48B illustrate an example of an electronic device.
Figure 48B:
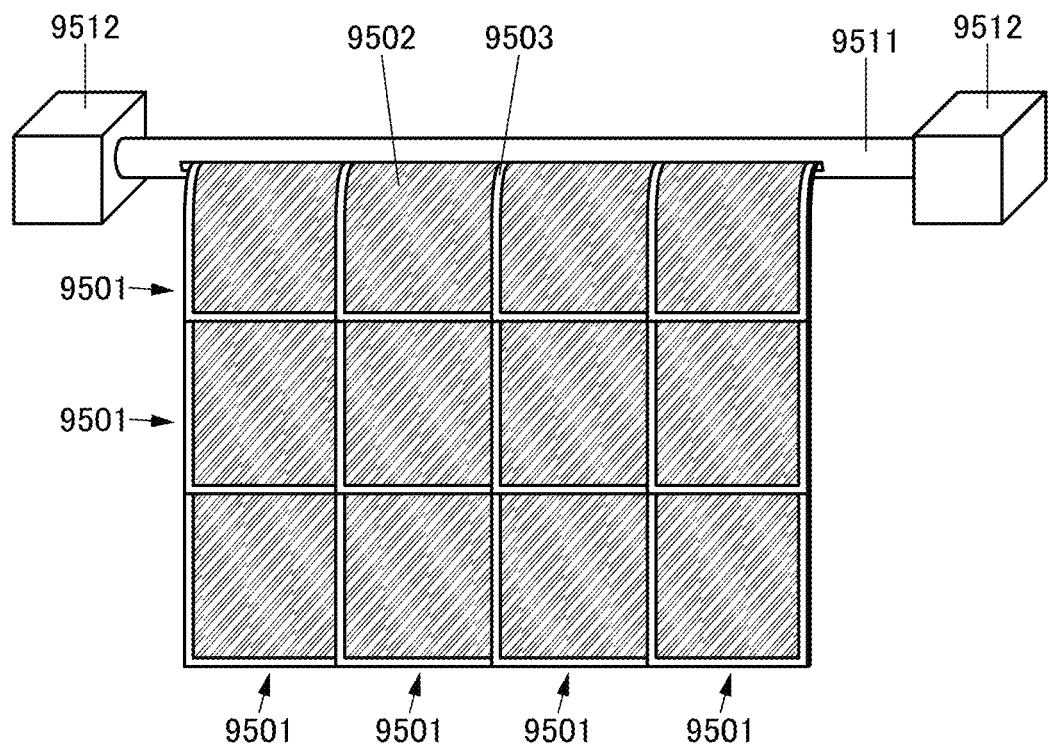

FIGS. 48A and 48B show an example of an electronic device that is different from the electronic devices illustrated in FIGS. 47A to 47G. FIGS. 48A and 48B are perspective views of a display device including a plurality of display panels. The plurality of display panels are wound in the perspective view of FIG. 48A and are unwound in the perspective view of FIG. 48B.

A display device 9500 illustrated in FIGS. 48A and 48B includes a plurality of display panels 9501, a hinge 9511, and a bearing 9512. Each of the display panels 9501 includes a display region 9502 and a light-transmitting region 9503.

Each of the display panels 9501 is flexible. Two adjacent display panels 9501 are provided so as to partly overlap each other. For example, the light-transmitting regions 9503 of the two adjacent display panels 9501 can overlap each other. A display device having a large screen can be obtained with the plurality of display panels 9501. The display device is highly versatile because the display panels 9501 can be wound depending on its use.

The display regions 9502 of the two adjacent display panels 9501 do not overlap each other in the example illustrated in FIGS. 48A and 48B. However, one embodiment of the present invention is not limited to this example, and the display regions 9502 of the two adjacent display panels 9501 may overlap each other without any space so that a continuous display region 9502 is obtained, for example.

This embodiment can be implemented in appropriate combination with any of the structures described in the other embodiments.

This application is based on Japanese Patent Application serial no. 2016-115215 filed with Japan Patent Office on Jun. 9, 2016 and Japanese Patent Application serial no. 2016-115216 filed with Japan Patent Office on Jun. 9, 2016, the entire contents of which are hereby incorporated by reference.

What is claimed is:

1. A transistor comprising:
a first insulating layer;
a second insulating layer over and in direct contact with an entire top surface of the first insulating layer;
a first gate electrode over and in direct contact with the second insulating layer;
a first gate insulating layer over the first gate electrode;
a semiconductor layer over the first gate insulating layer;
a source electrode in contact with the semiconductor layer;
a drain electrode in contact with the semiconductor layer;
a second gate insulating layer over the semiconductor layer;
a second gate electrode over the second gate insulating layer; and
a third insulating layer over the second gate electrode and in direct contact with the semiconductor layer,
wherein the first insulating layer comprises a projection,
wherein the projection is overlapped with the first gate electrode, the first gate insulating layer, the semiconductor layer, the second gate insulating layer, the second gate electrode, and the third insulating layer, and
wherein the first insulating layer comprises an organic resin.

2. The transistor according to claim 1, wherein a top of the projection or vicinity of the top has a radius of curvature greater than or equal to one and less than or equal to 20 times a channel length.

3. The transistor according to claim 1, wherein the organic resin is at least one of a polyimide, an acrylic resin, a benzocyclobutene resin, a polyamide, and an epoxy resin.

4. The transistor according to claim 1, wherein the second insulating layer comprises an inorganic material.

5. The transistor according to claim 1, wherein the third insulating layer comprises silicon and nitrogen.

6. The transistor according to claim 1, wherein the semiconductor layer is an oxide semiconductor layer.

7. The transistor according to claim 6, wherein the semiconductor layer comprises indium, gallium, and zinc.

8. The transistor according to claim 1, wherein the first insulating layer is over a flexible substrate.

9. The transistor according to claim 1, wherein the first insulating layer is not a gate insulating layer.

10. The transistor according to claim 1, wherein the first insulating layer is formed using a material whose Young's modulus is one tenth or less a material of the second insulating layer.

11. The transistor according to claim 1, wherein a thickness of the second insulating layer is half or less a thickness of the first gate insulating layer.

12. A transistor comprising:
a first insulating layer;
a second insulating layer over and in direct contact with an entire top surface of the first insulating layer;
a first gate electrode over and in direct contact with the second insulating layer;
a first gate insulating layer over the first gate electrode;
a semiconductor layer over the first gate insulating layer;
a source electrode in contact with the semiconductor layer;
a drain electrode in contact with the semiconductor layer;
a second gate insulating layer over the semiconductor layer; and
a second gate electrode over the second gate insulating layer,
wherein the first insulating layer comprises a projection,
wherein the projection is overlapped with the first gate electrode, the first gate insulating layer, the semiconductor layer, the second gate insulating layer, and the second gate electrode, and
wherein the first insulating layer comprises an organic resin.

13. The transistor according to claim 12, wherein a top of the projection or vicinity of the top has a radius of curvature greater than or equal to one and less than or equal to 20 times a channel length.

14. The transistor according to claim 12, wherein the organic resin is at least one of a polyimide, an acrylic resin, a benzocyclobutene resin, a polyamide, and an epoxy resin.

15. The transistor according to claim 12, wherein the semiconductor layer is an oxide semiconductor layer.

16. The transistor according to claim 15, wherein the semiconductor layer comprises indium, gallium, and zinc.

17. The transistor according to claim 12, wherein the first insulating layer is over a flexible substrate.

18. The transistor according to claim 12, wherein the first insulating layer is not a gate insulating layer.

19. The transistor according to claim 12, wherein the first insulating layer is formed using a material whose Young's modulus is one tenth or less a material of the second insulating layer.

20. The transistor according to claim 12, wherein a thickness of the second insulating layer is half or less a thickness of the first gate insulating layer.

* * * * *